United States Patent
Shimizu et al.

(10) Patent No.: US 10,002,671 B2
(45) Date of Patent: Jun. 19, 2018

(54) SEMICONDUCTOR MEMORY DEVICE

(71) Applicant: Toshiba Memory Corporation, Tokyo (JP)

(72) Inventors: Takahiro Shimizu, Yokohama Kanagawa (JP); Noboru Shibata, Kawasaki Kanagawa (JP); Hiroshi Maejima, Setagaya Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/447,114

(22) Filed: Mar. 2, 2017

(65) Prior Publication Data

US 2018/0075912 A1    Mar. 15, 2018

(30) Foreign Application Priority Data

Sep. 15, 2016  (JP) .................................. 2016-180593

(51) Int. Cl.
| | |
|---|---|
| *G11C 8/16* | (2006.01) |
| *G11C 16/26* | (2006.01) |
| *G11C 16/34* | (2006.01) |
| *G11C 16/10* | (2006.01) |
| *G11C 7/10* | (2006.01) |

(52) U.S. Cl.
CPC ............ *G11C 16/26* (2013.01); *G11C 7/1075* (2013.01); *G11C 16/10* (2013.01); *G11C 16/3459* (2013.01)

(58) Field of Classification Search
CPC ....................................................... G11C 8/16
USPC ................................................... 365/230.05
See application file for complete search history.

(56) References Cited

U.S. PATENT DOCUMENTS

| | | | |
|---|---|---|---|
| 6,088,264 A | 7/2000 | Hazen et al. | |
| 6,292,873 B1* | 9/2001 | Keaveny | G06F 5/06 711/149 |
| 7,266,667 B2* | 9/2007 | Oh | G06F 13/4243 710/14 |
| 7,450,461 B2* | 11/2008 | Kotani | G11C 7/1042 365/230.01 |
| 7,562,180 B2 | 7/2009 | Gyl et al. | |
| 8,773,939 B2* | 7/2014 | Oh | G11C 5/04 365/189.02 |
| 8,832,360 B2* | 9/2014 | Klein | G06F 3/0607 711/103 |
| 9,093,132 B2 | 7/2015 | Kim et al. | |

(Continued)

FOREIGN PATENT DOCUMENTS

| | | |
|---|---|---|
| JP | 2009528609 A | 8/2009 |
| JP | 4414087 B2 | 2/2010 |
| JP | 2013109823 A | 6/2013 |

*Primary Examiner* — Son Mai
(74) *Attorney, Agent, or Firm* — Patterson & Sheridan, LLP

(57) ABSTRACT

A semiconductor memory device includes first and second memory cell arrays, and first and second control circuits configured to execute an operation on the first and second memory cell arrays. The first control circuit executes an operation on the first memory cell array responsive to a first command set that is received by the semiconductor memory device. The second control circuit executes an operation on the second memory cell array responsive to second and third command sets that are received by the semiconductor memory device while the first control circuit is executing the operation on the first memory cell array.

18 Claims, 53 Drawing Sheets

(56) References Cited

U.S. PATENT DOCUMENTS

| 9,589,614 B2* | 3/2017 | Lee ......................... G11C 8/12 |
| 2006/0107026 A1* | 5/2006 | Oh ...................... G06F 13/4243 |
| | | 711/220 |
| 2012/0210108 A1* | 8/2012 | Ishizuka ............... G11C 11/419 |
| | | 712/245 |

* cited by examiner

FIG. 40

STATUS READ RESULTS IN ACCORDANCE
WITH COMMAND "yyh"

| | I/O0 | I/O1 | I/O2 | I/O3 | I/O4 | I/O5 | I/O6 | I/O7 |
|---|---|---|---|---|---|---|---|---|
| DEFINITION OF VALUE | FIRST SEQUENCER Busy:"0" Ready:"1" | SECOND SEQUENCER Busy:"0" Ready:"1" | UNUSED | UNUSED | UNUSED | UNUSED | UNUSED | UNUSED |

SEMICONDUCTOR MEMORY DEVICE

CROSS-REFERENCE TO RELATED APPLICATION

This application is based upon and claims the benefit of priority from Japanese Patent Application No. 2016-180593, filed Sep. 15, 2016, the entire contents of which are incorporated herein by reference.

FIELD

Embodiments described herein relate generally to a semiconductor memory device.

BACKGROUND

NAND flash memories are known semiconductor memory devices.

DESCRIPTION OF THE DRAWINGS

FIG. 40 is a diagram illustrating status read information of the semiconductor memory device in the memory system according to the sixth embodiment.

DETAILED DESCRIPTION

Figure 1:
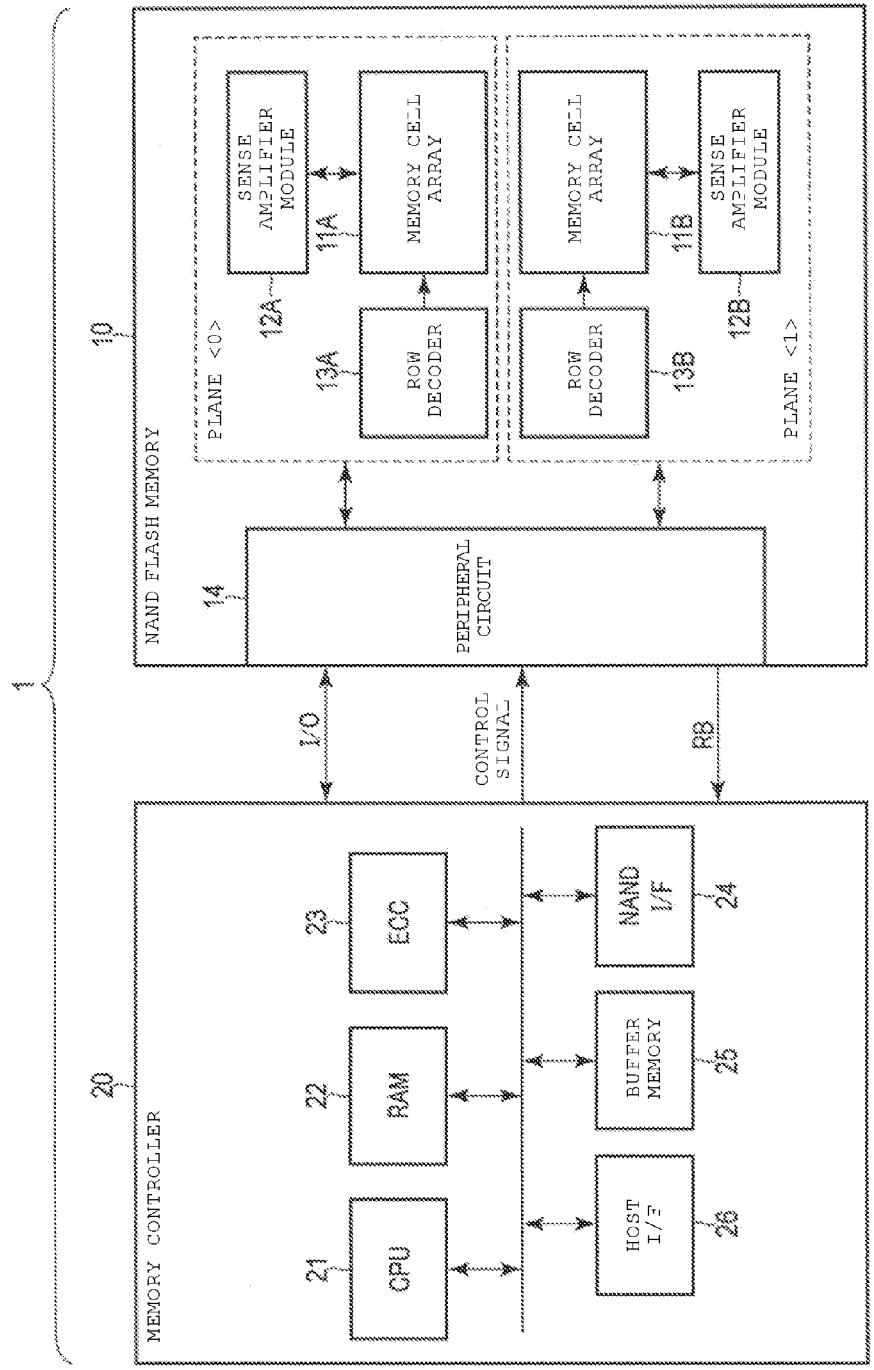
FIG. 1 is a block diagram illustrating a memory system according to a first embodiment.

Embodiments provide a semiconductor memory device that is capable of accelerated operations.

In general, according to an embodiment a semiconductor memory device includes first and second memory cell arrays, and first and second control circuits configured to execute an operation on the first and second memory cell arrays. The first control circuit executes an operation on the first memory cell array responsive to a first command set that is received by the semiconductor memory device. The second control circuit executes an operation on the second memory cell array responsive to second and third command sets that are received by the semiconductor memory device while the first control circuit is executing the operation on the first memory cell array.

Hereinafter, embodiments will be described with reference to the drawings. The drawings to be referred to are schematic. In the following description, common reference numerals are given to elements having the same functions and configurations. Alphabetic letters suffixed to numbers of the reference numerals are referred to by reference numerals including the same numbers and are used to distinguish elements having the same configurations from each other. When it is not necessary to distinguish elements having reference numerals having the same numbers from each other, such elements are referred to only by their numbers.

[1] First Embodiment

Hereinafter, a semiconductor memory device and a memory system according to a first embodiment will be described.

[1-1] Configuration

[1-1-1] Configuration of Memory System 1

First, the configuration of a memory system will be described with reference to FIG. 1. FIG. 1 is a block diagram illustrating the memory system. As illustrated in FIG. 1, a memory system 1 includes a semiconductor memory device 10 and a memory controller 20.

The semiconductor memory device 10 is a NAND flash memory that stores data in a nonvolatile manner. The semiconductor memory device 10 includes a plurality of planes each of which includes a memory cell array which is a region retaining data and can be controlled independently. The detailed configuration of the semiconductor memory device 10 will be described below.

The controller 20 instructs the semiconductor memory device 10 to execute reading, writing, erasing, or the like in response to a command from an external host device (not illustrated). The controller 20 manages a memory space in the semiconductor memory device 10.

As illustrated in FIG. 1, the controller 20 includes a processor (CPU) 21, an internal memory (RAM) 22, an ECC circuit 23, a NAND interface circuit 24, a buffer memory 25, and a host interface circuit 26.

The processor 21 controls an operation of the entire controller 20. For example, the processor 21 issues a read command based on the NAND interface in response to a write command received from the host device. This operation also applies to writing and erasing.

The internal memory 22 is, for example, a semiconductor memory such as a DRAM and is used as a working area of the processor 21. The internal memory 22 retains firmware, various management tables, or the like for managing the semiconductor memory device 10.

The ECC circuit 23 executes an error correction (ECC: Error Checking and Correcting) process on data. Specifically, the ECC circuit 23 generates a parity based on write data during writing data. Then, the ECC circuit 23 generates a syndrome from the parity during reading data, detects an error, and corrects the detected error.

The NAND interface circuit 24 is connected to the semiconductor memory device 10 and manages communication with the semiconductor memory device 10. For example, the NAND interface circuit 24 transmits and receives an input and output signal I/O to and from the semiconductor memory device 1. The NAND interface circuit 24 transmits various control signals to the semiconductor memory device 10 and receives a ready/busy signal RB from the semiconductor memory device 10. The signal RB is used for notifying the controller 20 whether the semiconductor memory device 10 is in a ready state or a busy state. The ready state refers to a state in which the semiconductor memory device 10 can receive a command from the controller 20. The busy state refers to a state in which the semiconductor memory device 10 may not receive a command. For example, the signal RB is considered to be at an "L" level while the semiconductor memory device 10 is operating, and is considered to be at an "H" level when an operation is completed.

The buffer memory 25 temporarily retains data or the like received from the semiconductor memory device 10 and the host device by the controller 20.

The host interface circuit 26 is connected to the host device via a host bus (not illustrated) and manages communication with the host device. For example, the host interface circuit 26 transmits a command and data received from the host device to the processor 21 and the buffer memory 25, respectively.

[1-1-2] Configuration of Semiconductor Memory Device 10

Next, the detailed configuration of the semiconductor memory device 10 will be described with reference to FIG. 1. As illustrated in FIG. 1, the semiconductor memory device 10 includes planes <0> and <1> and a peripheral circuit 14. The planes <0> and <1> include memory cell arrays 11A and 11B, sense amplifier modules 12A and 12B, and row decoders 13A and 13B, respectively.

Each of the memory cell arrays 11A and 11B includes a plurality of nonvolatile memory cells associated with bit lines and word lines. The detailed configuration of the memory cell arrays 11 will be described below.

The sense amplifier modules 12A and 12B are provided to correspond to the memory cell arrays 11A and 11B, respectively. The sense amplifier modules 12 read data from the memory cell arrays 11 and output the read data to the controller 20. The sense amplifier modules 12 transmit write data received from the controller 20 to the memory cell arrays 11. The sense amplifier modules 12 include cache circuits (not illustrated). The cache circuits are used to deliver data to the peripheral circuit 14.

The row decoders 13A and 13B are provided to correspond to the memory cell arrays 11A and 11B, respectively. The row decoders 13 select word lines corresponding to target memory cells on which a read operation and a write operation are executed. The row decoders 13 apply desired voltages to the selected word lines and other unselected word lines.

The above-described planes are units in which a read operation, a write operation, and an erasing operation can be executed independently. Specifically, the semiconductor memory device 10 can execute a read operation, a write operation, or an erasing operation only on one of the two planes and can also execute a read operation on the other plane while a read operation, a write operation, or an erasing operation is executed on one of the planes. That is, the planes are minimum units which are targets of a read operation, a write operation, and an erasing operation. Such operations may be executed on each plane or may be executed in parallel on the plurality of planes. The configuration of the planes is not limited to the above-described configuration, but each plane may include at least the memory cell array 11.

Figure 2:
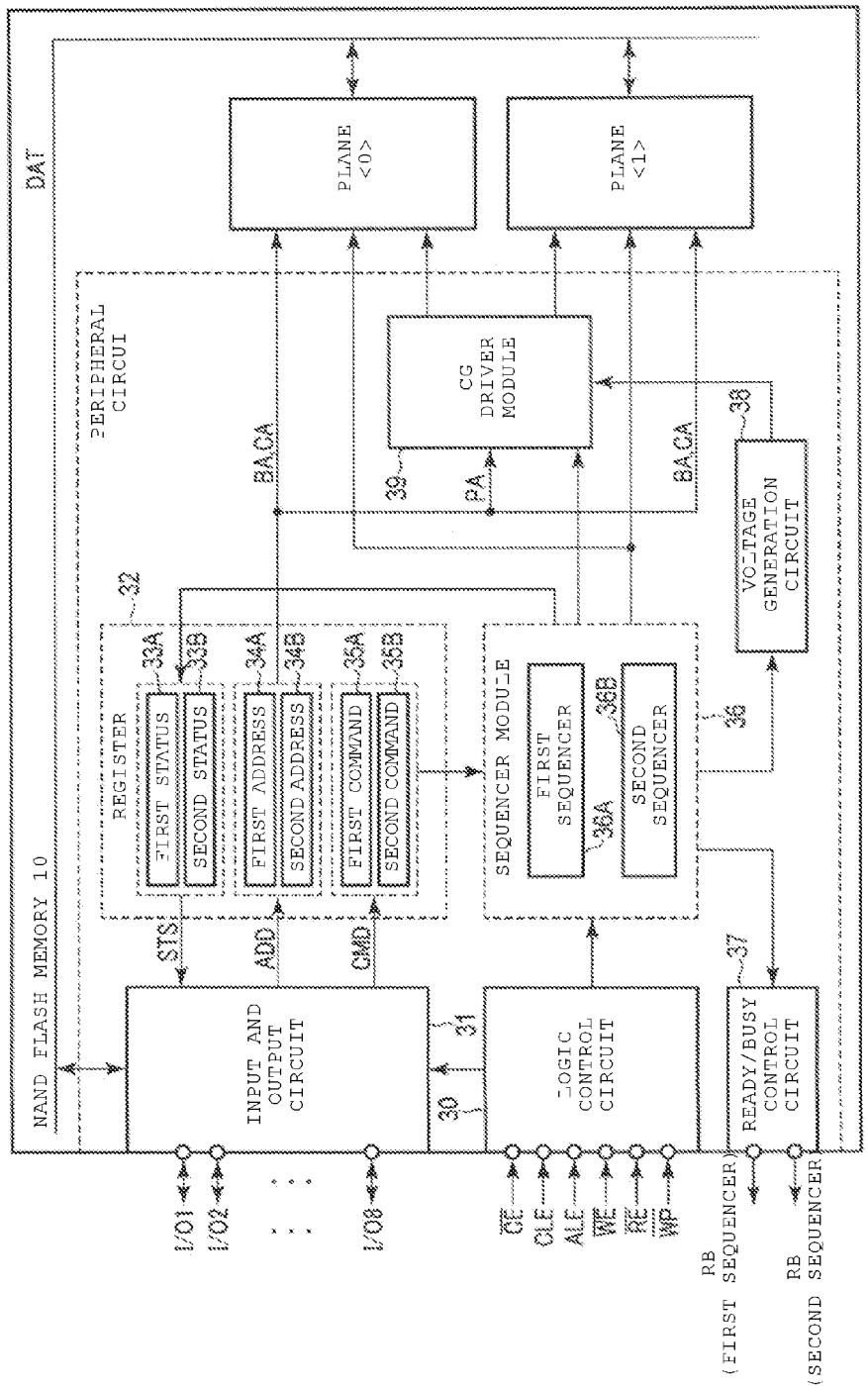
FIG. 2 is a block diagram illustrating a semiconductor memory device according to the first embodiment.

Next, the detailed configuration of the peripheral circuit 14 controlling the planes <0> and <1> will be described with reference to FIG. 2. FIG. 2 is a block diagram illustrating the semiconductor memory device 10. FIG. 2 illustrates the configuration of the peripheral circuit 14 controlling the planes and examples of signals transmitted and received between the semiconductor memory device 10 and the controller 20.

As illustrated in FIG. 2, the peripheral circuit 14 includes a logic control circuit 30, an input and output circuit 31, a register 32, a sequencer module 36, a ready/busy control circuit 37, a voltage generation circuit 38, and a CG driver module 39.

The logic control circuit 30 receives various control signals from the controller 20 and transmits the control signals to the input and output circuit 31 and the sequencer module 36. As the control signals, for example, a chip enable signal /CE, a command latch enable signal CLE, an address latch enable signal ALE, a write enable signal /WE, a read enable signal /RE, and a write protection signal /WP are used. The signal /CE is used for enabling the semiconductor memory device 10. The signal CLE is used for notifying the input and output circuit 31 that a signal input to the semiconductor memory device 10 is a command CMD in tandem with the asserted signal CLE. The signal ALE is used for notifying the input and output circuit 31 that a signal input to the semiconductor memory device 10 is address information ADD in tandem with the asserted signal ALE. The signal /WE and /RE are, for example, used for instructing the input and output circuit 31 to input and output the input and output signal I/O, respectively. The signal /WP is, for example, used for protecting the semiconductor memory device 10 against writes upon turning on or off power.

The input and output circuit 31 transmits and receives input and output, for example, signals I/O (I/O1 to I/O8) with an 8-bit width to and from the controller 20. Examples of the input and output signals I/O transmitted to the controller 20 by the input and output circuit 31 include status information STS and a read data DAT. On the other hand, examples of the input and output signals I/O received from the controller 20 by the input and output circuit 31 include a command CMD, address information ADD, and write data DAT. For example, the input and output circuit 31 transmits the write data DAT received from the controller 20 to the sense amplifier module 12 and transmits the read data DAT transmitted from the sense amplifier module 12 to the controller 20.

The register 32 includes status registers 33A and 33B, address registers 34A and 34B, and command registers 35A and 35B. The status registers 33 retain the status information STS. The status information STS includes, for example, information indicating operation states of first and second sequencers. The address registers 34 receive the address information ADD from the input and output circuit 31 and retain the address information ADD. The address registers 34 transmit column addresses CA, block addresses BA, and page addresses PA included in the address information ADD to the sense amplifier module 12, the row decoder 13, and the CG driver module 39, respectively. The command registers 35 receive the command CMD from the input and output circuit 31 and retain the command CMD. The sequencers 36 execute various operations based on the command CMD retained in the command registers 35.

The registers 33A, 34A, and 35A correspond to a first sequencer 36A to be described below and the registers 33B, 34B, and 35B correspond to a second sequencer 36B to be described below. For example, the status information STS corresponding to the first sequencer 36A is retained in the status register 33A and the status information STS corresponding to the second sequencer 36B is retained in the status register 33B.

The sequencer module 36 controls an operation of the entire semiconductor memory device 10. Specifically, the sequencer module 36 controls the sense amplifier module 12, the row decoder 13, the voltage generation circuit 38, the CG driver module 39, and the like based on the command CMD transmitted from the command registers 35 and executes a read operation for data and the like. The sequencer module 36 includes the first sequencer 36A and the second sequencer 36B which can independently operate.

The first sequencer 36A executes various operations such as a read operation, a write operation, and an erasing operation for data on the planes <0> and <1>. The second sequencer 36B is used when the first sequencer 36A executes various operations. The second sequencer 36B can execute a read operation for data on the planes <0> and <1>, but does not execute a write operation and an erasing operation. A circuit area of the second sequencer 36B is smaller than a circuit area of the first sequencer 36A.

The ready/busy control circuit 37 generates ready/busy signals RB based on operation states of the first sequencer 36A and the second sequencer 36B and transmits these signals to the controller 20. In the following description, a state in which the ready/busy signal RB corresponding to each sequencer 36 is at an "H" level is referred to as a ready state and a state in which the ready/busy signal RB is at an "L" level is referred to as a busy state.

The voltage generation circuit 38 generates a desired voltage based on an instruction of the sequencer module 36. Then, the voltage generation circuit 38 supplies the generated voltage to the memory cell array 11, the sense amplifier module 12, and the CG driver module 39.

The CG driver module 39 transmits the voltage supplied form the voltage generation circuit 38 to the row decoders 13A and 13B based on the received page addresses PA.

The semiconductor memory device 10 according to the above-described present embodiment has the configuration in which the plurality of planes are included and the first sequencer 36A and the second sequencer 36B capable of independently operating are included.

[1-1-3] Configuration of Memory Cell Array 11

Figure 3:
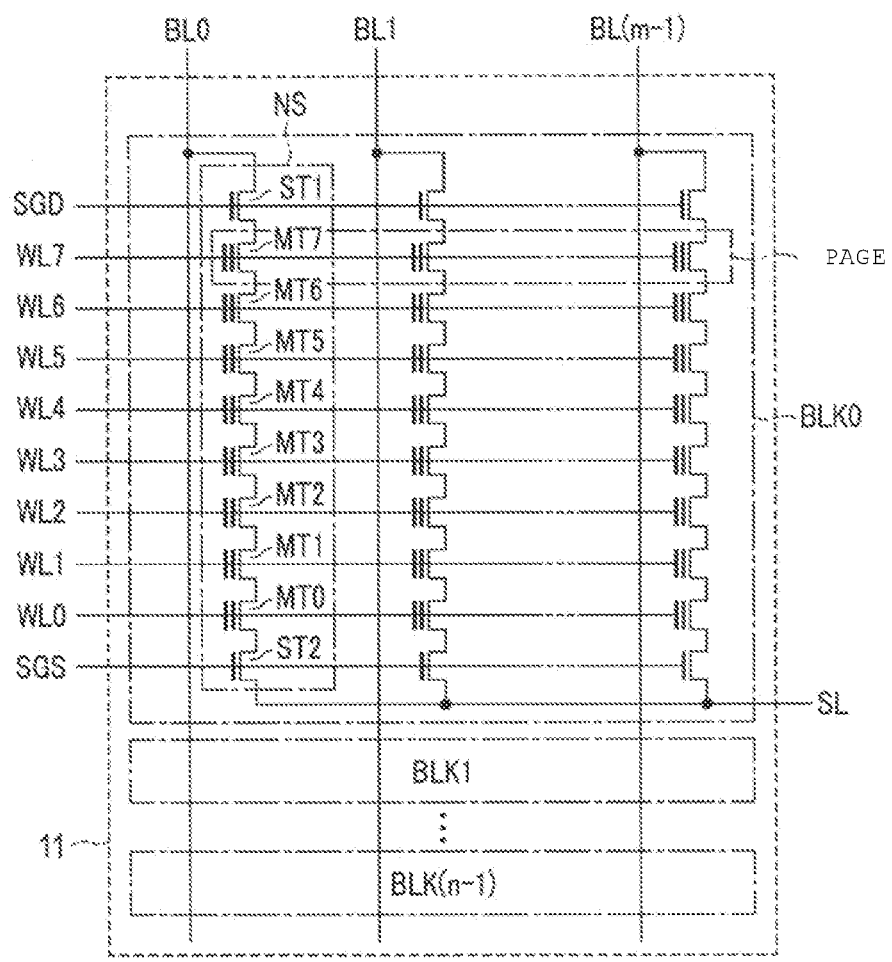
FIG. 3 is a circuit diagram illustrating a memory cell array included in the semiconductor memory device according to the first embodiment.

Next, the configuration of the memory cell array 11 will be described with reference to FIG. 3. FIG. 3 is a circuit diagram illustrating the memory cell array 11. As illustrated in FIG. 3, the memory cell array 11 includes blocks BLK0 to BLKn (where n is a natural number equal to or greater than 1).

The block BLK is a collection of a plurality of nonvolatile memory cells and is, for example, an erasure unit of data. Each block BLK includes a plurality of NAND strings NS.

Each NAND string NS is provided to correspond to bit lines BL0 to BL(m−1) (where (m−1) is a natural number equal to or greater than 1) and includes, for example, 8 memory cell transistors MT (MT0 to MT7) and select transistors ST1 and ST2. The number of memory cell transistors MT included in one NAND string NS is not limited to 8, and may be any number.

The memory cell transistor MT includes a control gate and a charge storage layer and retains data in a nonvolatile manner. The memory cell transistor MT can store data of a plurality of bits by applying a multi-level cell (MLC) scheme. The number of bits of data stored by the memory cell transistor MT is not limited thereto. For example, a single-level cell (SLC) scheme of storing data of 1 bit in a memory cell may be applied.

The memory cell transistors MT0 to MT7 in the same NAND string NS are connected in series between a source of the select transistor ST1 and a drain of the select transistor ST2. In the same block BLK, gates of the select transistors ST1 and ST2 are commonly connected to select gate lines SGD and SGS, and control gates of the memory cell transistors MT0 to MT7 are commonly connected to the word lines WL0 to WL7, respectively.

The bit lines BL in the memory cell array 11 are commonly connected to the NAND strings NS in the same column among the plurality of blocks BLK. Specifically, the drains of the select transistors ST1 in the NAND strings NS in the same column are commonly connected to the corresponding bit lines BL. The sources of the plurality of select transistors ST2 included in the blocks BLK in the memory cell array 11 are commonly connected to a source line SL.

In the above-described configuration, a collection of pieces of 1-bit data retained by the plurality of memory cells connected to the common word lines WL is referred to as a page. Accordingly, when an MLC scheme of storing 2-bit data in memory cells is applied, data equivalent to 2 pages is stored in the collection of the plurality of memory cells connected to one word line WL. A read operation and a write operation for data may be executed for each page or may be executed for each word line WL.

[1-1-4] Configuration of Peripheral Circuit 14

Figure 4:
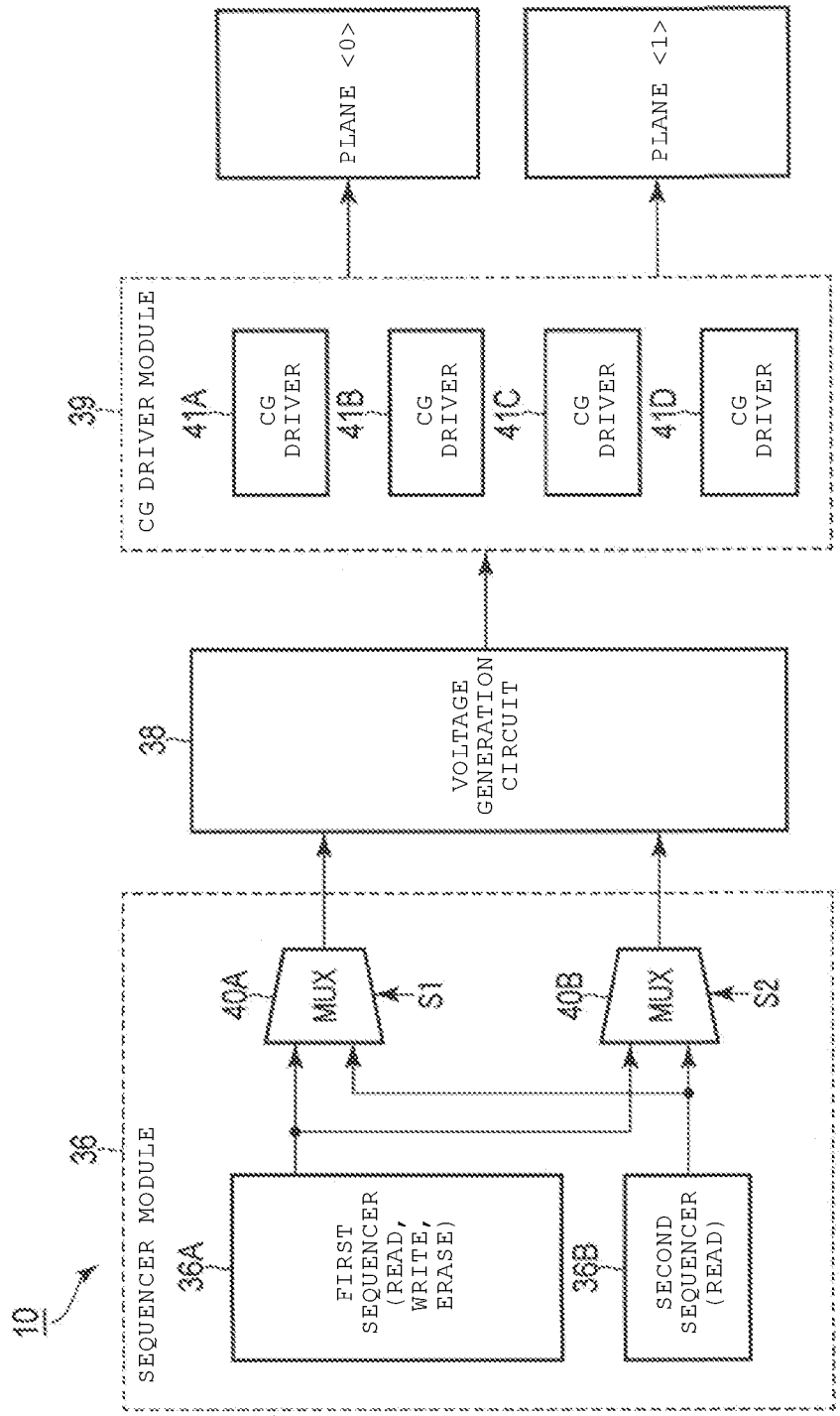
FIG. 4 is a block diagram illustrating the semiconductor memory device according to the first embodiment.

Next, the more detailed configuration of the peripheral circuit 14 will be described with reference to FIG. 4. FIG. 4 illustrates the detailed configurations of the sequencer module 36 and the CG driver module 39. As illustrated in FIG. 4, the sequencer module 36 includes multiplexers 40A and 40B, and the CG driver module 39 includes CG drivers 41A, 41B, 41C, and 41D.

The multiplexers 40A and 40B output one signal selected from a plurality of input signals based on selection signals S1 and S2, respectively. The selection signals S1 and S2 are generated by, for example, the first sequencer 36A. Control signals generated by the sequencers 36A and 36B in various operations are input to input terminals of the multiplexers 40A and 40B. The control signals are used to control, for example, the voltage generation circuit 38, the CG driver module 39, and the planes <0> and <1>.

The multiplexer 40A outputs a control signal of one of the sequencers 36A and 36B to various circuits such as the voltage generation circuit 38, the CG driver module 39, and the plane <0> based on the selection signal S1. Similarly, the multiplexer 40B outputs a control signal of one of the sequencers 36A and 36B to various circuits such as the voltage generation circuit 38, the CG driver module 39, and the plane <1> based on the selection signal S2. The constituent elements generating the selection signals S1 and S2 in regard to the multiplexer 40 are not limited thereto. Other control circuits may be provided in the peripheral circuit 14.

The CG driver 41 selects a voltage generated by the voltage generation circuit 38 under the control of the sequencer module 36 and transmits the selected voltage to the word line WL. That is, the number of necessary CG drivers 41 is changed based on kinds of voltages necessary in various operations. Then, the CG driver 41 supplies a desired voltage to the row decoder 13A of the plane <0>, the row decoder 13B of the plane <1>, or both of the row decoders 13A and 13B.

For example, in a read operation in regard to the planes <0> and <1>, when the CG drivers 41A and 41C generate a voltage to be applied to selected word lines and the CG drivers 41B and 41D generate a voltage to be applied to unselected word lines, the CG drivers 41A and 41B supply the voltage to the plane <0> and the CG drivers 41C and 41D supply the voltage to the plane <1>. In this example, a supply timing of the voltage to the plane <0> by the CG driver 41A and 41B may be different from a supply timing of the voltage to the plane <1> by the CG drivers 41C and 41D. That is, the planes <0> and <1> can operate asynchronously under the control of the first sequencer 36A and the second sequencer 36B.

[1-2] Operations

Next, operations of the memory system 1 will be described. In a standby state after the semiconductor memory device 10 is powered, the first sequencer 36A is considered to be in an active state and the second sequencer 36B is considered to be in an idle state. Here, the active state is a state in which various operations such as a read operation can be executed based on a command or the like. The idle state is a state in which various operations are prohibited. In the idle state, power consumption is less than in the active state. The second sequencer in the idle state is activated in response to an activation command to transition to the active state. The activation command is a special command that is included in neither a command set used in a read operation nor a command set used in a write operation. The semiconductor memory device 10 executes various operations using the first sequencer 36A when a command is received from the controller 20. Examples of the various operations include a read operation, a write operation, and an erasing operation. The first sequencer 36A can execute a single-plane operation of executing various operations in units of planes and a multi-plane operation of simultaneously starting various operations on a plurality of planes.

The semiconductor memory device 10 can start a read operation on the other plane using the activated second sequencer 36B while the first sequencer 36A is executing various operations on one plane. That is, the semiconductor memory device 10 can execute a multi-plane operation of starting a read operation on the plurality of planes at different timings.

In the following description, the multi-plane operation of simultaneously starting various operations on the plurality of planes is referred to as a synchronous multi-plane operation and the multi-plane operation of starting a read operation on the plurality of planes at different timings is referred to as an asynchronous multi-plane operation.

Hereinafter, the single plane read operation, the synchronous multi-plane read operation, the asynchronous multi-plane read operation, a synchronous multi-plane write operation, and other multi-plane operations will be described in order as specific examples of operations of the memory system 1.

[1-2-1] Single Plane Read Operation

Figure 5:
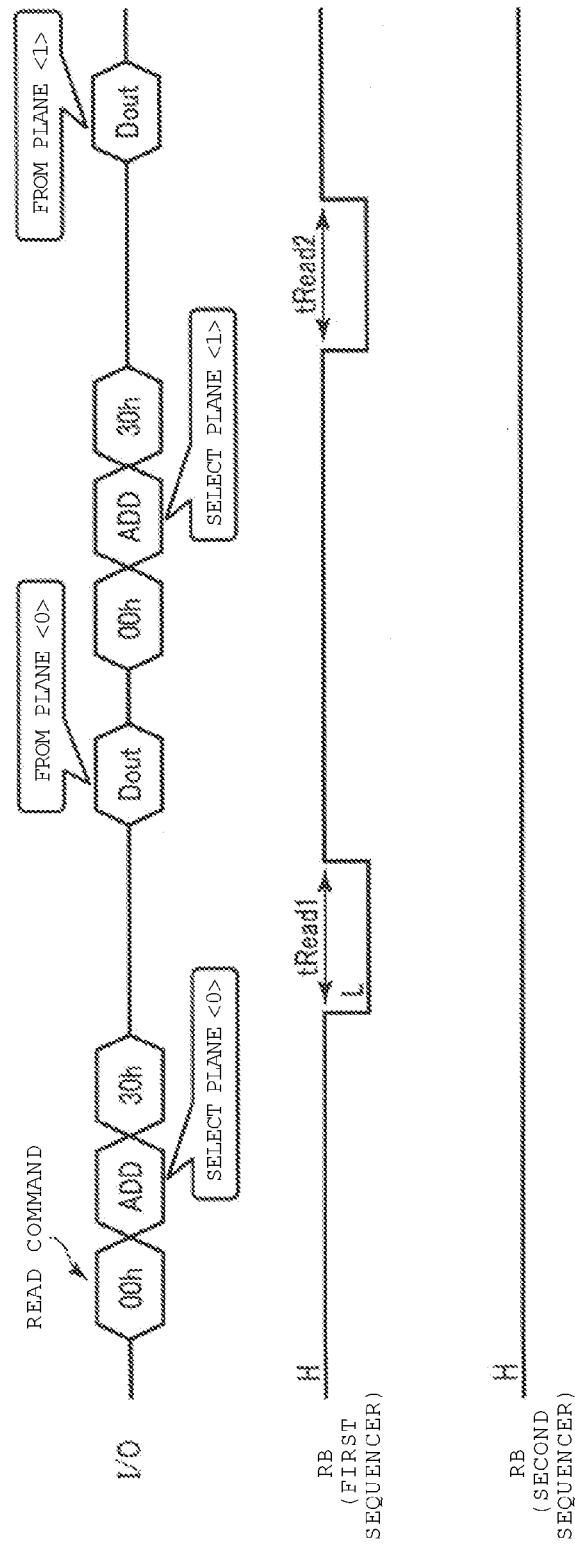
FIG. 5 is a diagram illustrating a command sequence of a read operation in the memory system according to the first embodiment.

First, a single plane read operation in the semiconductor memory device 10 will be described with reference to FIG. 5. FIG. 5 illustrates an example of a command sequence in which the first sequencer 36A executes a read operation on the planes <0> and <1> temporally in order. FIG. 5 illustrates the input and output signal I/O transmitted and received by the semiconductor memory device 10 and the ready/busy signals RB corresponding to the first sequencer 36A and the second sequencer 36B.

As illustrated in FIG. 5, the controller 20 first issues a command "00 h" to transmit the command "00 h" to the semiconductor memory device 10. The command "00 h" is equivalent to an address input reception command for reading and is used for ordering the semiconductor memory device 10 to execute a read operation. The transmitted command "00 h" is stored in the first command register 35A via the input and output circuit 31.

Next, the controller 20 transmits address information ADD to the semiconductor memory device 10. The address information ADD includes information for designating the plane <0>. The transmitted address information ADD is stored in the first address register 34A via the input and output circuit 31.

Subsequently, the controller 20 issues a command "30 h" to transmit the command "30 h" to the semiconductor memory device 10. The command "30 h" is used for instructing the semiconductor memory device 10 to start a read operation based on the received commands and the address information. The transmitted command "30 h" is stored in the first command register 35A via the input and output circuit 31.

When the command "30 h" is stored in the register 35A, the first sequencer 36A starts a read operation on the plane <0> and the first sequencer 36A enters the busy state from the ready state. As illustrated, tRead1 indicates a period in which the first sequencer 36A executes the read operation on the plane <0>. During this period, the first sequencer 36A maintains the busy state.

Figure 6:
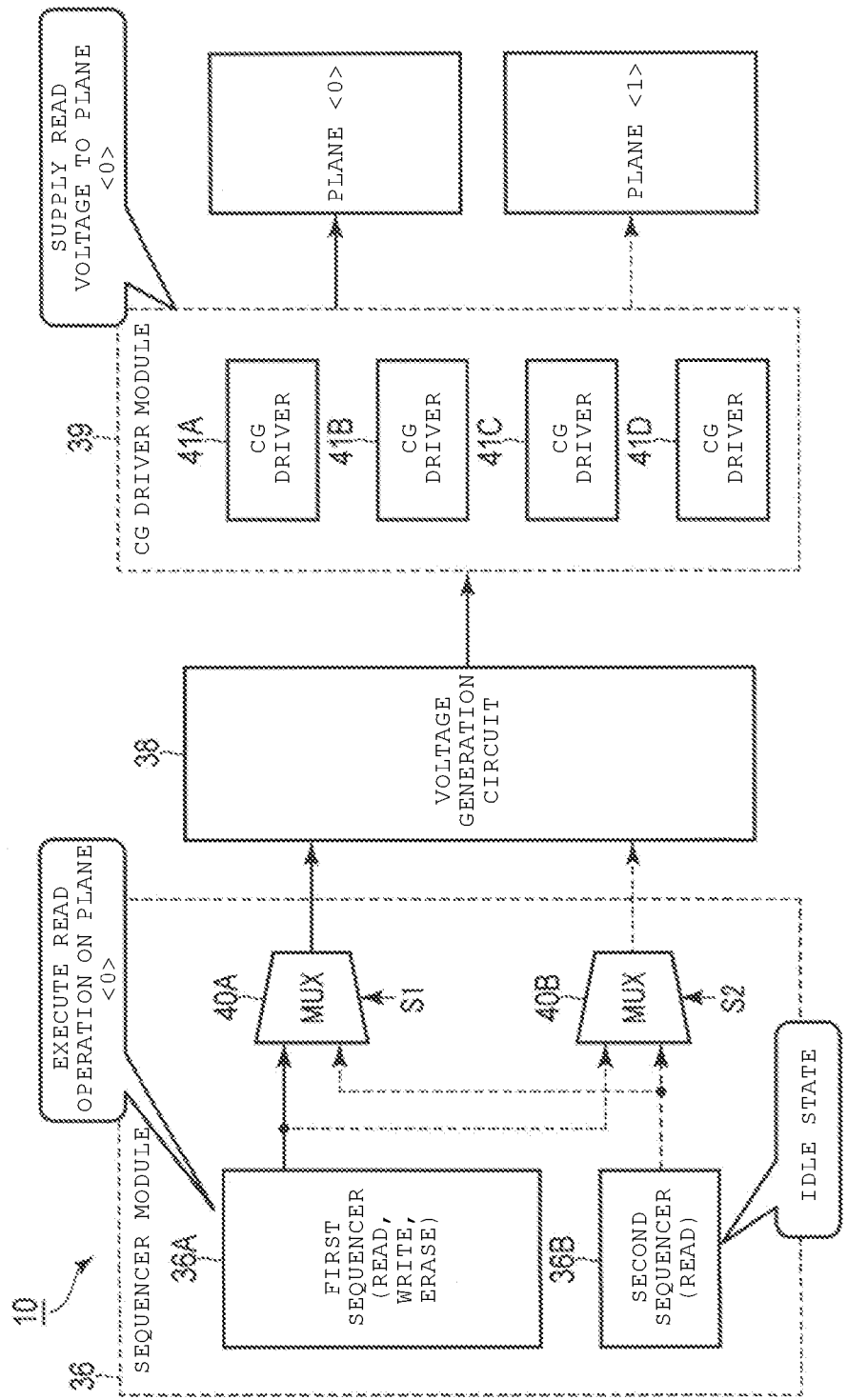
FIG. 6 is a diagram illustrating a read operation in the memory system according to the first embodiment.

An operation image of the sequencer module 36 and the CG driver module 39 in the read operation is illustrated in FIG. 6. As illustrated in FIG. 6, the sequencer module 36 controls the selection signal S1 such that a control signal of the first sequencer 36A is output to the multiplexer 40A. Thus, the first sequencer 36A can execute the read operation on the plane <0>.

In the read operation, the voltage generation circuit 38 generates voltages based on the control of the first sequencer 36A, and the CG driver module 39 selects various voltages necessary for the read operation from the voltages and transmits the voltages to the row decoder 13A of the plane <0>. Examples of the various voltages used in the read operation include a read voltage for determining a threshold voltage of a memory cell and a read pass voltage for turning on a memory cell without regard to the stored data. The read voltage is applied to selected word lines WL and the read pass voltage is applied to unselected word lines WL.

In the read operation, the row decoder 13A selects the block BLK based on the block address BA in the address information ADD and transmits the voltages supplied from the CG driver module 39 to various word lines WL of the selected block BLK. The sense amplifier module 12A reads data from the memory cells selected in the memory cell array 11A.

When the read operation ends, the first sequencer 36A enters the ready state from the busy state. Then, the sense amplifier module 12A transmits data Dout read from the plane <0> to the controller 20.

The above-described operation corresponds to the single plane read operation on the plane <0>. Next, differences between the single plane read operation on the plane <1> and the single plane read operation on the plane <0> will be described.

As illustrated in FIG. 5, the controller 20 transmits the command "00 h", the address information ADD for designating the plane <1>, and the command "30 h" sequentially to the semiconductor memory device 10. The register to which each input and output signal I/O is transmitted is the same as that in the single plane read operation on the plane <0>.

When the command "30 h" is stored in the register 35A, the first sequencer 36A executes a read operation on the plane <1> and the first sequencer 36A enters the busy state from the ready state. As illustrated, tRead2 indicates a period in which the first sequencer 36A executes the read operation on the plane <1>. During this period, the first sequencer 36A maintains the busy state.

Figure 7:
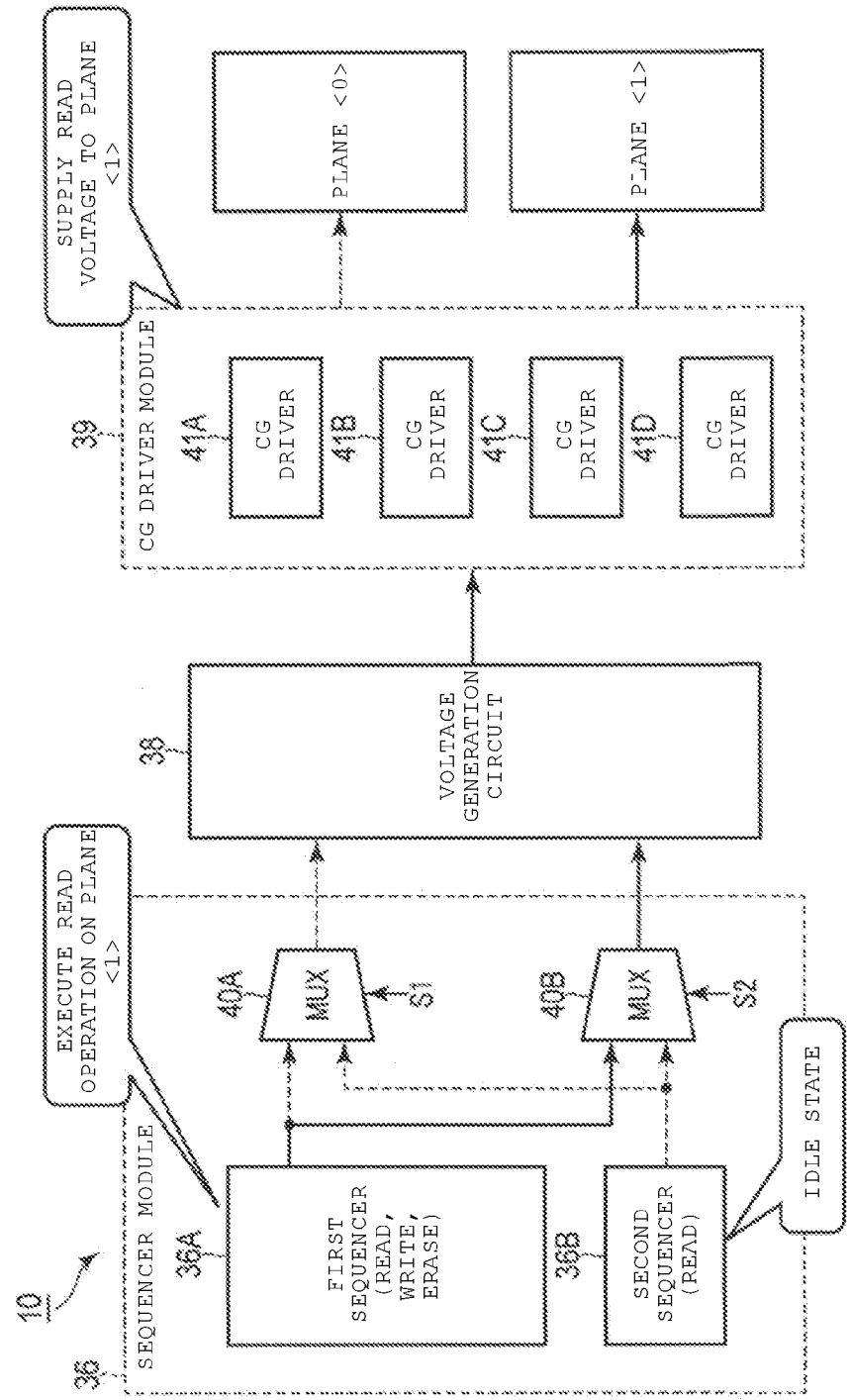
FIG. 7 is a diagram illustrating the read operation in the memory system according to the first embodiment.

An operation image of the sequencer module 36 and the CG driver module 39 in the read operation is illustrated in FIG. 7. As illustrated in FIG. 7, the sequencer module 36 controls the selection signal S2 such that a control signal of the first sequencer 36A is output to the multiplexer 40B. Thus, the first sequencer 36A can execute the read operation on the plane <1>. The detailed operation in the read operation is the same as that except for the components corresponding to the plane <0> in the operation described with reference to FIG. 6 are substituted with components corresponding to the plane <1>, and thus the detailed operation will not be described.

When the read operation ends, the first sequencer 36A enters the ready state from the busy state. Then, the sense amplifier module 12B transmits data Dout read from the plane <1> to the controller 20.

The above-described operation corresponds to the single plane read operation on the plane <1>. In this way, the semiconductor memory device 10 uses the first sequencer 36A even in the read operation on a single plane in regard to either the plane <0> or the plane <1>. That is, in a read operation in the single plane, the second sequencer 36B normally maintains the ready state and the idle state, as illustrated in FIGS. 5 to 7.

[1-2-2] Multi-Plane Read Operation (Synchronous)

Figure 8:
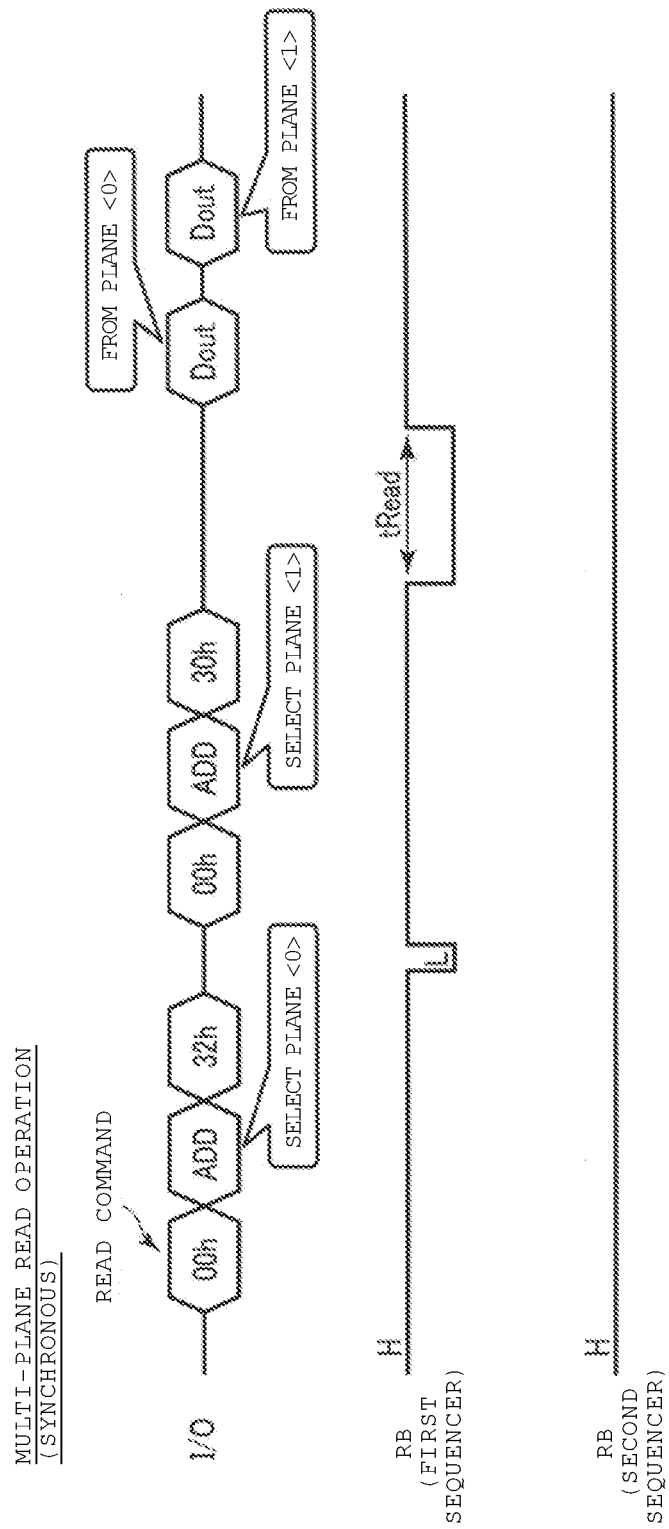
FIG. 8 is a diagram illustrating a command sequence of a read operation in the memory system according to the first embodiment.

Next, a synchronous multi-plane read operation in the semiconductor memory device 10 will be described with reference to FIG. 8. FIG. 8 illustrates an example of a command sequence in which the first sequencer 36A synchronously executes a read operation on the planes <0> and <1>. FIG. 8 illustrates the input and output signal I/O transmitted and received by the semiconductor memory device 10 and the ready/busy signals RB corresponding to the first sequencer 36A and the second sequencer 36B.

As illustrated in FIG. 8, the controller 20 first issues the command "00 h" to transmit the command "00 h" to the semiconductor memory device 10. The transmitted command "00 h" is stored in the first command register 35A via the input and output circuit 31.

Next, the controller 20 transmits the address information ADD to the semiconductor memory device 10. The address information ADD includes information for designating the plane <0>. The transmitted address information ADD is stored in the first address register 34A via the input and output circuit 31.

Subsequently, the controller 20 issues a command "32 h" to transmit the command "32 h" to the semiconductor memory device 10. The command "32 h" is used for instructing a multi-plane operation and indicates that the commands and the address information transmitted until now correspond to one plane. The transmitted command "32 h" is stored in the first command register 35A via the input and output circuit 31.

When the command "32 h" is stored in the register 35A, the first sequencer 36A enters the busy state from the ready state and thereafter enters the ready state from the busy state. This operation indicates that the semiconductor memory device 10 can subsequently receive the commands from the controller 20.

Then, the controller 20 transmits a command set corresponding to another read page to the semiconductor memory device 10. Specifically, the controller 20 transmits the command "00 h", the address information ADD for designating the plane <1>, and the command "30 h" sequentially to the semiconductor memory device 10.

When the command "30 h" is stored in the register 35A, the first sequencer 36A starts the multi-plane read operation based on a command set including an instruction on the plane <0> and the command "32 h" and a command set including an instruction on the plane <1> and the command "30 h", and the first sequencer 36A enters the busy state from the ready state. As illustrated, tRead indicates a period in which the first sequencer 36A executes the synchronous multi-plane read operation on the planes <0> and <1>. During this period, the first sequencer 36A maintains the busy state.

Figure 9:
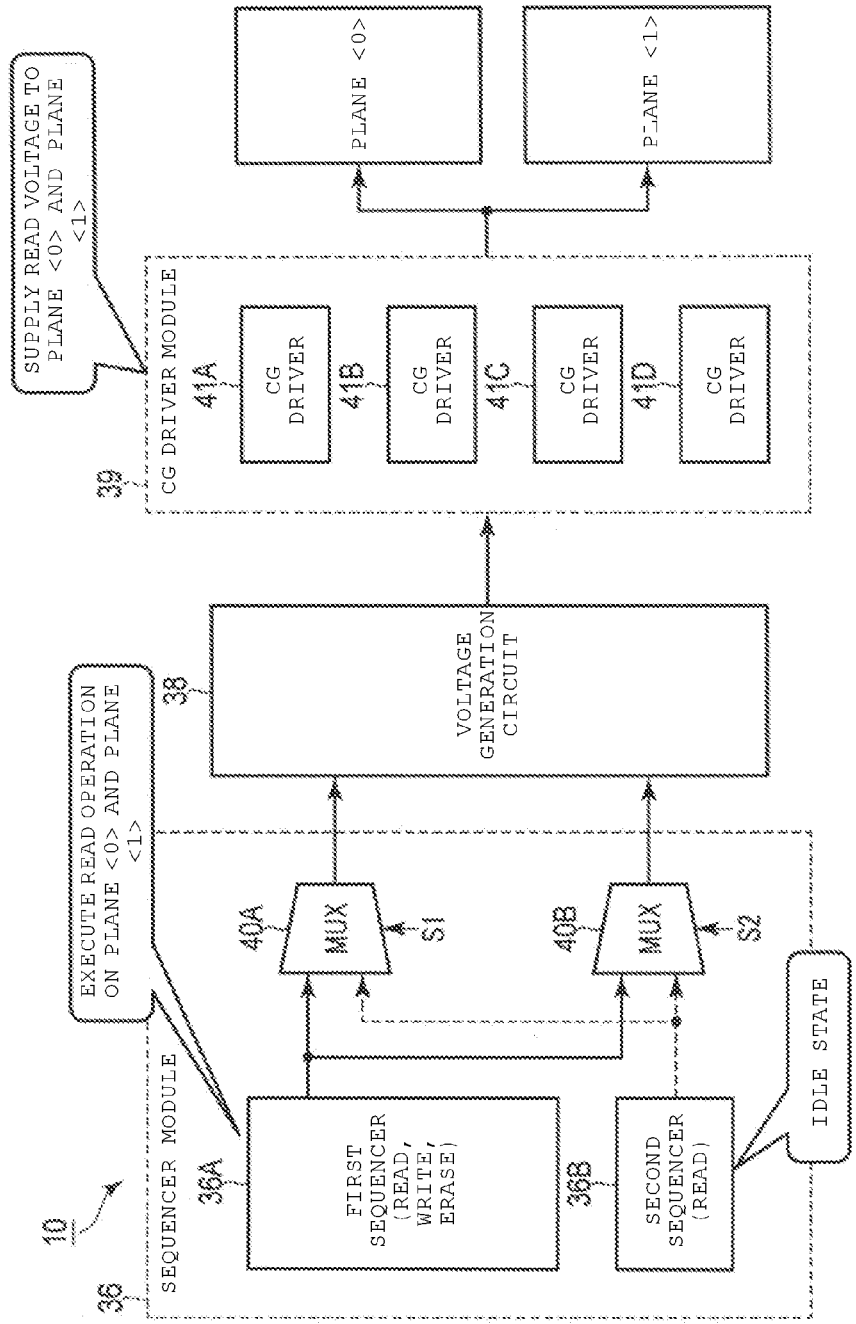
FIG. 9 is a diagram illustrating the read operation in the memory system according to the first embodiment.

An operation image of the sequencer module 36 and the CG driver module 39 in the read operation is illustrated in FIG. 9. As illustrated in FIG. 9, the sequencer module 36 controls the selection signals S1 and S2 such that control signals of the first sequencer 36A are output to the multiplexers 40A and 40B. Thus, the first sequencer 36A can execute the multi-plane read operation on the planes <0> and <1>.

In the read operation, the voltage generation circuit 38 generates voltages based on the control of the first sequencer 36A, and the CG driver module 39 selects various voltages necessary for the read operation from the voltages and transmits the voltages to the row decoder 13A of the plane <0> and the row decoder 13B of the plane <1>. Further, the row decoders 13A and 13B select the block BLK based on the block address BA in the address information ADD and transmit the voltages supplied from the CG driver module 39 to various word lines WL of the selected block BLK. The sense amplifier modules 12A and 12B read data from the memory cells selected in the memory cell arrays 11A and 11B, respectively.

When the read operation ends, the first sequencer 36A enters the ready state from the busy state. Then, the sense amplifier modules 12A and 12B sequentially transmit data Dout read from the planes <0> and <1> to the controller 20. The order in which the data Dout read from the planes is transmitted to the controller 20 is not limited thereto. For example, the read data Dout may be transmitted to the controller 20 in the order of the planes <1> and <0>.

As described above, the semiconductor memory device 10 executes the synchronous multi-plane read operation on the plurality of planes using the first sequencer 36A. That is, in the multi-plane read operation synchronized in the plurality of planes, the second sequencer 36B normally maintains the ready state and the idle state, as illustrated in FIGS. 8 and 9.

[1-2-3] Multi-Plane Read Operation (Asynchronous)

Figure 10:
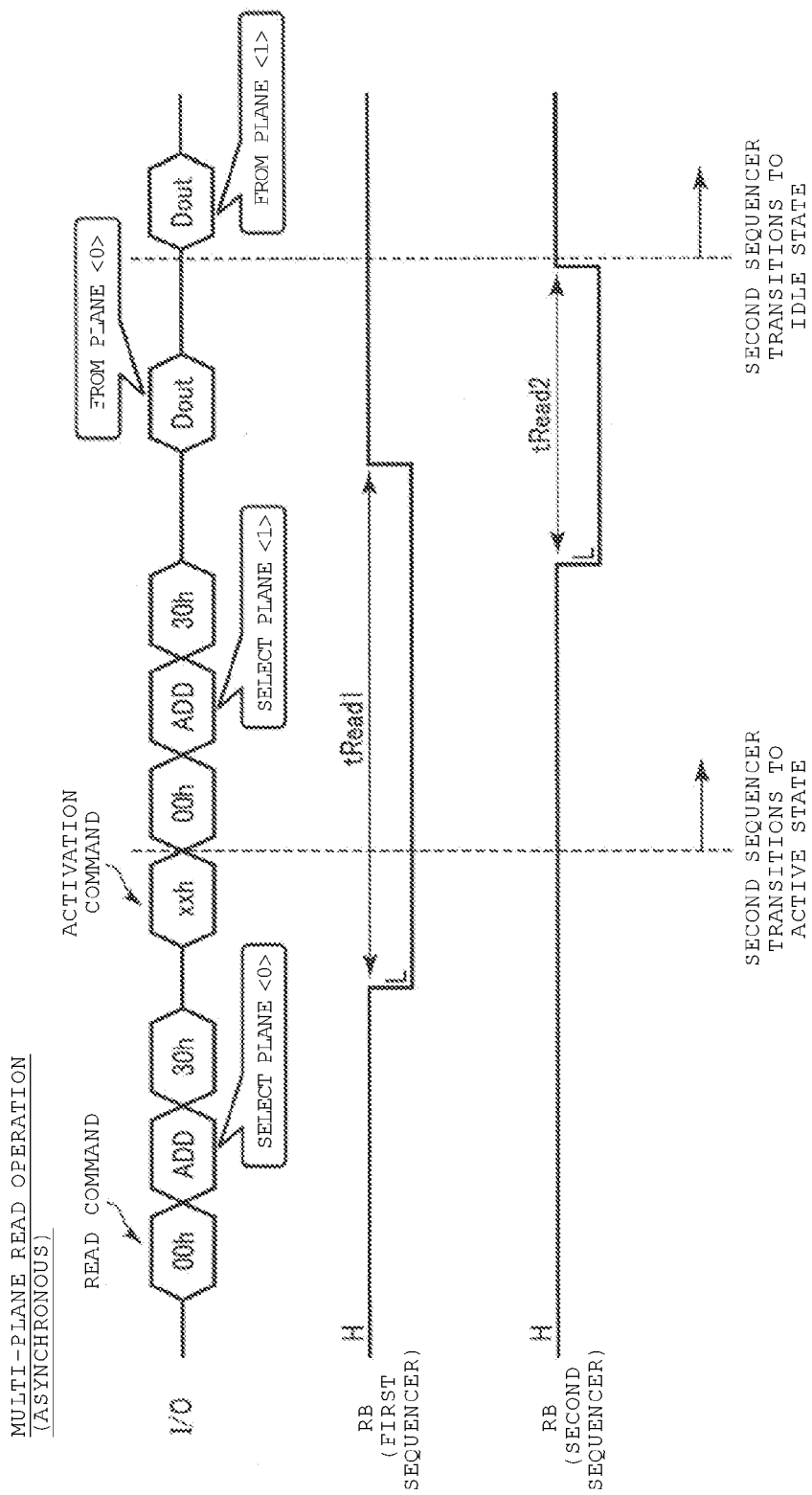
FIG. 10 is a diagram illustrating a command sequence of a read operation in the memory system according to the first embodiment.

Next, an asynchronous multi-plane read operation in the semiconductor memory device 10 will be described with reference to FIG. 10. FIG. 10 illustrates an example of a command sequence in which the sequencers 36A and 36B asynchronously execute a read operation on the planes <0> and <1>. FIG. 10 illustrates the input and output signal I/O transmitted and received by the semiconductor memory device 10 and the ready/busy signals RB corresponding to the first sequencer 36A and the second sequencer 36B. In this example, an example in which reading first starts on the plane <0> and reading starts on the plane <1> during a period of the reading will be described.

As illustrated in FIG. 10, the controller 20 first transmits commands and address information instructing the read operation on the plane <0>. Specifically, the controller 20 transmits the command "00 h", the address information ADD for designating the plane <0>, and the command "30 h" sequentially to the semiconductor memory device 10.

When the command "30 h" is stored in the register 35A, the first sequencer 36A starts the read operation on the plane <0>. Then, the first sequencer 36A enters the busy state from the ready state. As illustrated, tRead1 indicates a period in which the first sequencer 36A executes the read operation on the plane <0>. During this period, the first sequencer 36A maintains the busy state.

Then, while the first sequencer 36A is executing the read operation on the plane <0>, the controller 20 issues an activation command "xxh" to transmit the activation command "xxh" to the semiconductor memory device 10. The activation command "xxh" is used for allowing the second sequencer 36B in the idle state to transition to the active state. The transmitted command "xxh" is stored in, for example, the second command register 35B via the input and output circuit 31.

When the command "xxh" is stored in the register 35B, the second sequencer 36B in the idle state is activated to transition to the active state. Then, the controller 20 transmits the commands and the address information for instructing the read operation on the plane <1>. Specifically, the controller 20 transmits the command "00 h", the address information ADD for designating the plane <1>, and the command "30 h" sequentially to the semiconductor memory device 10. Here, the commands "00 h" and "30 h" are stored in the second command register 35B via the input and output circuit 31 and the address information ADD is stored in the second address register 34B via the input and output circuit 31.

When the command "30 h" is stored in the register 35B, the second sequencer 36B starts the read operation on the plane <1> and the second sequencer 36B enters the busy state from the ready state. As illustrated, tRead2 indicates a period in which the second sequencer 36B executes the read operation on the plane <1>. During this period, the second sequencer 36B maintains the busy state. As illustrated, in the semiconductor memory device 10 in this example, there is a period in which both of the first sequencer 36A and the second sequencer 36B are in the busy state. An operation image of the sequencer module 36 and the CG driver module 39 during this period is illustrated in FIG. 11.

Figure 11:
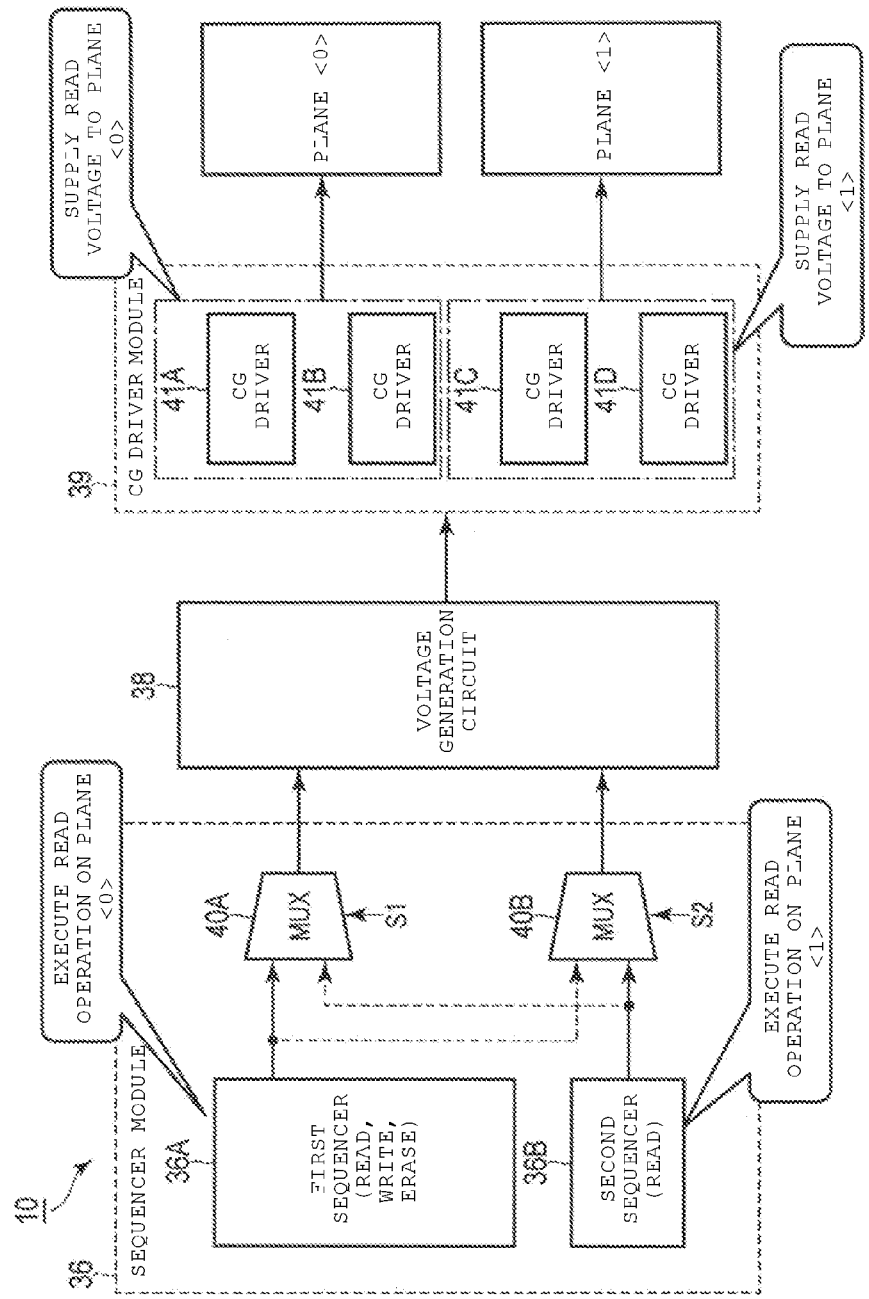
FIG. 11 is a diagram illustrating the read operation in the memory system according to the first embodiment.

As illustrated in FIG. 11, the sequencer module 36 controls the selection signal S1 such that a control signal of the first sequencer 36A is output to the multiplexer 40A, and controls the selection signal S2 such that a control signal of the second sequencer 36B is output to the multiplexer 40B. Thus, while the first sequencer 36A is executing the read operation on the plane <0>, the second sequencer 36B can start the read operation on the plane <1>.

In the read operation, the voltage generation circuit 38 generates voltages based on the control of the first sequencer 36A and the second sequencer 36B, and the CG driver module 39 generates various voltages necessary for the read operation from the voltages and supplies the voltages to the row decoder 13A of the plane <0> and the row decoder 13B of the plane <1>. In this example, as illustrated, the CG drivers 41A and 41B supply a read voltage to the plane <0>, and the CG drivers 41C and 41D supply a read voltage to the plane <1>. The other remaining detailed operation is the same as the single plane read operation described in the section [1-2-1].

When the read operation on the plane <0> ends, the first sequencer 36A enters the ready state from the busy state. Then, the sense amplifier module 12A transmits the data Dout read from the plane <0> to the controller 20.

When the read operation on the plane <1> ends, the second sequencer 36B enters the ready state from the busy state and further transitions to the idle state. Then, the sense amplifier module 12B transmits the data Dout read from the plane <1> to the controller 20. A timing at which the second sequencer 36B transitions to the idle state is not limited to a timing at which the corresponding read operation ends. For example, after the data read in the control of the second sequencer 36B is output to the controller 20, the second sequencer 36B may transition to the idle state.

As described above, the semiconductor memory device 10 can execute the asynchronous multi-plane read operation using the second sequencer 36B. In the asynchronous multi-plane reading operation of the semiconductor memory device 10, the order of the planes for instructing the read operation is interchanged in some cases in the above-described example. Specifically, the reading on the plane <1> first starts and the reading on the plane <0> starts during a period of the reading. The example of this case will be described below with reference to FIG. 12.

Figure 12:
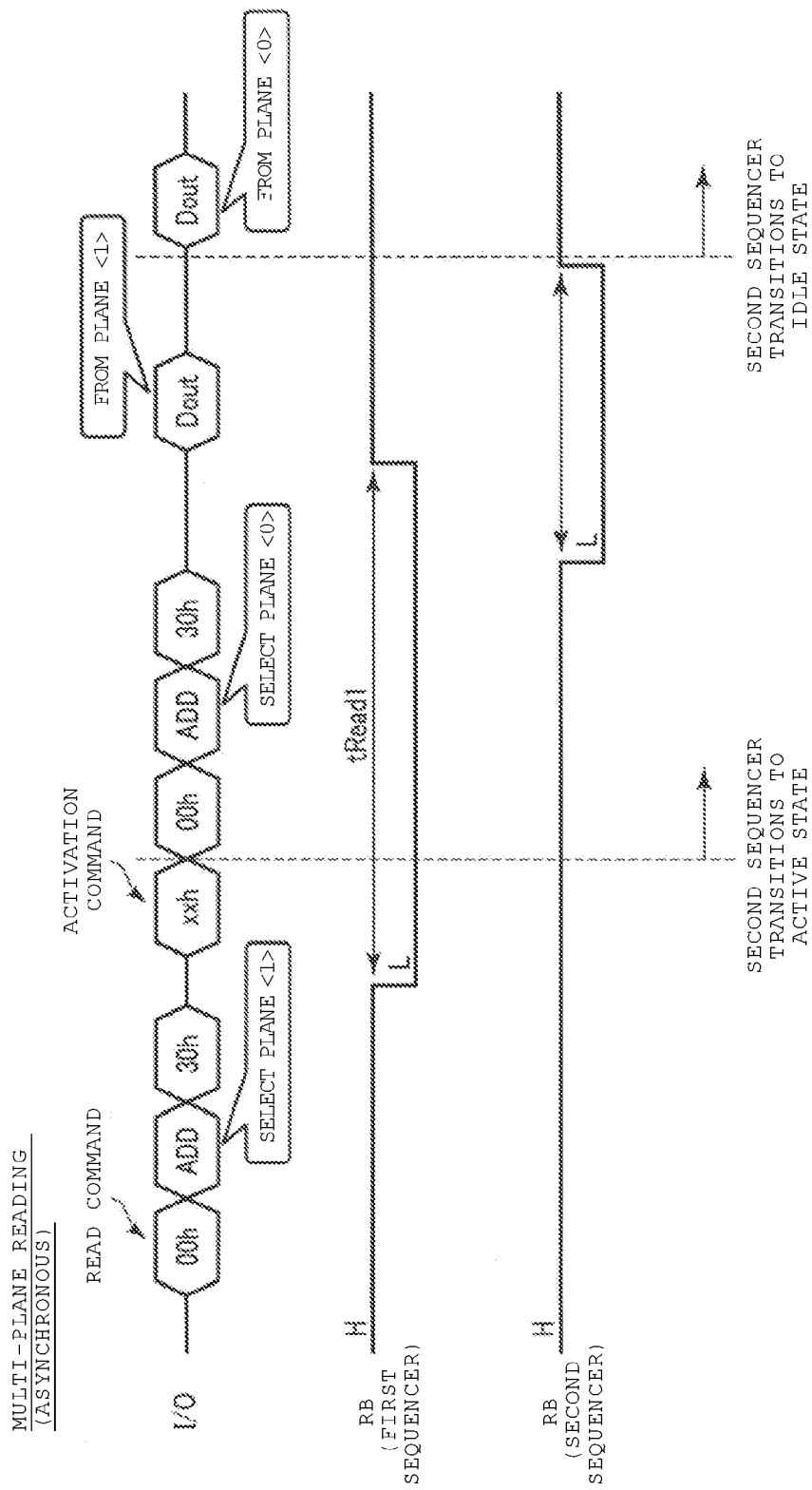
FIG. 12 is a diagram illustrating a command sequence of a read operation in the memory system according to the first embodiment.

The command sequencer illustrated in FIG. 12, the order of the planes on which the controller 20 instructs the read operation is interchanged with respect to FIG. 10 described above. Specifically, the read operation is instructed in the order of the planes <1> and <0>. In this case, the first sequencer 36A executes the read operation on the plane <1> and the second sequencer 36B executes the read operation on the plane <0>. An operation image of the sequencer module 36 and the CG driver module 39 in this case is illustrated in FIG. 13.

Figure 13:
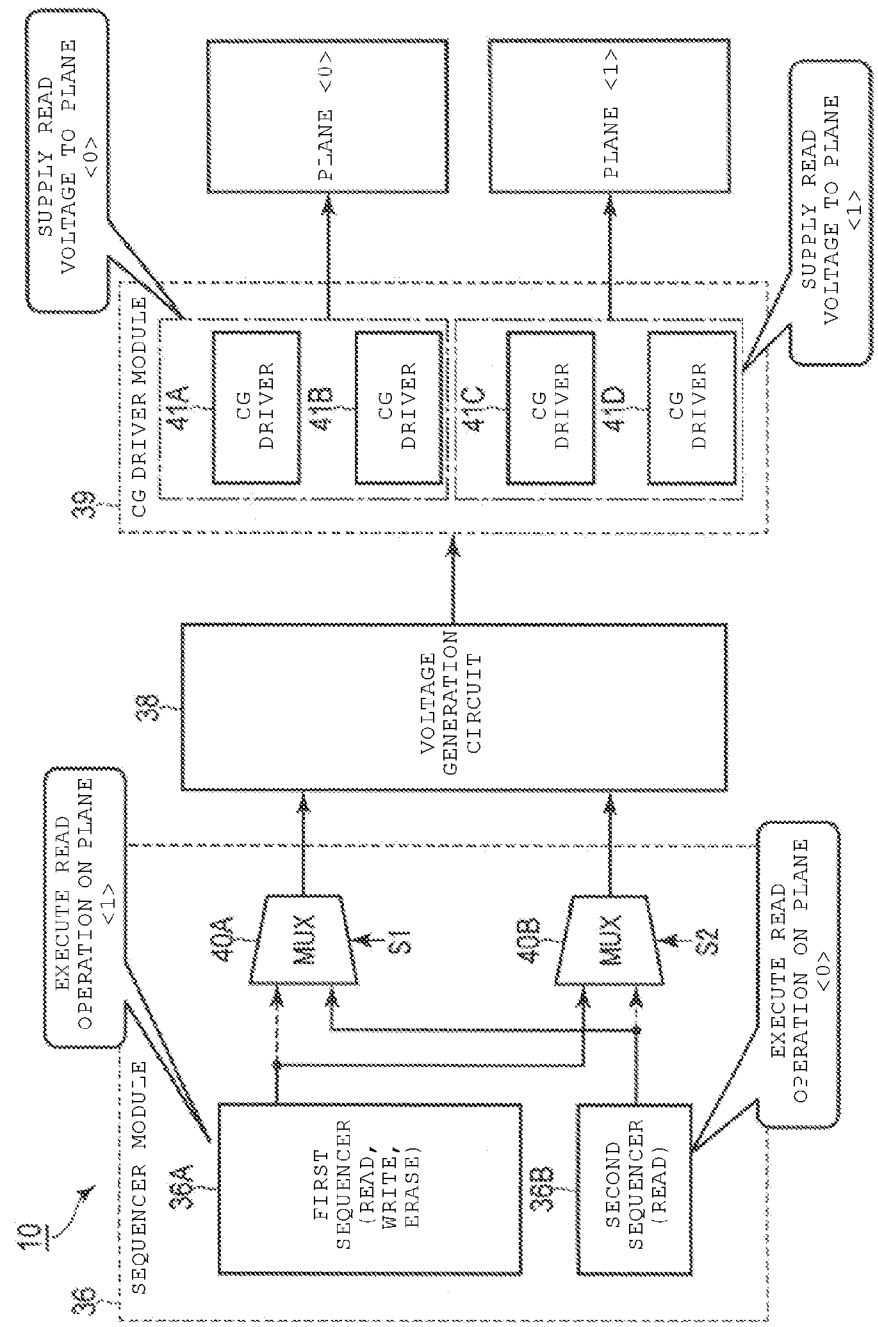
FIG. 13 is a diagram illustrating the read operation in the memory system according to the first embodiment.

As illustrated in FIG. 13, the sequencer module 36 controls the selection signal S1 such that a control signal of the second sequencer 36B is output to the multiplexer 40A, and controls the selection signal S2 such that a control signal of the first sequencer 36A is output to the multiplexer 40B. Thus, while the first sequencer 36A is executing the read operation on the plane <1>, the second sequencer 36B can start the read operation on the plane <0>. The other remaining detailed operation is the same as the asynchronous multi-plane read operation described with reference to FIG. 11, and thus the other remaining detailed operation will not be described.

As described above, the second sequencer 36B maintains the active state until the semiconductor memory device 10 receives the activation command "xxh" and then the corresponding read operation ends. That is, the second sequencer 36B is activated during a period in which the asynchronous multi-plane read operation is executed.

Figure 14:
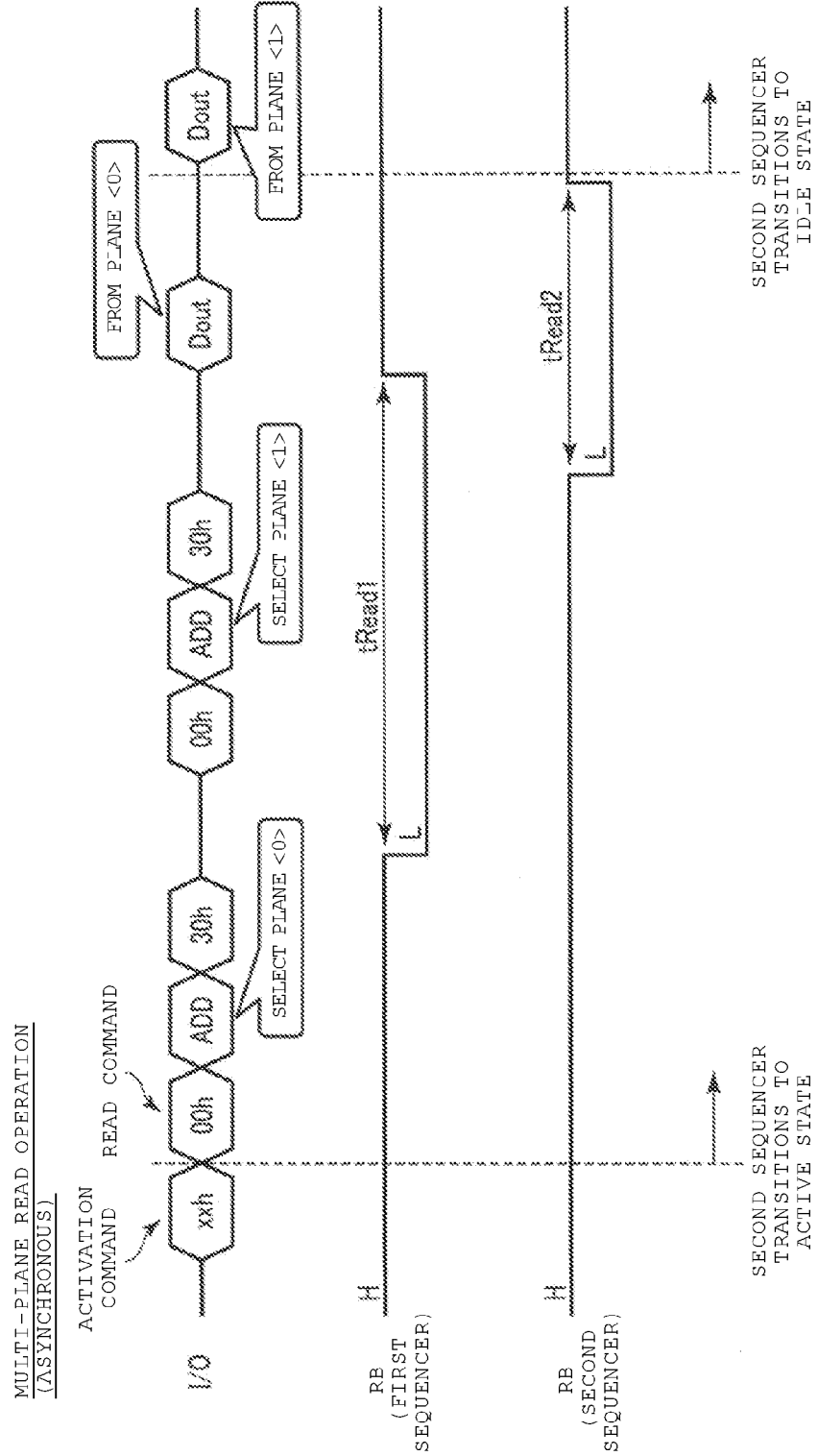
FIG. 14 is a diagram illustrating a command sequence of a read operation in the memory system according to the first embodiment.

In the above description, the controller 20 issues the activation command "xxh" when the first sequencer 36A is in the busy state and the second sequencer 36B is in the ready state in the example, but an exemplary embodiment is not limited thereto. For example, the controller 20 may issue the activation command "xxh" when both of the first sequencer 36A and the second sequencer 36B are in the ready state. An example of a command sequence in this case is illustrated in FIG. 14. The command sequence illustrated in FIG. 14 is different from the command sequence illustrated in FIG. 10 described above in that the activation command "xxh" is issued at the beginning of the asynchronous multi-plane read operation.

In the command sequence illustrated in FIG. 14, the second sequencer 36B is in the active state when the semiconductor memory device 10 is instructed to execute the read operation on the plane <0>. In this way, even when the second sequencer 36B is in the active state and the ready state, the semiconductor memory device 10 first starts the read operation using the first sequencer 36A when the first sequencer 36A is in the ready state. The semiconductor memory device 10 starts the read operation on the plane <1> using the second sequencer 36B when the semiconductor memory device 10 is instructed to execute the read operation on the plane <1> while first sequencer 36A is executing the read operation on the plane <0>. The other remaining operation is the same as the asynchronous multi-plane read operation described with reference to FIG. 10, and thus the other remaining operation will not be described.

[1-2-4] Multi-Plane Write Operation

Figure 15:
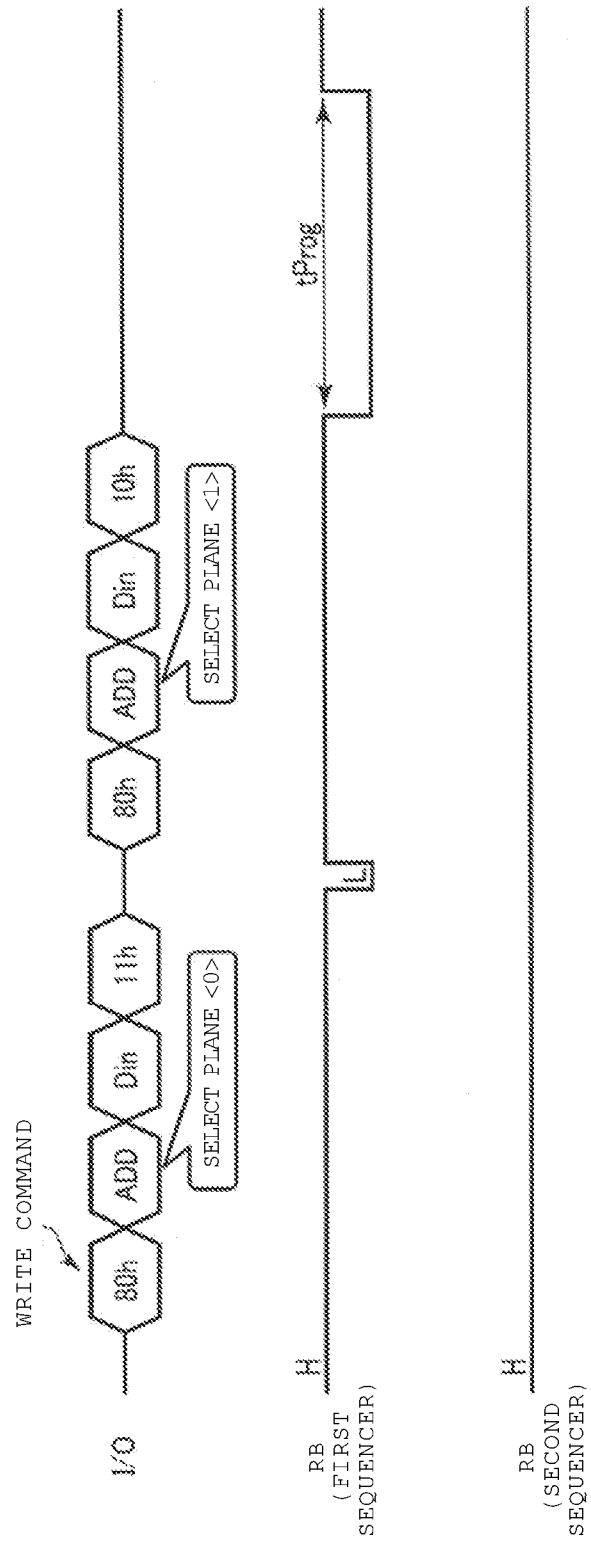
FIG. 15 is a diagram illustrating a command sequence of a write operation in the memory system according to the first embodiment.

Next, a multi-plane write operation in the semiconductor memory device 10 will be described with reference to FIG. 15. FIG. 15 illustrates an example of a command sequence in which the first sequencer 36A synchronously executes a write operation on the planes <0> and <1>. FIG. 15 illustrates the input and output signal I/O transmitted and received by the semiconductor memory device 10 and the ready/busy signals RB corresponding to the first sequencer 36A and the second sequencer 36B.

As illustrated in FIG. 15, the controller 20 first issues the command "80 h" to transmit the command "80 h" to the semiconductor memory device 10. The command "80 h" is equivalent to an input reception command of address information and write data and is used for instructing the semiconductor memory device 10 to execute a write operation. The transmitted command "80 h" is stored in the first command register 35A via the input and output circuit 31.

Next, the controller 20 issues address information ADD to transmit the address information ADD to the semiconductor memory device 10. The address information ADD includes information for designating the plane <0>. The transmitted address information ADD is stored in the first address register 34A via the input and output circuit 31.

Subsequently, the controller 20 transmits write data Din to the semiconductor memory device 10. The write data Din is retained in a cache circuit of the sense amplifier module 12A in the plane <0>.

Then, the controller 20 issues a command "11 h" to transmit the command "11 h" to the semiconductor memory device 10. The command "11 h" is used for ordering a write operation of a plurality of pages and indicates that the commands and the address information transmitted until now correspond to data equivalent to one page. The transmitted command "11 h" is stored in the first command register 35A via the input and output circuit 31.

When the command "11 h" is stored in the register 35A, the first sequencer 36A enters the busy state from the ready state and thereafter enters the ready state from the busy state. This operation indicates that the semiconductor memory device can subsequently receive the write commands from the controller 20.

Then, the controller 20 transmits a command set corresponding to another write page to the semiconductor memory device 10. Specifically, the controller 20 transmits the command "80 h", the address information ADD for designating the plane <1>, the data Din equivalent to one page to be written, and a command "10 h" sequentially to the semiconductor memory device 10. The command "10 h" is used for instructing the semiconductor memory device 10 to start a write operation based on the received commands, the address information, and the write data.

When the command "10 h" is stored in the register 35A, the first sequencer 36A executes the multi-plane write operation based on a command set including an instruction on the plane <0> and the command "11 h" and a command set including an instruction on the plane <1> and the command "10 h", and the first sequencer 36A enters the busy state from the ready state. As illustrated, tProg indicates a period in which the first sequencer 36A executes the synchronous multi-plane write operation on the planes <0> and <1>.

Figure 16:
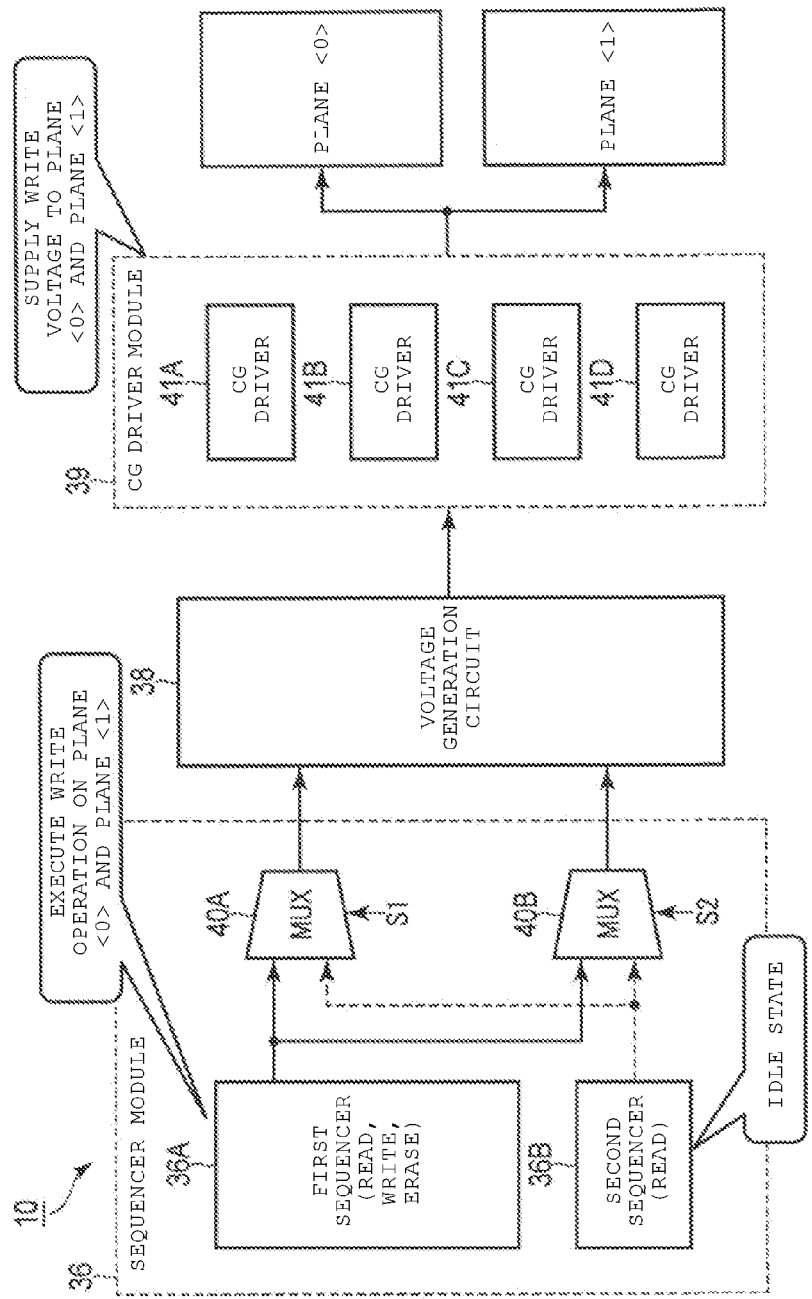
FIG. 16 is a diagram illustrating the write operation in the memory system according to the first embodiment.

An operation image of the sequencer module 36 and the CG driver module 39 in the write operation is illustrated in FIG. 16. As illustrated in FIG. 16, the sequencer module 36 controls the selection signals S1 and S2 such that control signals of the first sequencer 36A are output to the multiplexers 40A and 40B. Thus, the first sequencer 36A can execute the write operation on the planes <0> and <1>.

In the write operation, the voltage generation circuit 38 generates voltages based on the control of the first sequencer 36A, and the CG driver module 39 selects various voltages necessary for the write operation from the voltages and transmits the voltages to the row decoder 13A of the plane <0> and the row decoder 13B of the plane <1>. Examples of the various voltages used for the write operation include a write voltage for increasing a threshold voltage of a memory cell and a write pass voltage for turning on a memory cell without regard to the stored data. The write voltage is applied to selected word lines WL and the write pass voltage is applied to unselected word lines WL.

In the write operation, the row decoder 13A selects the block BLK based on the block address BA in the address information ADD and transmits the voltages supplied from the CG driver module 39 to various word lines WL of the selected block BLK. The sense amplifier module 12A transmits write data to the memory cell array 11A.

When the write operation ends, the first sequencer 36A enters the ready state from the busy state and the multi-plane write operation of the semiconductor memory device 10 ends.

In this way, the semiconductor memory device 10 uses the first sequencer 36A in the multi-plane write operation. That is, while the multi-plane write operation is being executed, the second sequencer 36B normally maintains the ready state and the idle state, as illustrated in FIG. 16.

The semiconductor memory device 10 uses the first sequencer 36A similarly even when a single plane write operation or an erasing operation is executed. That is, even while the single plane write operation or the erasing operation is being executed, the second sequencer 36B similarly maintains the ready state and the idle state.

When the semiconductor memory device 10 executes the single plane write operation, for example, a command set including the command "80 h", the address information ADD, the data Din equivalent to one page to be written, and the command "10 h" described above in order is used. An operation of the multiplexer 40 in this case is the same as the single plane read operation described in the section [1-2-1].

[1-2-5] Another Operation

Figure 17:
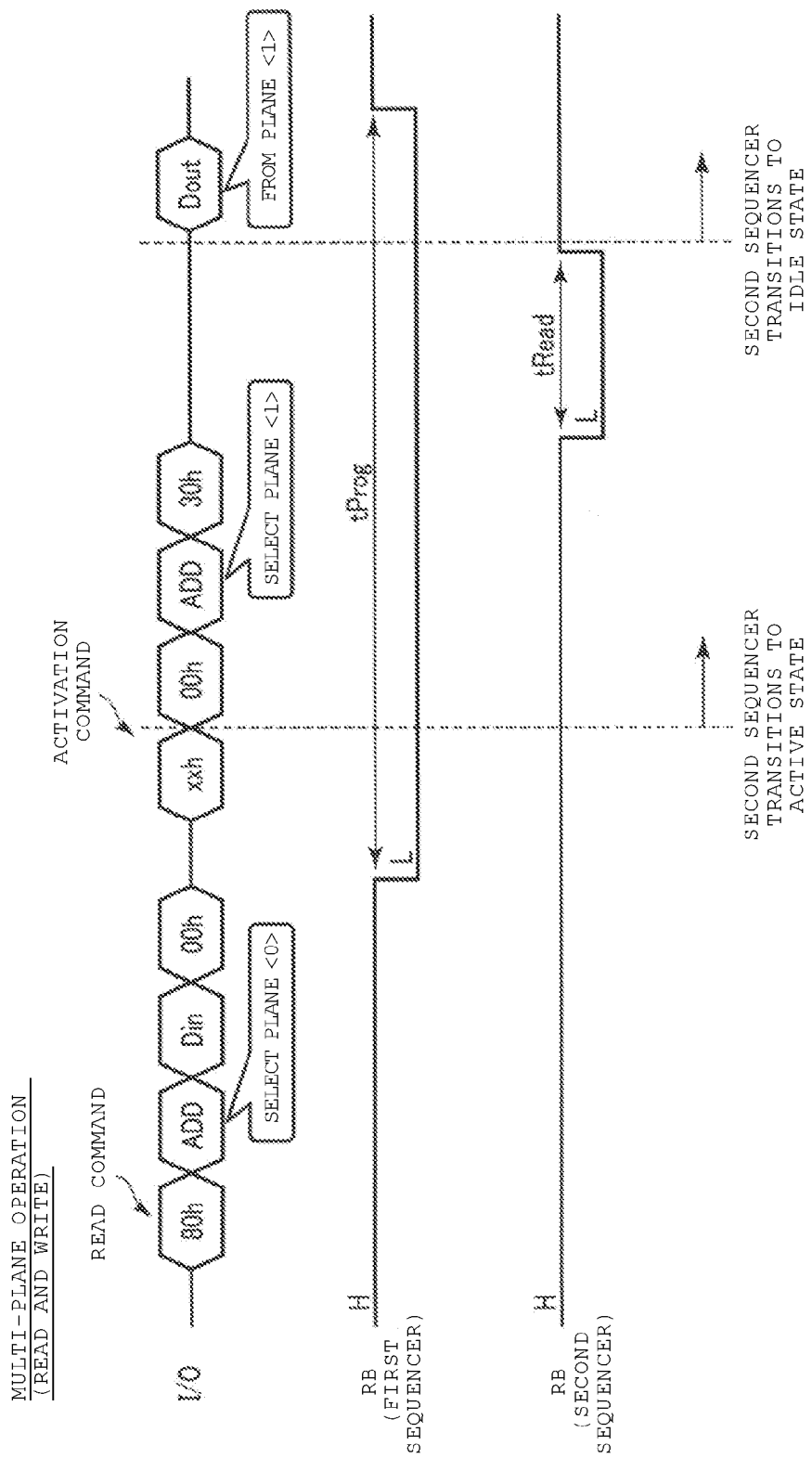
FIG. 17 is a diagram illustrating a command sequence of read and write operations in the memory system according to the first embodiment.

As another operation in the semiconductor memory device 10, while the first sequencer 36A is executing a write operation or an erasing operation on one plane, it is considered that a read operation is started on the other plane using the second sequencer 36B. This example will be described with reference to FIG. 17. In a command sequence illustrated in FIG. 17, the controller 20 first instructs the semiconductor memory device 10 to execute a write operation on the plane <0> and instructs the semiconductor memory device 10 to execute a read operation on the plane <1> during a period of the writing.

Specifically, the controller 20 first transmits the issued command "80 h", the address information ADD for designating the plane <0>, and the write data Din, and the issued command "00 h" sequentially to the semiconductor memory device 10. Then, the first sequencer 36A starts a write operation on the plane <0> and enters the busy state from the ready state. As illustrated, tProg indicates a period in which the first sequencer 36A executes the read operation on the plane <0>.

While the first sequencer 36A is executing the write operation, the controller 20 issues the activation command "xxh" to transmit the activation command "xxh" to the semiconductor memory device 10. Then, the second sequencer 36B in the idle state is activated to transition to the active state. Then, the controller 20 transmits a command and address information for instructing a read operation on the plane <1>. Specifically, the controller 20 transmits the command "00 h", the address information ADD for designating the plane <1>, and the command "30 h" sequentially to the semiconductor memory device 10.

When the command "30 h" is stored in the register 35B, the second sequencer 36B starts the read operation on the plane <1> and the second sequencer 36B enters the busy state from the ready state. As illustrated, tRead indicates a period in which the second sequencer 36B executes the read operation on the plane <1>. During this period, the second sequencer 36B maintains the busy state. As illustrated, in the semiconductor memory device 10 in this example, there is a period in which both of the first sequencer 36A and the second sequencer 36B are in the busy state. An operation image of the sequencer module 36 and the CG driver module 39 during this period is illustrated in FIG. 18.

Figure 18:
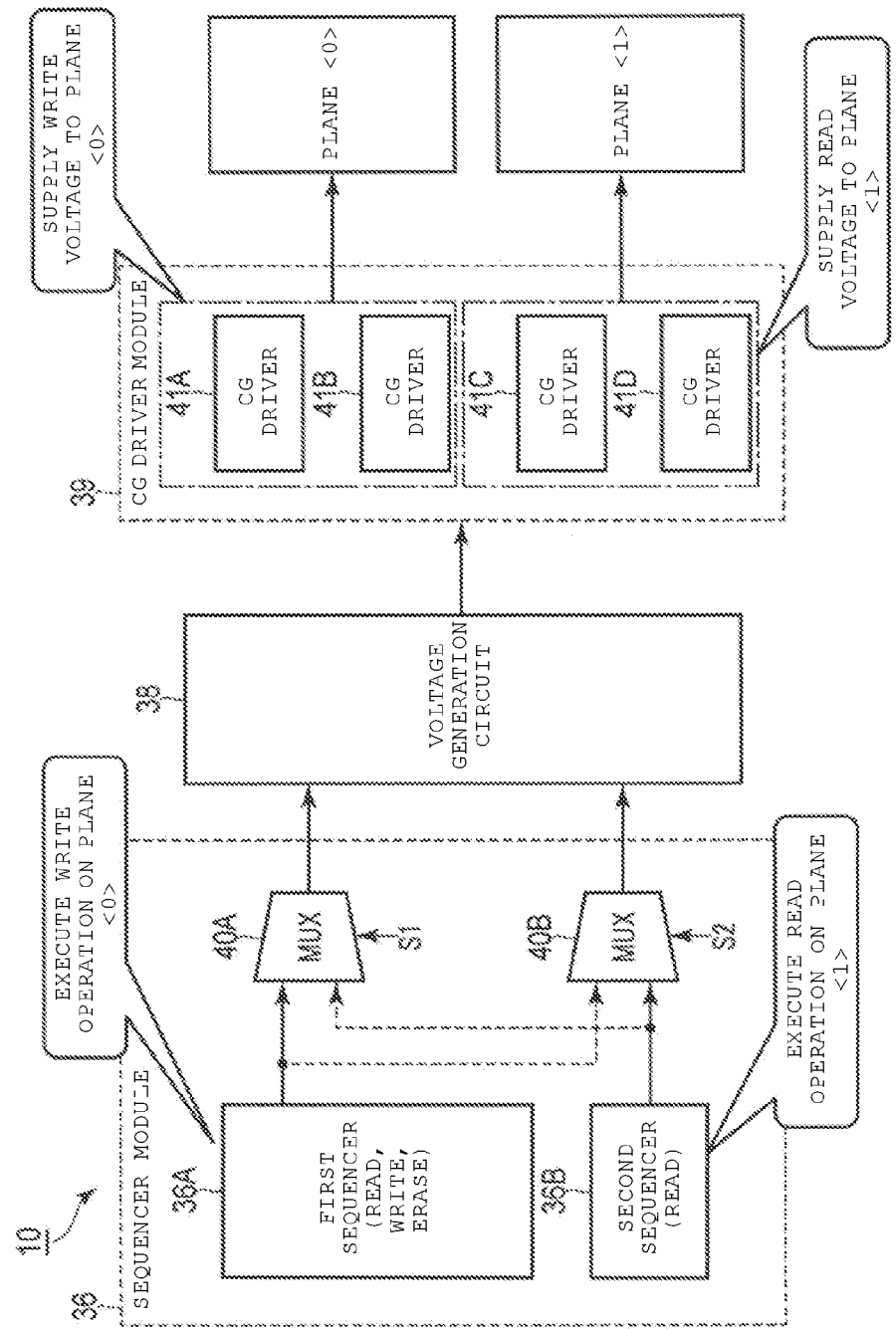
FIG. 18 is a diagram illustrating the read and write operations in the memory system according to the first embodiment.

As illustrated in FIG. 18, the sequencer module 36 controls the selection signal S1 such that a control signal of the first sequencer 36A is output to the multiplexer 40A, and controls the selection signal S2 such that a control signal of the second sequencer 36B is output to the multiplexer 40B. Thus, while the first sequencer 36A is executing the write operation on the plane <0>, the second sequencer 36B can start the read operation on the plane <1>. In this example, as illustrated, the CG drivers 41A and 41B supply write voltages to the plane <0> and the CG drivers 41C and 41D supply read voltages to the plane <1>. The other remaining detailed operation is the same as the operation described in [1-2-1] to [1-2-4].

When the read operation on the plane <1> by the second sequencer 36B ends, the second sequencer 36B enters the ready state from the busy state and further transitions to the idle state. Then, the sense amplifier module 12B transmits the data Dout read from the plane <1> to the controller 20.

When the write operation on the plane <0> by the first sequencer 36A ends, the first sequencer 36A transitions from the busy state to the ready state. In this example, the end timing of the write operation on the plane <0> and the end timing of the read operation on the plane <1> are merely examples, and an exemplary embodiment is not limited thereto. For example, it can be considered that the read operation on the plane <1> also ends after the write operation on the plane <0> ends.

In this example, in the semiconductor memory device 10, the second sequencer 36B may start the read operation on the plane <0> while the first sequencer 36A is executing any operation on the plane <1>, as in the operation described with reference to FIG. 13.

[1-3] Advantages of First Embodiment

In the semiconductor memory device 10 according to the first embodiment, an operation can be executed at a high speed. Hereinafter, the details of the advantages will be described.

Various operations such as a read operation, a write operation, and an erasing operation of the semiconductor memory device are executed in internal sequencers of the semiconductor memory device based on information such as command received from the memory controller. When such a semiconductor memory device includes, for example, two planes, an external host device separately instructs the memory controller to read data stored on one of the planes and to read data stored on the other plane.

When the memory controller is instructed to read the data on the other plane from the host device before issuing of a read command on the one plane, the memory controller can instruct the semiconductor memory device to execute a multi-plane reading operation of synchronizing two planes. On the other hand, while the sequencer is executing a read operation on the one plane, the memory controller is instructed to execute reading on the other plane by the host device. As an operation of the memory controller in this case, for example, a method of ending the read operation on the one plane and then instructing to execute the read operation on the other plane is considered. This is because the sequencer controlling the read operation is shared between the planes.

In contrast, the semiconductor memory device 10 according to the present embodiment includes the first sequencer 36A that is used at the normal time and the second sequencer 36B that is used when the first sequencer 36A operates. The control signals of the first sequencer 36A and the second sequencer 36B are input to the multiplexers 40A and 40B, and the multiplexers 40A and 40B transmit one selection signal selected from the input control signals to the planes <0> and <1>.

Thus, the first sequencer 36A and the second sequencer 36B can execute read operations on the planes <0> and <1>. Then, for example, when the first sequencer 36A is executing the read operation on the plane <0>, the controller 20 can execute the read operation on the plane <1> by using the second sequencer 36B despite reception of the read instruction on the plane <1> from the host device.

Specifically, for example, when the first sequencer 36A and the second sequencer 36B receive the first command set for instructing the read operation of the plane <0> during the ready state, the first sequencer 36A executes the read operation on the plane <0>. Then, while the first sequencer 36A is executing the read operation, the second sequencer 36B executes the read operation on the plane <1> upon receiving the second command set for instructing the read operation of the plane <1>.

As described above, the semiconductor memory device 10 according to the present embodiment can execute an asynchronous multi-plane read operation on the planes <0> and <1>. That is, since the semiconductor memory device 10 according to the present embodiment can execute the read operation at an arbitrary timing for each plane, an operation can be accelerated.

While the first sequencer 36A is executing various operations in the semiconductor memory device 10 according to the present embodiment, the second sequencer 36B may be in the idle state. Then, the second sequencer 36B in the idle state is activated when an asynchronous multi-plane reading operation is necessary.

Specifically, when the semiconductor memory device 10 receives such an activation command from the controller 20, the second sequencer 36B transitions from the idle state to the active state. When the second sequencer 36B enters the active state, the semiconductor memory device 10 can execute the asynchronous multi-plane read operation.

In addition, in the read operation, the controller 20 issues an activation command to activate the second sequencer 36B to transmit the activation command to the semiconductor memory device 10 before the first or second command set is issued. Thus, before the semiconductor memory device 10 executes the read operation using the second sequencer 36B, the second sequencer 36B transitions from the idle state to the active state. Then, the second sequencer 36B transitions from the active state to the idle state when the read operation on the plane <1> ends.

Thus, in the semiconductor memory device 10, power consumption when the second sequencer 36B is in the idle state is less than power consumption when the second sequencer 36B is in the active state. The operation states of the first sequencer 36A and the second sequencer 36B in various operations of the semiconductor memory device 10 are illustrated in, for example, FIG. 19.

Figure 19:
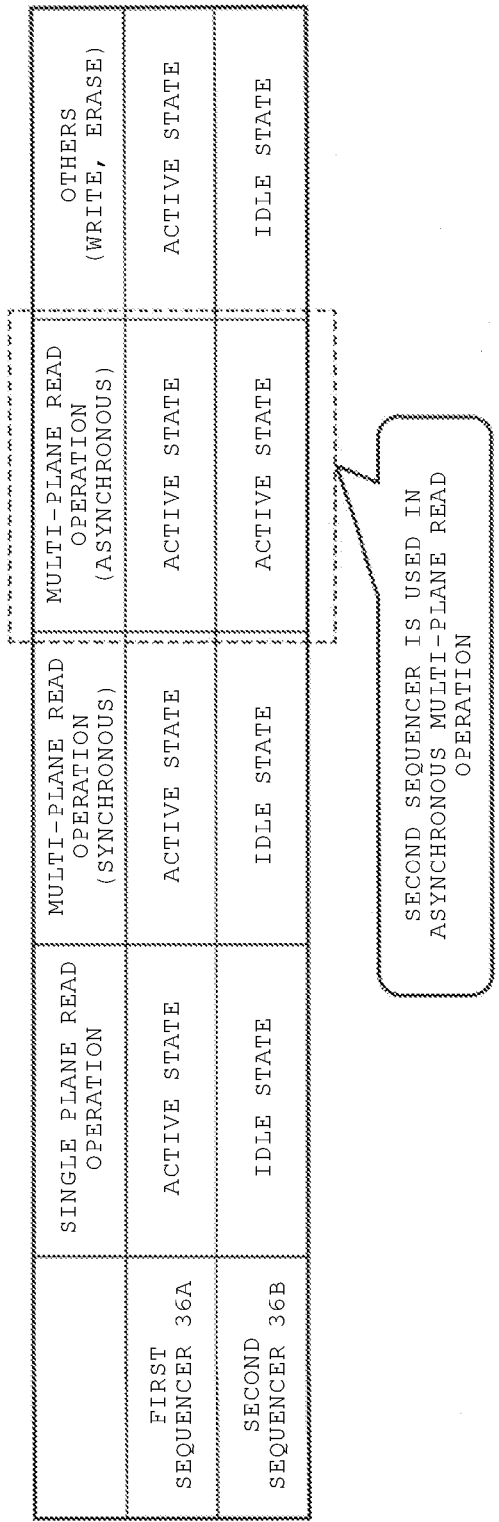
FIG. 19 is a diagram illustrating the state of a sequencer in various operations of the memory system according to the first embodiment.

As illustrated in FIG. 19, the first sequencer 36A is normally in the active state when various operations are executed. On the other hand, the second sequencer 36B maintains the idle state in the single plane read operation, the multi-plane read operation and the write operation synchronized in the plurality of planes, and the erasing operation and enters the active state in the multi-plane read operation executed asynchronously in the plurality of planes.

As described above, in the semiconductor memory device 10 according to the present embodiment, the second sequencer 36B is in the idle state while the first sequencer 36A is executing various operations, and is in the active state when the asynchronous multi-plane read operation is executed. Thus, in the memory system 1 according to the present embodiment, it is possible to suppress power consumption when the asynchronous multi-plane read operation is not executed.

The semiconductor memory device 10 according to the present embodiment is configured such that, for example, the first sequencer 36A can execute the read operation, the write operation, the erasing operation, and the like and the second sequencer 36B can execute the read operation and does not execute the write operation and the erasing operation.

In this way, a circuit area of the second sequencer 36B can be smaller than a circuit area of the first sequencer 36A by restricting an operation which can be executed by the second sequencer 36B. Thus, the memory system 1 according to the present embodiment can suppress the circuit area of the entire semiconductor memory device 10, and thus can reduce manufacturing cost.

In the example described above, the asynchronous multi-plane read operation can be executed, but an exemplary embodiment is not limited thereto. For example, while the first sequencer 36A is executing the write operation or the erasing operation, the second sequencer 36B may execute the read operation. That is, the semiconductor memory device 10 can execute asynchronous various operations between the plurality of planes according to the operation which can be executed by the second sequencer 36B.

In the semiconductor memory device 10 according to the present embodiment, the plurality of sequencers can control the plurality of planes, respectively by using the multiplexers 40. Thus, since many circuits can be shared between the planes in the semiconductor memory device 10, the circuit area can be suppressed, and thus the manufacturing cost can be reduced.

In the memory system 1 having the above-described configuration, the control of the controller 20 can be simplified since the restriction that page addresses of the same data level in the plurality of planes are input in the multi-plane read operation can be removed. Thus, in the memory system 1 having the above-described configuration, a read speed can be accelerated since the performance in the multi-plane operation can be improved.

[2] Second Embodiment

Next, a semiconductor memory device 10 and a memory system 1 according to a second embodiment will be described. In the second embodiment, the sequencer module 36 used in a read operation is fixed for each plane in the semiconductor memory device 10 described in the first embodiment. Hereinafter, differences from the first embodiment will be described.

[2-1] Configuration of Semiconductor Memory Device 10

Figure 20:
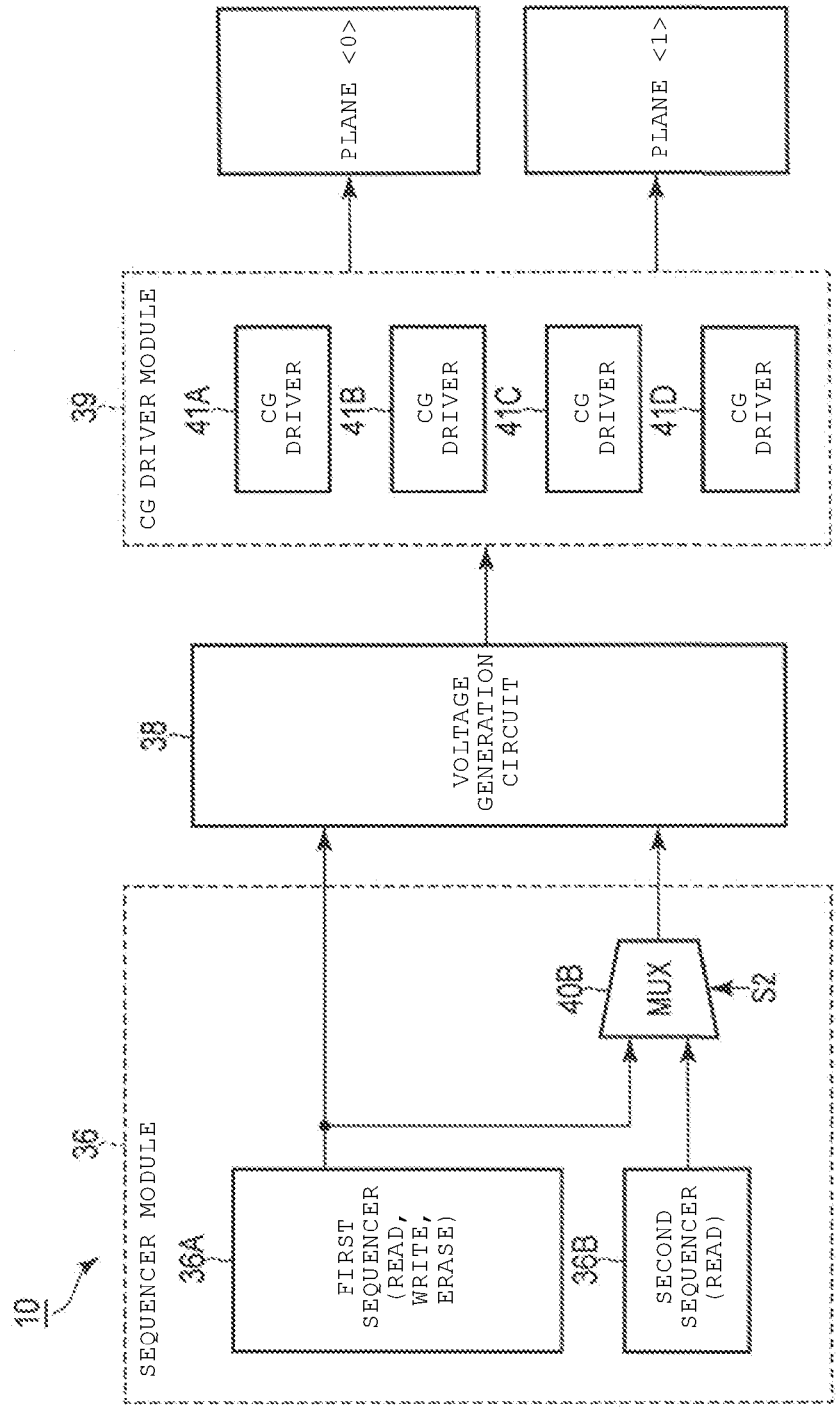
FIG. 20 is a block diagram illustrating a semiconductor memory device according to a second embodiment.

First, the configuration of the semiconductor memory device 10 will be described with reference to FIG. 20. FIG. 20 illustrates the configurations of the sequencer module 36 and the CG driver module 39. The semiconductor memory device 10 according to the present embodiment is different from that described in FIG. 4 in the first embodiment in the number of multiplexers 40 included in the sequencer module 36. Specifically, as illustrated in FIG. 20, the sequencer module 36 has a configuration in which the multiplexer 40A is excluded from the configuration illustrated in FIG. 4.

In the present embodiment, the first sequencer 36A executes a read operation, a write operation, an erasing operation, or the like on the plane <0> without intervention of a multiplexer (e.g., the multiplexer 40 in the first embodiment), and a write operation, an erasing operation, or the like is executed on the plane <1> via the multiplexer 40B. On the other hand, the second sequencer 36B executes a read operation on the plane <1> via the multiplexer 40B and does not execute a read operation on the plane <0>. The other remaining configuration is the same as that of the first embodiment, and thus the other remaining configuration will not be described.

[2-2] Operations

[2-2-1] Single Plane Read Operation

Figure 21:
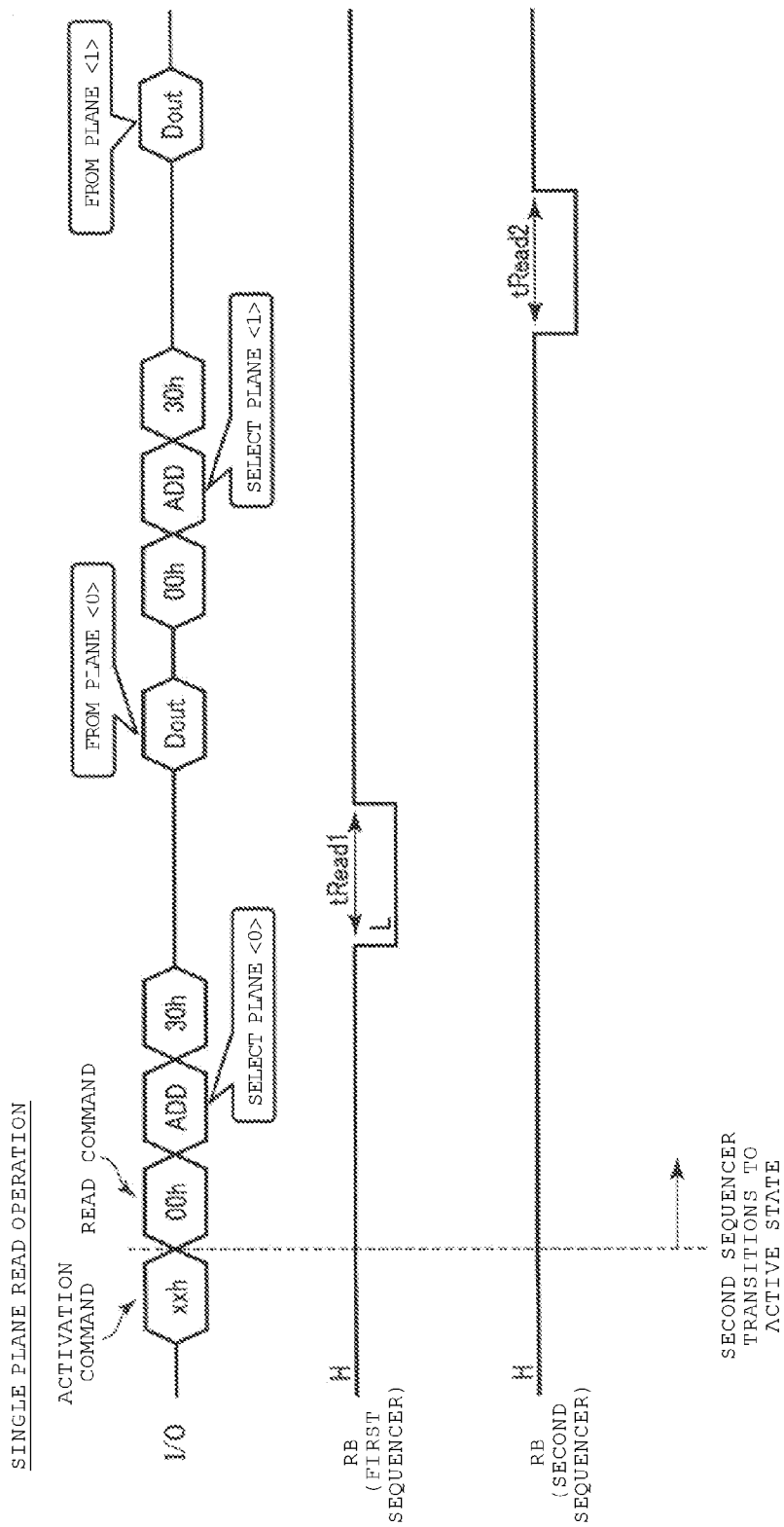
FIG. 21 is a diagram illustrating a command sequence of a read operation in the memory system according to the second embodiment.

Next, a single plane read operation in the semiconductor memory device 10 will be described with reference to FIG. 21. FIG. 21 illustrates an example of a command sequence in which the sequencers 36A and 36B execute single plane read operations on the planes <0> and <1> temporally in order. In FIG. 21, an issuing timing of an activation command "xxh" and the waveforms of the ready/busy signals RB corresponding to the first sequencer 36A and the second sequencer 36B are different from those in the command sequence described with reference to FIG. 5 in the first embodiment.

Specifically, as illustrated in FIG. 21, the controller 20 issues the activation command "xxh" at the beginning of the read operation. Thus, the second sequencer 36B transitions from the idle state to the active state.

Figure 22:
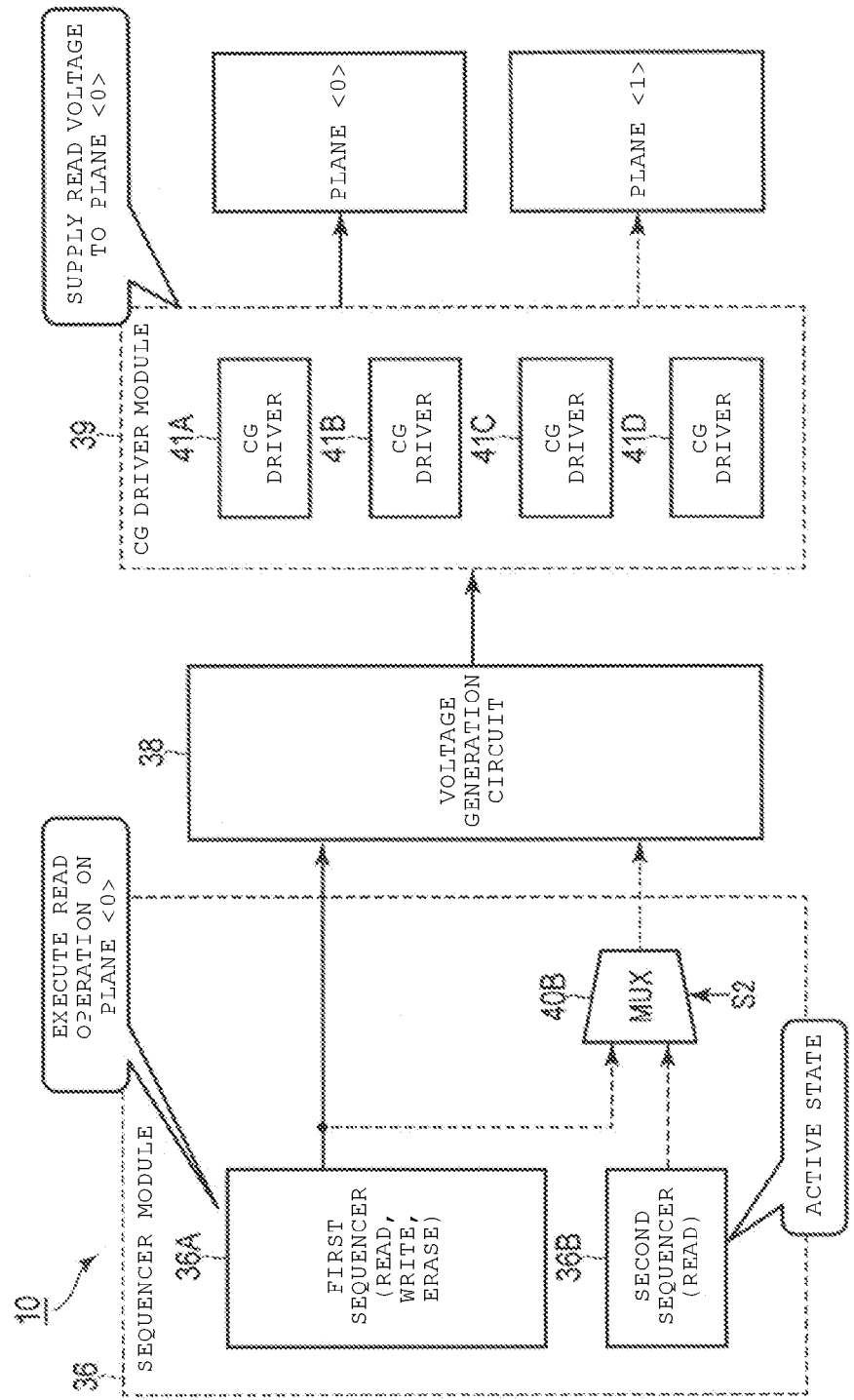
FIG. 22 is a diagram illustrating the read operation in the memory system according to the second embodiment.

Then, the controller 20 transmits the command "00 h", the address information ADD for designating the plane <0>, and the command "30 h" sequentially to the semiconductor memory device 10. When the command "30 h" is stored in the register 35A, the first sequencer 36A starts the read operation on the plane <0>. Then, the first sequencer 36A enters the busy state from the ready state. As illustrated, tRead1 indicates a period in which the read operation is executed. During this period, the first sequencer 36A maintains the busy state. An operation image of the sequencer module 36 and the CG driver module 39 during this period is illustrated in FIG. 22. As illustrated in FIG. 22, the first sequencer 36A controls the voltage generation circuit 38, the CG driver module 39, and the plane <0> without intervention of the multiplexer 40 to execute the read operation. On the other hand, the second sequencer 36B waits in the active state.

When the read operation ends, the first sequencer 36A enters the ready state from the busy state, as illustrated in FIG. 21. Then, the sense amplifier module 12A transmits the data Dout read from the plane <0> to the controller 20.

Figure 23:
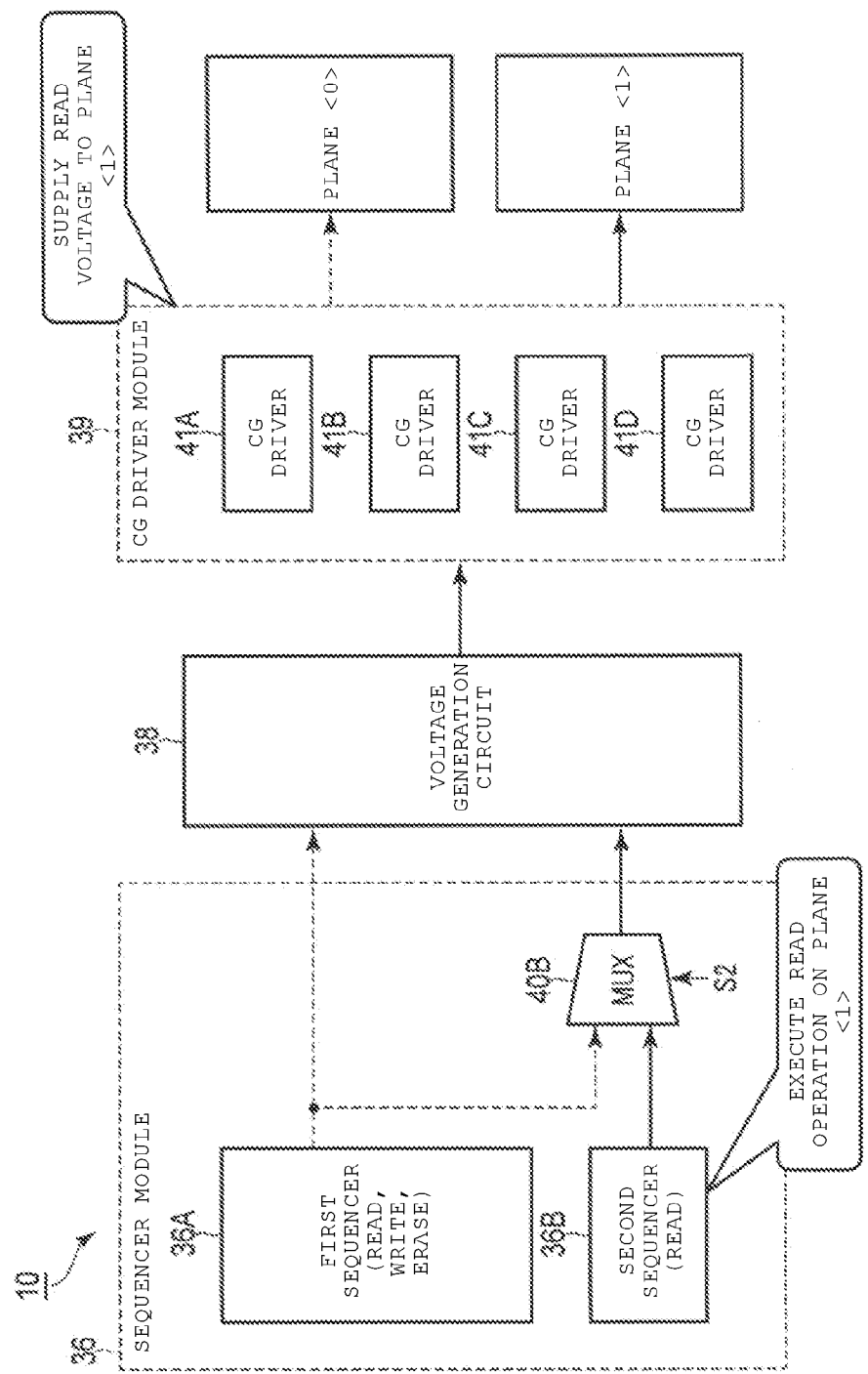
FIG. 23 is a diagram illustrating the read operation in the memory system according to the second embodiment.

Next, the controller 20 transmits the command "00 h", the address information ADD for designating the plane <1>, and the command "30 h" sequentially to the semiconductor memory device 10. When the command "30 h" is stored in the register 35B, the second sequencer 36B starts the read operation on the plane <1>. Then, the second sequencer 36B enters the busy state from the ready state. As illustrated, tRead2 indicates a period in which the read operation is executed. During this period, the second sequencer 36B maintains the busy state. An operation image of the sequencer module 36 and the CG driver module 39 during this period is illustrated in FIG. 23. As illustrated in FIG. 23, the sequencer module 36 controls the selection signal S2 to output the control signal of the second sequencer 36B to the multiplexer 40B. Then, the second sequencer 36B controls the voltage generation circuit 38, the CG driver module 39, and the plane <1> via the multiplexer 40B to execute the read operation.

When the read operation ends, the second sequencer 36B enters the ready state from the busy state, as illustrated in FIG. 21. Then, the sense amplifier module 12B transmits the data Dout read from the plane <1> to the controller 20.

As described above, in the semiconductor memory device 10 according to the present embodiment, the first sequencer 36A is used in the read operation on the plane <0> and the second sequencer 36B is used in the read operation on the plane <1>. That is, in the semiconductor memory device 10 according to the present embodiment, the sequencer used for each plane can be allocated in the single plane read operation. The second sequencer 36B is considered to be in the active state during the read operation and transitions to the idle state when the read operation ends.

[2-2-2] Multi-Plane Read Operation (Asynchronous)

Figure 24:
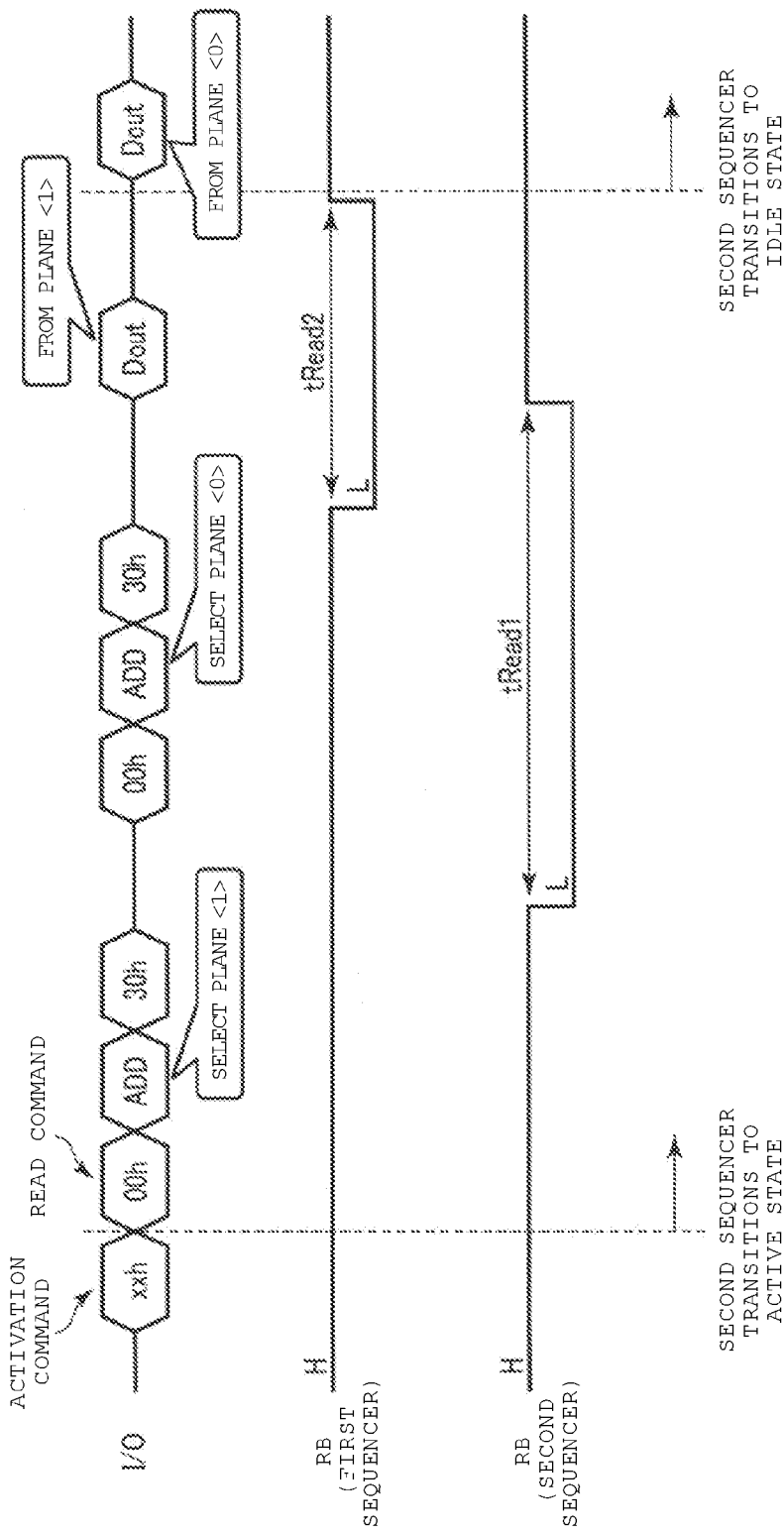
FIG. 24 is a diagram illustrating a command sequence of a read operation in the memory system according to the second embodiment.

Next, an asynchronous multi-plane read operation in the semiconductor memory device 10 will be described with reference to FIG. 24. FIG. 24 illustrates an example of a command sequence in which the sequencers 36A and 36B asynchronously execute a read operation on the planes <0> and <1>. In FIG. 24, the order of the planes for which the read operation is instructed and the waveforms of the ready/busy signals RB corresponding to the sequencers are different from those of the command sequence described with reference to FIG. 14 in the first embodiment. In this example, reading first starts on the plane <1> and reading starts on the plane <0> during a period of the first reading.

Specifically, as illustrated in FIG. 24, the controller 20 issues the command "xxh" to transmit the command "xxh" to the semiconductor memory device 10. Thus, the second sequencer 36B transitions from the idle state to the active state. Then, the controller 20 transmits the command "00 h", the address information ADD for designating the plane <1>, and the command "30 h" sequentially to the semiconductor memory device 10. When the command "30 h" is stored in the register 35A, the second sequencer 36B starts the read operation on the plane <1> and the second sequencer 36B enters the busy state from the ready state. As illustrated, tRead1 indicates a period in which the second sequencer 36B executes the read operation on the plane <1>. During this period, the second sequencer 36B maintains the busy state.

Then, while the second sequencer 36B is executing the read operation on the plane <1>, the controller 20 transmits a command and address information for instructing the read operation on the plane <0>. Specifically, the controller 20 transmits the command "00 h", the address information ADD for designating the plane <0>, and the command "30 h" sequentially to the semiconductor memory device 10. Here, the commands "00 h" and "30 h" are stored in the second command register 35B via the input and output circuit 31 and the address information ADD is stored in the second address register 34B via the input and output circuit 31.

When the command "30 h" is stored in the register 35B, the first sequencer 36A starts the read operation on the plane <0> and the first sequencer 36A enters the busy state from the ready state. As illustrated, tRead2 indicates a period in which the first sequencer 36A executes the read operation on the plane <0>. During this period, the first sequencer 36A maintains the busy state. As illustrated, in the semiconductor memory device 10 in this example, there is a period in which both of the first sequencer 36A and the second sequencer 36B are in the busy state. An operation image of the sequencer module 36 and the CG driver module 39 during this period is illustrated in FIG. 25.

Figure 25:
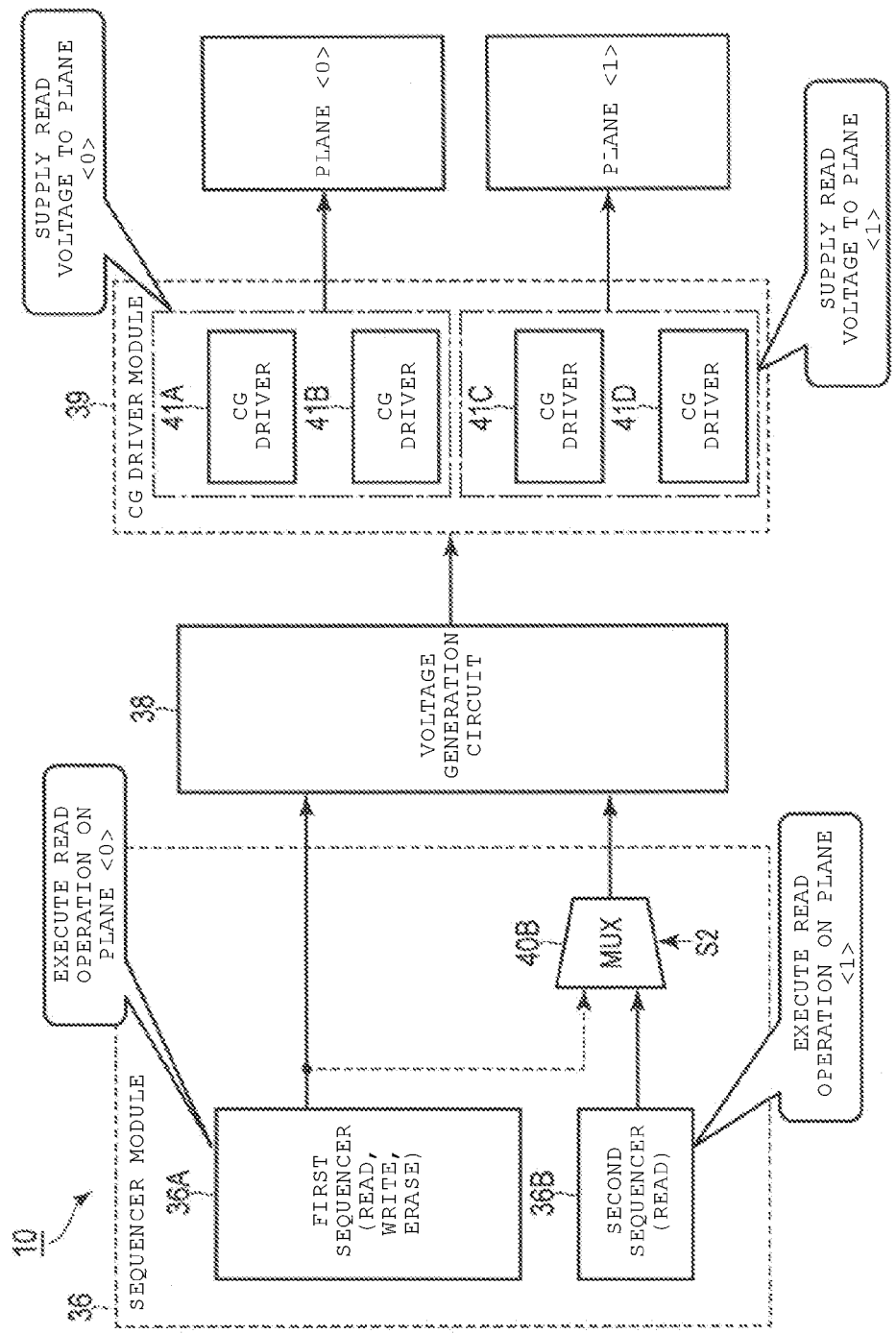
FIG. 25 is a diagram illustrating the read operation in the memory system according to the second embodiment.

As illustrated in FIG. 25, the sequencer module 36 controls the selection signal S2 such that a control signal of the second sequencer 36B is output to the multiplexer 40B. Then, the first sequencer 36A directly controls the plane <0> to execute the read operation and the second sequencer 36B controls the voltage generation circuit 38 and the plane <1> via the multiplexer 40B to execute the read operation. In this example, as illustrated, the CG drivers 41A and 41B supply a read voltage to the plane <0>, and the CG drivers 41C and 41D supply a read voltage to the plane <1>.

In the read operations by the sequencers 36A and 36B end, the sense amplifier modules 12A and 12B transmit the read data Dout to the controller 20 in the end in the order of the read operations. In the present embodiment, the second sequencer 36B maintains the active state while the semiconductor memory device 10 is executing the read operation, and transitions to the idle state when the read operation ends. The other remaining detailed operation is the same as the multi-plane read operation described in the section [1-2-3].

As described above, in the semiconductor memory device 10 according to the present embodiment, target plane on which each sequencer executes the read operation is fixed as in the single plane read operation described in the section [2-2-1] even when the asynchronous multi-plane read operation is executed. That is, in the asynchronous multi-plane read operation of the semiconductor memory device 10 according to the present embodiment, the second sequencer 36B enters the busy state earlier than the first sequencer 36A, as illustrated in FIG. 25.

[2-2-3] Another Operation

Figure 26:
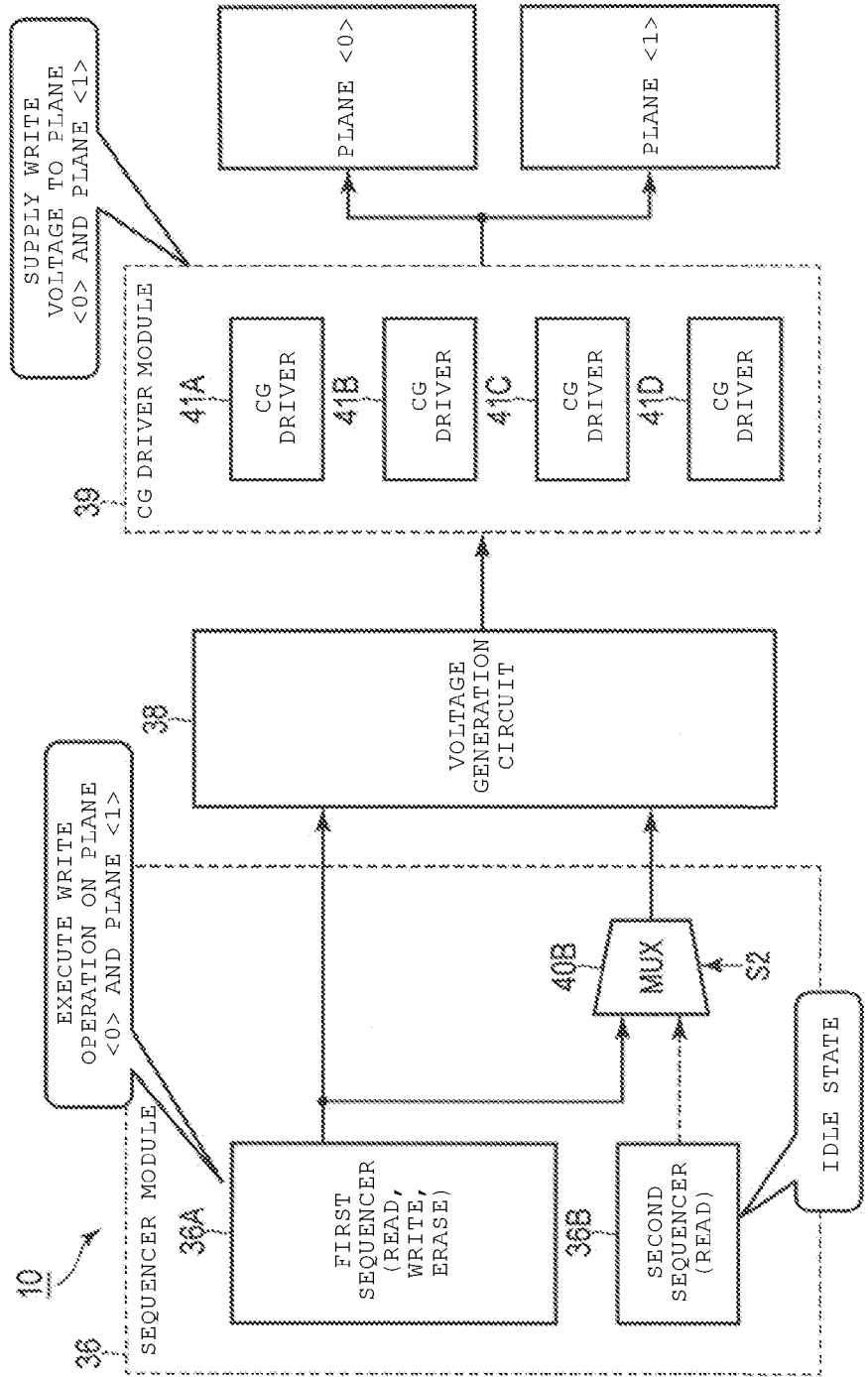
FIG. 26 is a diagram illustrating a write operation in the memory system according to the second embodiment.

Next, a multi-plane write operation will be described with reference to FIG. 26 as an example of another operation in the semiconductor memory device 10. FIG. 26 illustrates an operation image of the sequencer module 36 and the CG driver module 39 when the first sequencer 36A executes the synchronous write operation on the plane <0> and <1>. For example, the same command sequence as the command sequence described with reference to FIG. 15 in the first embodiment is used as the command sequence in this example.

As illustrated in FIG. 26, in synchronous the multi-plane write operation, the first sequencer 36A executes a write operation by directly controlling the plane <0> and controlling the plane <1> via the multiplexer 40B. During the write operation, the second sequencer 36B maintains the idle state. The second sequencer 36B also maintains the idle state similarly while the write operation or the erasing operation is executed on one of the planes.

In this example, as illustrated, the CG driver module 39 supplies a common write voltage to the planes <0> and <1>. The method of operating the CG driver module 39 is not limited thereto. For example, the CG drivers 41A and 41B may supply a write voltage to the plane <0> and the CG drivers 41C and 41D may supply a write voltage to the plane <1>. The other remaining detailed operation is the same as the multi-plane write operation described in the section [1-2-4].

As described above, in the semiconductor memory device 10 according to the present embodiment, the first sequencer 36A executes the multi-plane write operation. Similarly, even when another write operation, another erasing operation, or the like is executed, the first sequencer 36A executes various operations without regard to an operation target plane, as in the first embodiment.

[2-3] Advantages of Second Embodiment

In the semiconductor memory device 10 according to the second embodiment, it is possible to suppress a circuit area more than the first embodiment. Hereinafter, the details of the advantages will be described.

In the semiconductor memory device 10 according to the present embodiment, the number of multiplexers 40 included in the sequencer module 36 is smaller than that of the semiconductor memory device 10 according to the first embodiment. In addition, wires connecting the multiplexer 40A corresponding to the plane <0> in the first embodiment to the second sequencer 36B and the plane <0> are not needed.

That is, the first sequencer 36A can control the planes <0> and <1>. On the other hand, the second sequencer 36B can control the plane <1> and does not control the plane <0>. The semiconductor memory device 10 according to the present embodiment causes the first sequencer 36A and the second sequencer 36B to control the planes <0> and <1>, respectively, in the read operation.

Thus, the semiconductor memory device 10 according to the present embodiment can execute the asynchronous multi-plane read operation as in the first embodiment. In the semiconductor memory device 10 according to the present embodiment, the number of multiplexers 40 is reduced. Therefore, it is possible to reduce the circuit area more than in the semiconductor memory device 10 according to the first embodiment. Further, in the semiconductor memory device 10 according to the present embodiment, the number of multiplexers 40 is reduced, and thus a signal selection condition of the multiplexer 40 is simplified.

In the semiconductor memory device 10 according to the present embodiment, the second sequencer 36B is considered to be in the active state when the read operation is executed, and is considered to be in the idle state during an operation such as the write operation or the erasing operation other than the read operation. During various operations of the semiconductor memory device 10 according to the present embodiment, the operation states of the first sequencer 36A and the second sequencer 36B are operations illustrated in, for example, FIG. 27.

Figure 27:
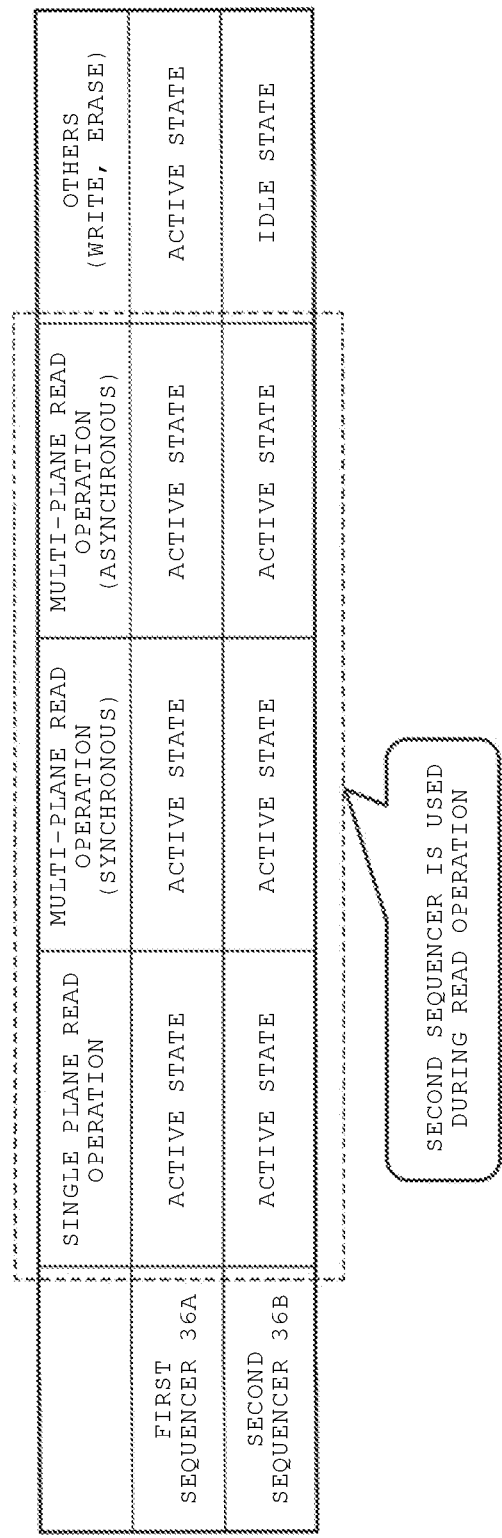
FIG. 27 is a diagram illustrating the state of a sequencer in various operations of the memory system according to the second embodiment.

As illustrated in FIG. 27, the second sequencer 36B is in the active state also in the single plane read operation and the multi-plane read operation synchronized in the plurality of planes even with respect to FIG. 15 described in the first embodiment. That is, in the semiconductor memory device 10 according to the present embodiment, the second sequencer 36B is always in the active state in the read operation. Therefore, the advantage of suppressing the power consumption is less than in the memory system 1 according to the first embodiment.

[3] Third Embodiment

Next, a semiconductor memory device 10 and a memory system 1 according to a third embodiment will be described. In the third embodiment, a voltage generation circuit corresponding to a second sequencer 36B is provided in the semiconductor memory device 10 described in the first embodiment. Hereinafter, differences from the first and second embodiments will be described.

[3-1] Configuration of Semiconductor Memory Device 10

Figure 28:
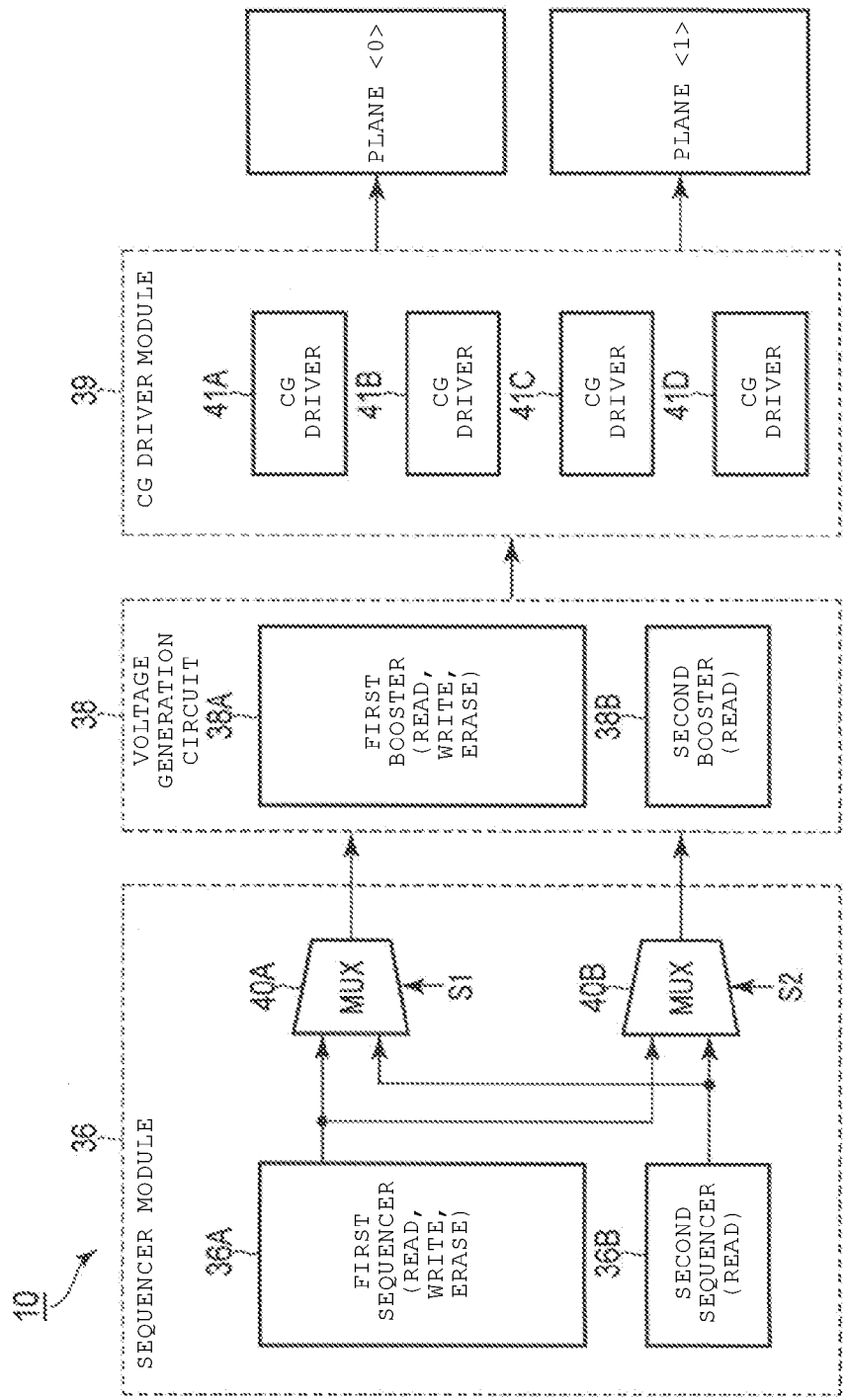
FIG. 28 is a block diagram illustrating a semiconductor memory device according to a third embodiment.

First, the configuration of the semiconductor memory device 10 will be described with reference to FIG. 28. FIG. 28 is a block diagram illustrating the semiconductor memory device 10 according to the present embodiment and is different from FIG. 4 described in the first embodiment in that the voltage generation circuit 38 includes a booster corresponding to each sequencer 36. Specifically, as illustrated in FIG. 28, the voltage generation circuit 38 includes a first booster 38A and a second booster 38B.

The first booster 38A can generate voltages used in various operations such as read operation, a write operation, and an erasing operation and is controlled by the first sequencer 36A. The second booster 38B can generate, for example, a voltage used in a read operation and is controlled by the second sequencer 36B. The other remaining configuration is the same as that of the first embodiment, and thus the other remaining configuration will not be described.

[3-2] Operations

[3-2-1] Single Plane Read Operation

Figure 29:
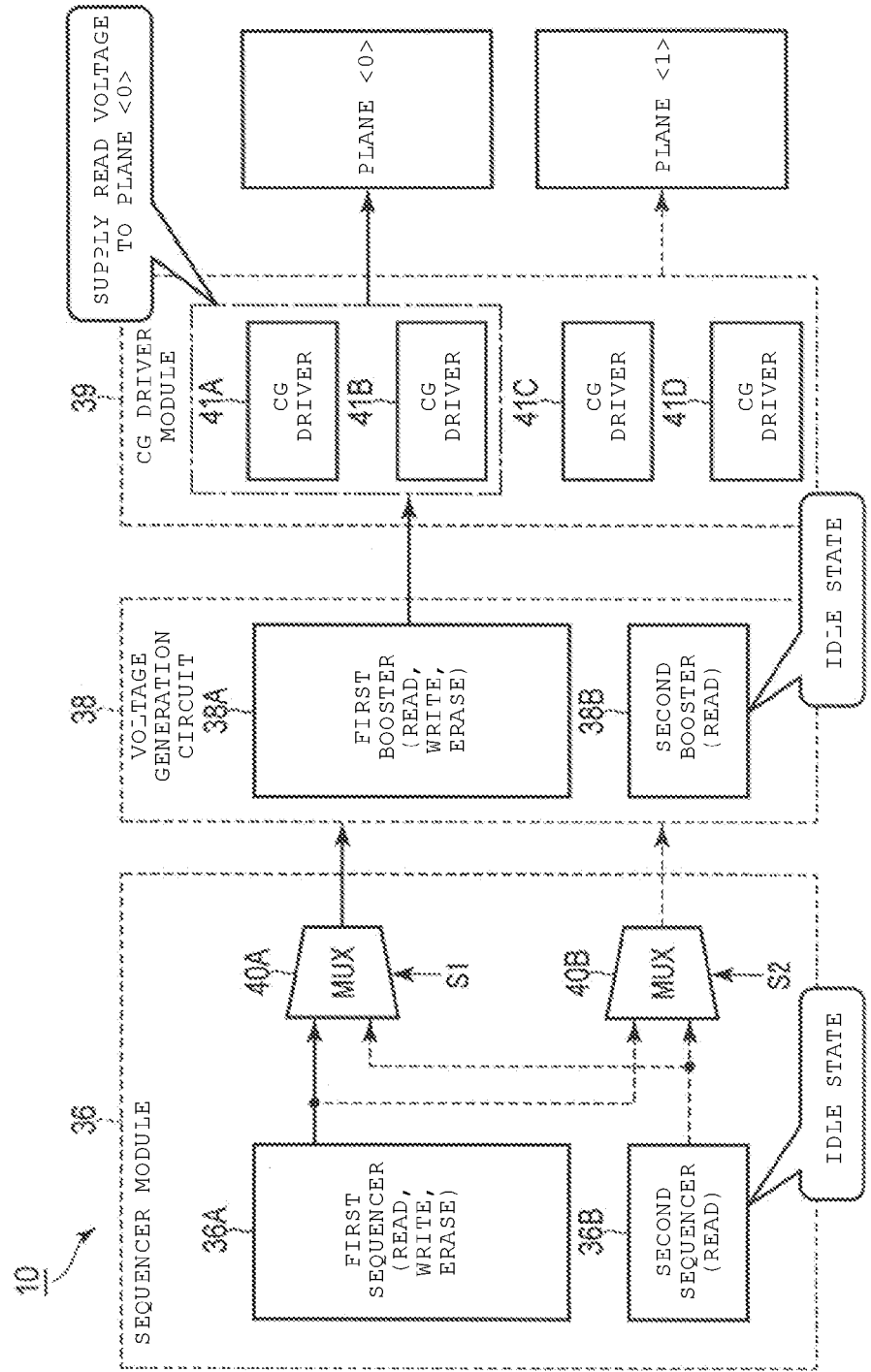
FIG. 29 is a diagram illustrating a read operation in the memory system according to the third embodiment.

Next, a single plane read operation in the semiconductor memory device 10 will be described with reference to FIG. 29. FIG. 29 illustrates an operation image of the sequencer module 36 and the CG driver module 39 when the first sequencer 36A executes a read operation on the plane <0>. For example, the same command sequence as the command sequence described with reference to FIG. 5 in the first embodiment is used as a command sequence in this example.

As illustrated in FIG. 29, in the read operation of the single plane on the plane <0>, the first sequencer 36A controls the plane <0> via the multiplexer 40A. Then, the first booster 38A of the voltage generation circuit 38 generates a voltage based on the control of the first sequencer 36A, and the CG drivers 41A and 41B of the CG driver module 39 generate various voltages necessary for a read operation from the voltage and supply the voltages to the row decoder 13A of the plane <0>. In the read operation, the second sequencer 36B and the second booster 38B maintain the idle state, and thus power consumption therein is suppressed. The other remaining detailed operation is the same as that of the single plane read operation described in the section [1-2-1].

In the read operation of the single plane on the plane <1>, the first sequencer 36A and the first booster 38A are similarly used to execute the read operation, and the second sequencer 36B and the second booster 38B maintain the idle state.

[3-2-2] Multi-Plane Read Operation (Asynchronous)

Figure 30:
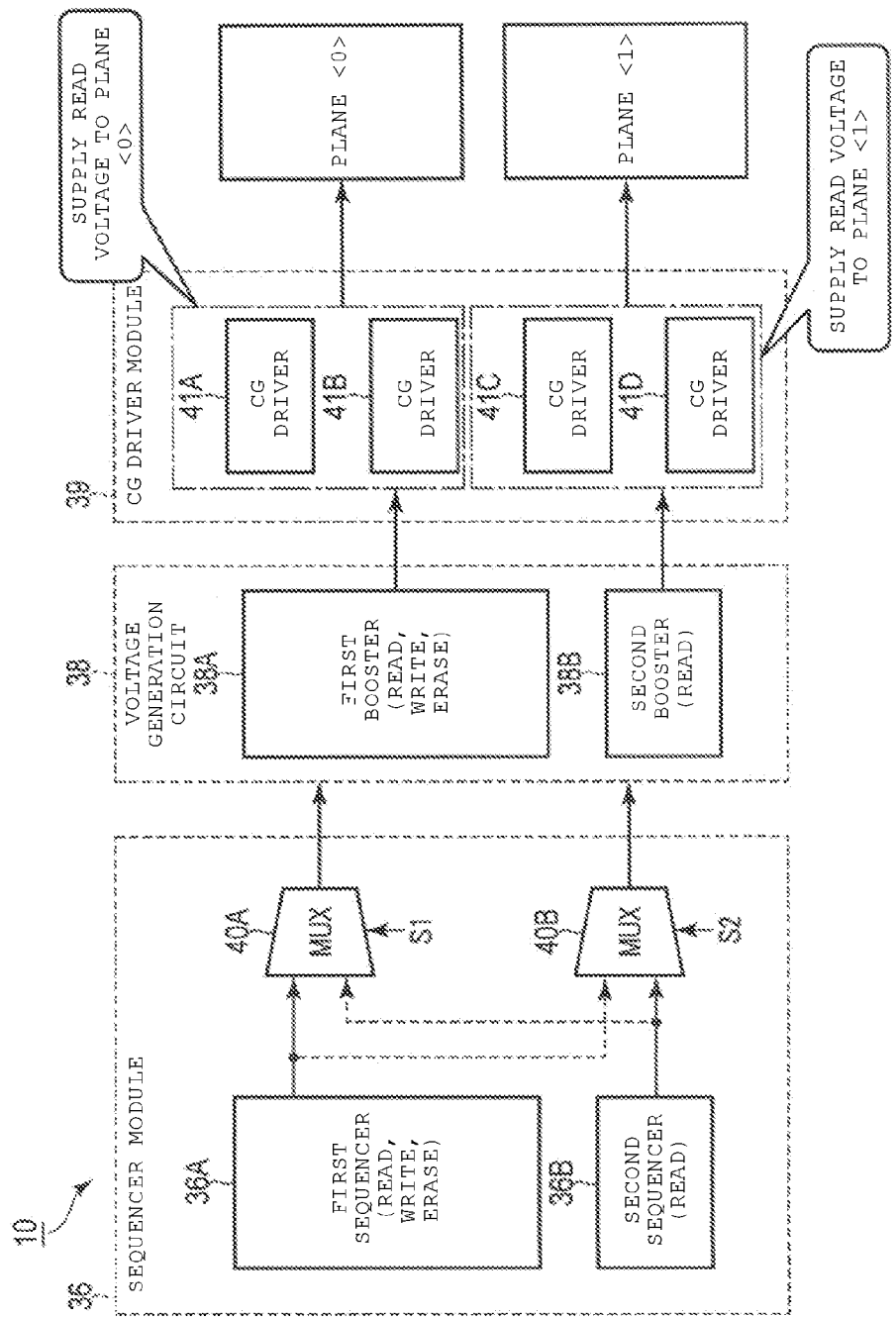
FIG. 30 is a diagram illustrating the read operation in the memory system according to the third embodiment.

Next, an asynchronous multi-plane read operation in the semiconductor memory device 10 will be described with reference to FIG. 30. FIG. 30 illustrates an operation image of the sequencer module 36 and the CG driver module 39 when the first sequencer 36A and the second sequencer 36B execute the asynchronous read operation on the plane <0> and <1>, respectively. For example, the same command sequence as the command sequence described with reference to FIG. 10 in the first embodiment is used as the command sequence in this example.

As illustrated in FIG. 30, in the asynchronous multi-plane read operation on the planes <0> and <1>, the first sequencer 36A controls the plane <0> via the multiplexer 40A and the second sequencer 36B controls the plane <1> via the multiplexer 40B. Then, the first booster 38A generates a voltage based on the control of the first sequencer 36A and the second booster 38B generates a voltage based on the control of the second sequencer 36B. Then, the CG drivers 41A and 41B of the CG driver module 39 select various voltages necessary in the read operation from the voltage generated by the first booster 38A and transmit the voltages to the row decoder 13A of the plane <0>. On the other hand, the CG drivers 41C and 41D of the CG driver module 39 select various voltages necessary in the read operation from the voltage generated by the second booster 38B and transmit the voltages to the row decoder 13A of the plane <1>. The other remaining detailed operation is the same as the asynchronous multi-plane read operation described in the section [1-2-3].

[3-2-3] Another Operation

Figure 31:
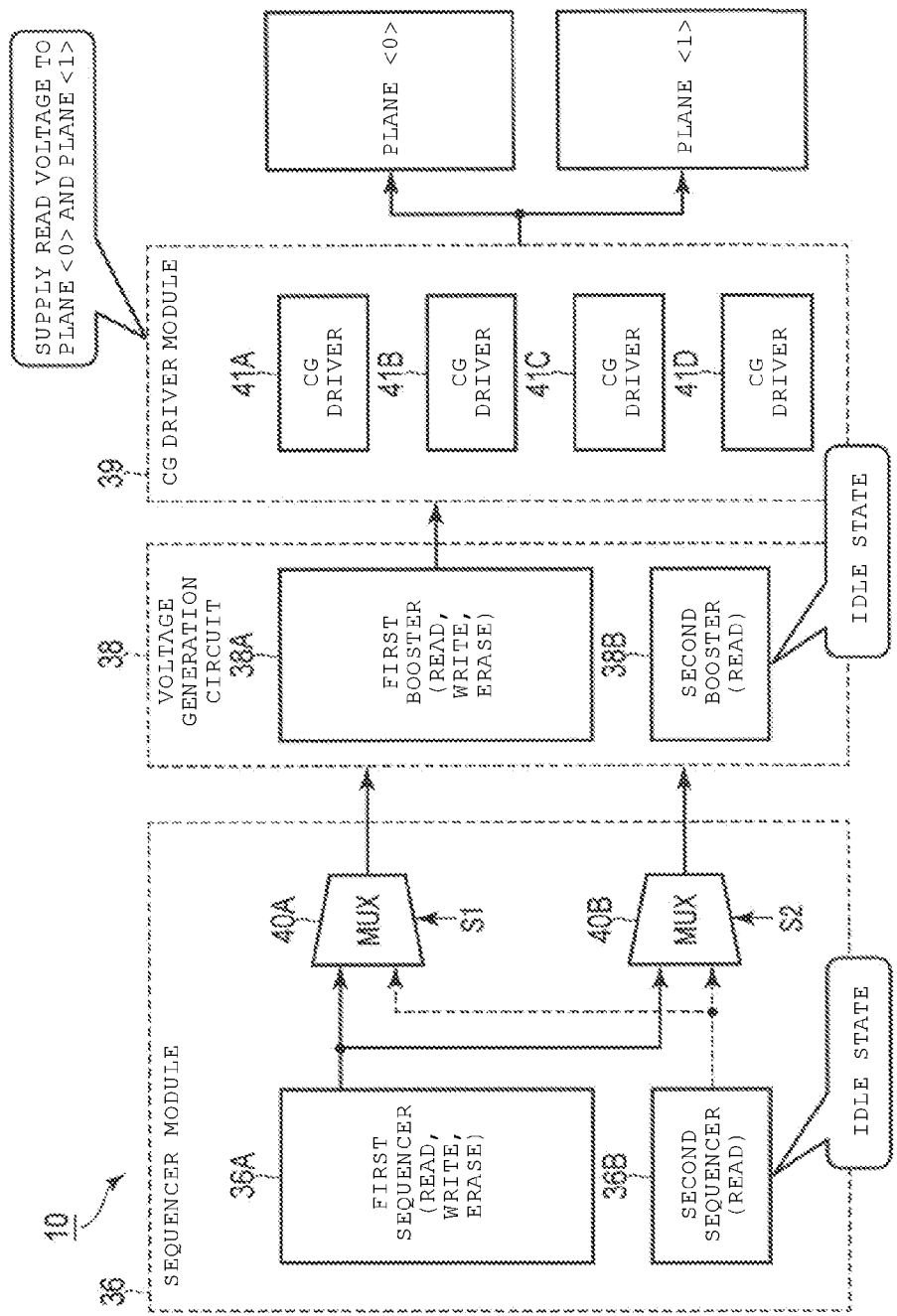
FIG. 31 is a diagram illustrating a write operation in the memory system according to the third embodiment.

Next, a synchronous multi-plane write operation will be described with reference to FIG. 31 as an example of another operation in the semiconductor memory device 10. FIG. 31 illustrates an operation image of the sequencer module 36 and the CG driver module 39 when the first sequencer 36A executes the synchronous write operation on the plane <0> and <1>. For example, the same command sequence as the command sequence described with reference to FIG. 15 in the first embodiment is used as the command sequence in this example.

As illustrated in FIG. 31, in the multi-plane write operation on the planes <0> and <1>, the first sequencer 36A controls the planes <0> and <1> via the multiplexers 40A and 40B, respectively. Then, the first booster 38A of the voltage generation circuit 38 generates a voltage based on the control of the first sequencer 36A, and the CG driver module 39 selects various voltages necessary in the write operation from the voltage and transmits the voltages to the row decoder 13A of the plane <0> and the row decoder 13B of the plane <1>.

In the write operation, the second sequencer 36B and the second booster 38B maintain the idle state, and thus power consumption therein is suppressed. The other remaining detailed operation is the same as the multi-plane write operation described in the section [1-2-4].

In the example described above, the multi-plane write operation is executed as the other operation of the semiconductor memory device 10, but an exemplary embodiment is not limited thereto. For example, even when the first sequencer 36A executes the synchronous multi-plane read operation, the single plane write operation, the erasing operation, and the like, the second sequencer 36B and the second booster 38B similarly maintain the idle state.

[3-3] Advantages of Third Embodiment

In the semiconductor memory device 10 according to the third embodiment, it is possible to suppress power consumption more than that according to the first embodiment. Hereinafter, the details of the advantages will be described.

In the semiconductor memory device 10 according to the present embodiment, the voltage generation circuit 38 includes the plurality of boosters, as compared to the semiconductor memory device 10 according to the first embodiment. Specifically, the voltage generation circuit 38 includes the first booster 38A corresponding to the first sequencer 36A and the second booster 38B corresponding to the second sequencer 36B. The first booster 38A and the second booster 38B can generate voltages necessary in operations of the corresponding sequencers.

In the semiconductor memory device 10, when the second sequencer 36B is in the idle state while the first sequencer 36A is executing various operations using the first booster 38A, the second booster 38B is also considered to be idle state. On the other hand, when the asynchronous multi-plane operation is executed and the second sequencer 36B enters the active state, the second booster 38B is considered to be in the active state. Thus, the second sequencer 36B can execute the read operation using the second booster 38B.

As described above, in the semiconductor memory device 10 according to the present embodiment, the second booster 38B corresponding to the second sequencer 36B transitions to the idle state or the active state in tandem with the second sequencer 36B. Thus, in the semiconductor memory device 10 according to the present embodiment, a part of the voltage generation circuit 38 not used can be in the idle state and power consumption therein can be suppressed. Therefore, it is possible to suppress power consumption more than in the first embodiment.

In the example described above, the second booster 38B can execute the read operation, but an exemplary embodiment is not limited thereto. For example, when the second sequencer 36B can execute the write operation or the erasing operation, the second booster 38B is accordingly configured to be able to generate a voltage necessary in the write operation or the erasing operation.

[4] Fourth Embodiment

Next, a semiconductor memory device 10 and a memory system 1 according to a fourth embodiment will be described. In the fourth embodiment, one plane is added to the semiconductor memory device 10 described in the first embodiment. Hereinafter, differences from the first to third embodiments will be described.

[4-1] Configuration of Semiconductor Memory Device 10

Figure 32:
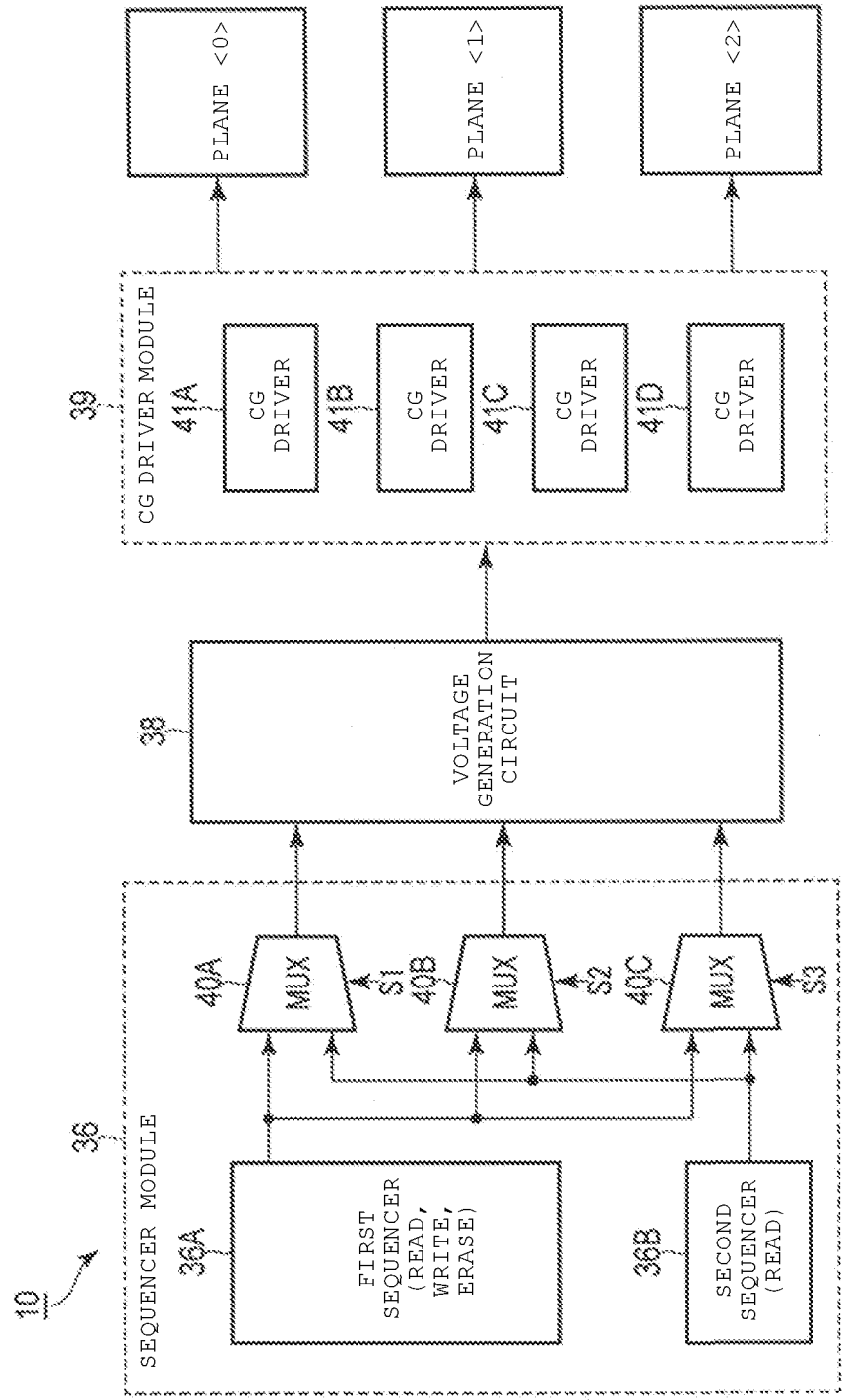
FIG. 32 is a block diagram illustrating a semiconductor memory device according to a fourth embodiment.

First, the configuration of the semiconductor memory device 10 will be described with reference to FIG. 32. FIG. 32 is a block diagram illustrating the semiconductor memory device 10 according to the present embodiment and is different from FIG. 4 described in the first embodiment in that one plane is added. Specifically, as illustrated in FIG. 32, the semiconductor memory device 10 further includes a plane <2>. Accordingly, the sequencer module 36 further includes a multiplexer 40C corresponding to the plane <2>.

The multiplexer 40C outputs one signal selected from a plurality of input signals based on a selection signal S3. Control signals of the first sequencer 36A and the second sequencer 36B are input to an input terminal of the multiplexer 40C. The multiplexer 40C outputs one of the control signals of the first sequencer 36A and the second sequencer 36B to various circuits of the plane <2>, the voltage generation circuit 38, and the CG driver module 39. The other remaining configuration of the semiconductor memory device 10 is the same as that of the first embodiment, and thus the other remaining configuration will not be described.

[4-2] Operation of Memory System 1

Figure 33:
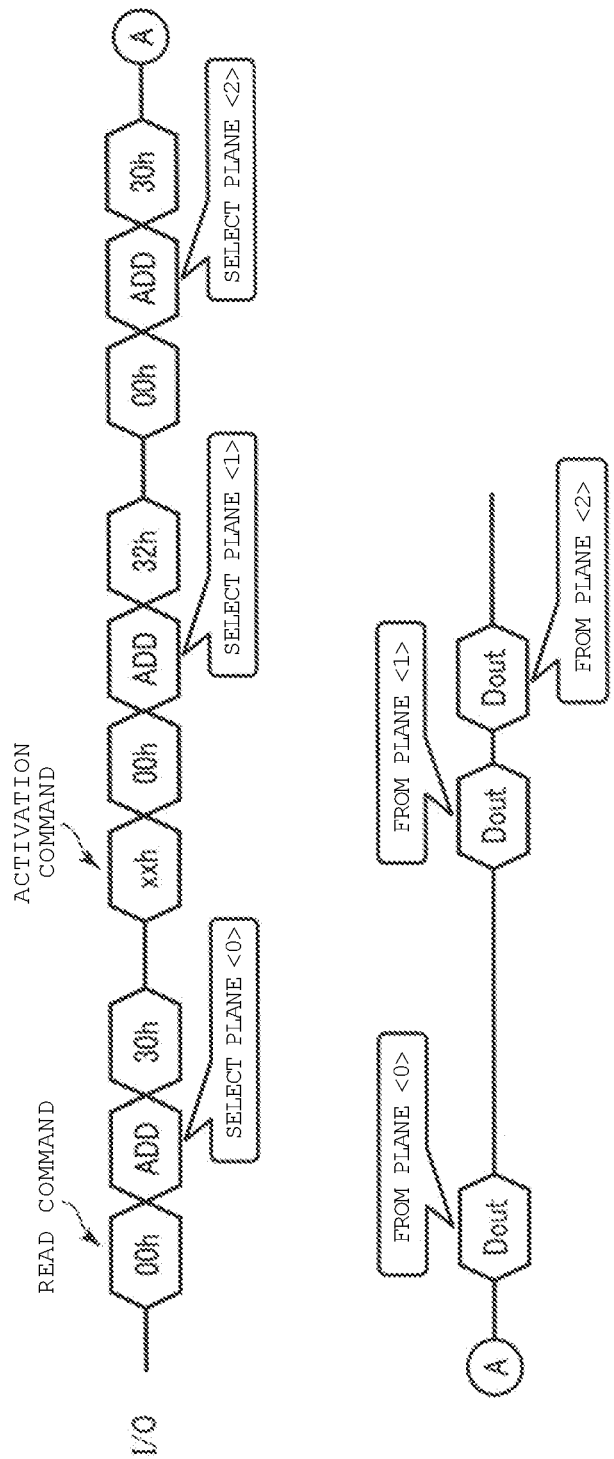
FIG. 33 is a diagram illustrating a command sequence of a read operation in the memory system according to the fourth embodiment.

Next, an example in which a single plane read operation and a multi-plane read operation are asynchronously executed will be described as an example of an operation of the semiconductor memory device 10 with reference to FIG. 33. FIG. 33 illustrates an example of a command sequence in which the second sequencer 36B starts a synchronous multi-plane read operation on the planes <1> and <2> while the first sequencer 36A is executing a single plane read operation on the plane <0>. FIG. 33 illustrates an input and output signal I/O transmitted and received by the semiconductor memory device 10.

As illustrated in FIG. 33, the controller 20 first transmits the command "00 h", the address information ADD for designating the plane <0>, and the command "30 h" sequentially to the semiconductor memory device 10. When the command "30 h" is stored in the register 35A, the first sequencer 36A starts the read operation on the plane <0>.

While the first sequencer 36A is executing the read operation, the controller 20 issues an activation command "xxh" to transmit the activation command "xxh" to the semiconductor memory device 10 sequentially to execute the read operation on other planes. Thus, the second sequencer 36B transitions from the idle state to the active state. An issuing timing of the activation command "xxh" is not limited thereto, but may be earlier than a timing at which the read operation is desired to be executed in regard to the second sequencer 36B.

Next, the controller 20 instructs the semiconductor memory device 10 to execute the synchronous read operation on the planes <1> and <2>. Specifically, the controller 20 transmits the command "00 h", the address information ADD for designating the plane <1>, and the command "32 h" sequentially to the semiconductor memory device 10. When the semiconductor memory device 10 receiving the commands and the address information can receive commands again, the controller 20 transmits the command "00 h", the address information ADD for designating the plane <2>, and the command "30 h" sequentially to the semiconductor memory device 10.

When the command "30 h" is stored in the register 35B, the second sequencer 36B starts a multi-plane read operation based on a command set including an instruction for the plane <1> and the command "32 h" and a command set including an instruction for the plane <2> and the command "30 h".

Figure 34:
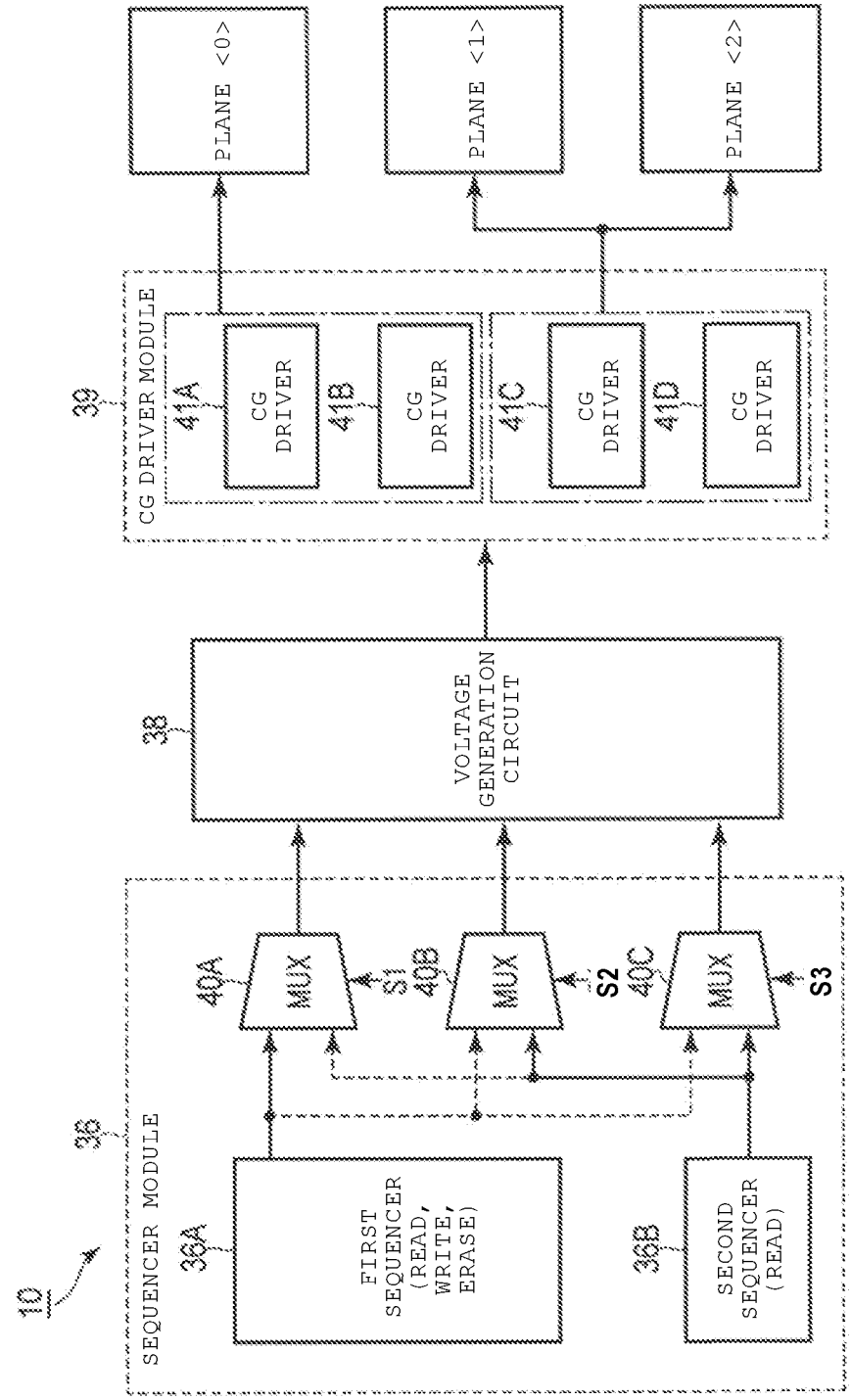
FIG. 34 is a diagram illustrating the read operation in the memory system according to the fourth embodiment.

An operation image of the sequencer module 36 and the CG driver module 39 when the first sequencer 36A and the second sequencer 36B described above execute the read operation is illustrated in FIG. 34. As illustrated in FIG. 34, the sequencer module 36 controls the selection signal S1 such that a control signal of the first sequencer 36A is output to the multiplexer 40A and controls the selection signals S2 and S3 such that control signals of the second sequencer 36B are output to the multiplexers 40B and 40C. Thus, the semiconductor memory device 10 can execute the single plane read operation on the plane <0> by the first sequencer 36A and the multi-plane read operation synchronized in the planes <1> and <2> by the second sequencer 36B. In this example, as illustrated, the CG drivers 41A and 41B supply write voltages to the plane <0> and the CG drivers 41C and 41D supply read voltages to the planes <1> and <2>.

When the read operation by the sequencers ends, the semiconductor memory device 10 transmits the read data Dout to the controller 20 in order in which the executed read operations end. In this example, the read data Dout is output in order of the planes <0>, <1>, and <2>.

As described above, when the semiconductor memory device 10 includes three planes, the semiconductor memory device 10 can asynchronously execute two operations using the first sequencer 36A and the second sequencer 36B.

In the example described above, a combination of the single plane read operation and the multi-plane read operation is asynchronously executed, but an exemplary embodiment is not limited thereto. For example, while the first sequencer 36A is executing the multi-plane operation on two planes, the second sequencer 36B may execute the single plane read operation on the remaining plane. The first sequencer 36A and the second sequencer 36B may asynchronously execute the single plane read operation, or the second sequencer 36B may execute the single plane read operation while the first sequencer 36A is executing the single plane write operation. In this way, many variations of the operation of the semiconductor memory device 10 according to the present embodiment can be considered in accordance with the operations which can be executed by the first sequencer 36A and the second sequencer 36B.

[4-3] Advantages of Fourth Embodiment

In the semiconductor memory device 10 according to the fourth embodiment, it is possible to obtain the same advantages as those of the first embodiment even in the semiconductor memory device 10 including three or more planes. Hereinafter, the details of the advantages will be described.

In the semiconductor memory device 10 according to the present embodiment, the plane <2> is added to the semiconductor memory device 10 according to the first embodiment. In the semiconductor memory device 10 according to the present embodiment, the sequencer module 36 includes the multiplexer 40C to correspond to the plane <2>. Thus, the semiconductor memory device 10 according to the present embodiment can use the second sequencer 36B to execute the read operation on the plane on which the first sequencer 36A does not execute various operations.

As described above, in the semiconductor memory device 10 according to the present embodiment, the multiplexer 40 is provided to correspond to the number of planes included in the semiconductor memory device 10, and thus the same operation as that of the first embodiment can be executed. That is, the semiconductor memory device 10 according to the present embodiment can obtain the same advantages as those of the first embodiment.

[5] Fifth Embodiment

Next, a semiconductor memory device 10 and a memory system 1 according to a fifth embodiment will be described. In the fifth embodiment, one sequencer is added to the semiconductor memory device 10 described in the fourth embodiment so that the number of sequencers is the same as the number of planes. Hereinafter, differences from the first to fourth embodiments will be described.

[5-1] Configuration of Semiconductor Memory Device 10

Figure 35:
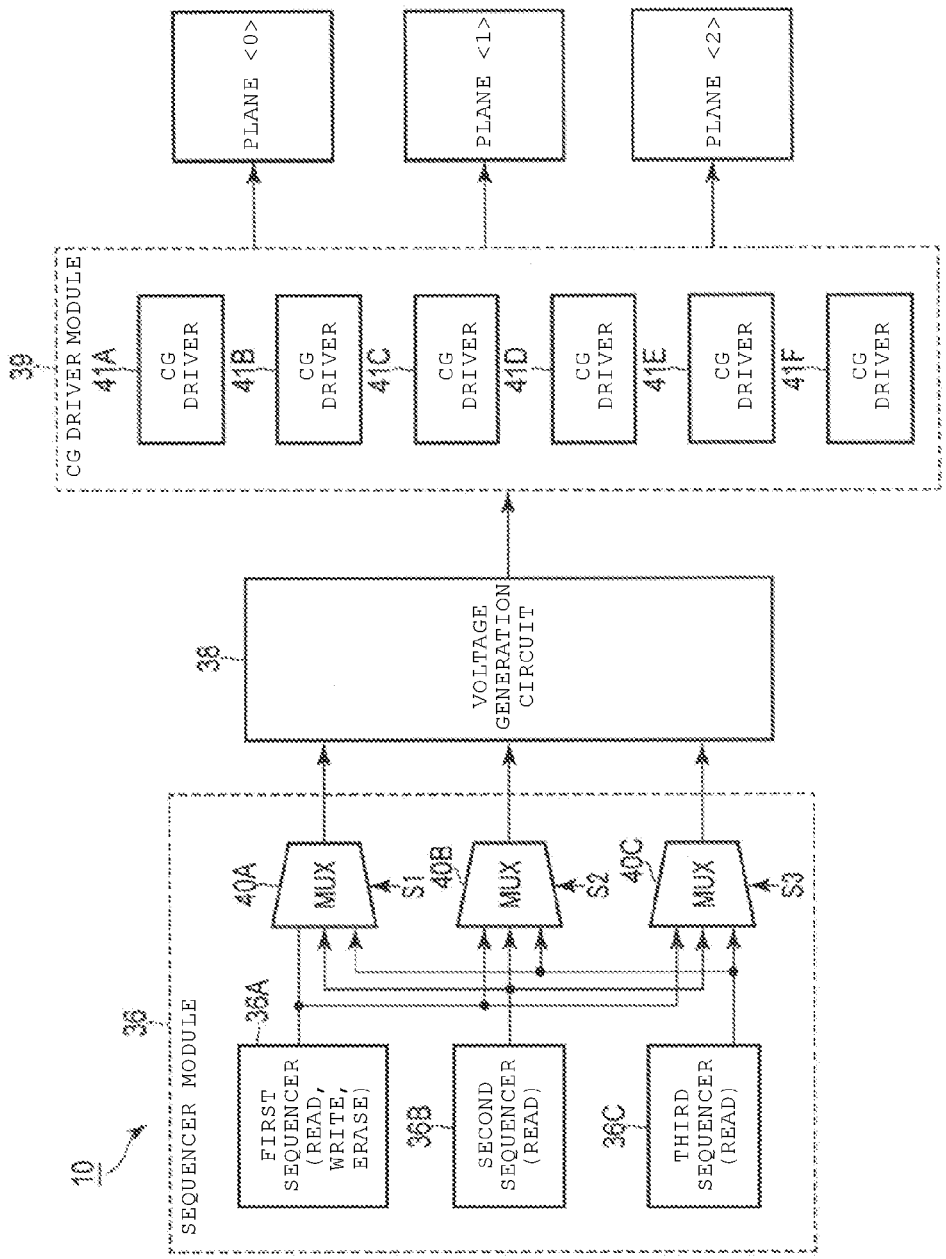
FIG. 35 is a block diagram illustrating a semiconductor memory device according to a fifth embodiment.

First, the configuration of the semiconductor memory device 10 will be described with reference to FIG. 35. FIG. 35 is a block diagram illustrating the semiconductor memory device 10 according to the present embodiment and is different from FIG. 32 described in the fourth embodiment in that a third sequencer is added. Specifically, as illustrated in FIG. 35, the sequencer module 36 further includes a third sequencer 36C. Accordingly, the CG driver module 39 further includes CG drivers 41E and 41F.

The third sequencer 36C can execute, for example, a read operation and is connected to input terminals of the multiplexers 40A, 40B, and 40C. Then, the third sequencer 36C controls the planes <0>, <1>, and <2> via the multiplexers 40A, 40B, and 40C, respectively. The semiconductor memory device 10 according to the present embodiment also includes a status register, an address register, and a command register (none of which is illustrated) corresponding to the third sequencer 36C.

The configuration of the CG driver 41E and 41F is the same as that of the other CG drivers 41A, 41B, 41C, and 41D. The CG driver module 39 includes the CG drivers 41E and 41F, and thus can transmit more kinds of voltages than the CG driver module 39 in the first to fourth embodiments to the row decoder 13. The other remaining configuration of the semiconductor memory device 10 is the same as that of the fourth embodiment, and thus the other remaining configuration will not be described.

[5-2] Operation of Memory System 1

Figure 36:
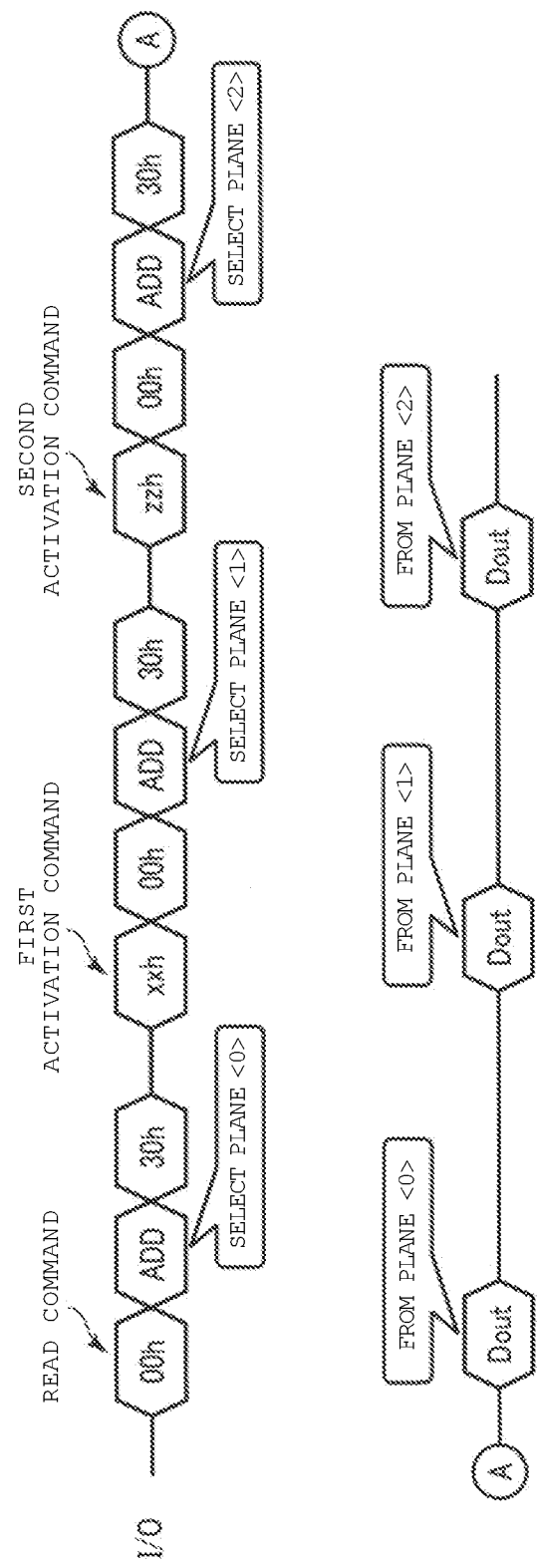
FIG. 36 is a diagram illustrating a command sequence of a read operation in the memory system according to the fifth embodiment.

Next, an asynchronous multi-plane read operation on three planes will be described as an example of the operation of the semiconductor memory device 10 with reference to FIG. 36. FIG. 36 illustrates an example of a command sequencer in which the sequencers 36A, 36B, and 36C execute the asynchronous read operation on the planes <0>, <1>, and <2>, respectively. FIG. 36 illustrates an input and output signal I/O transmitted and received by the semiconductor memory device 10. In this example, the reading on the plane <0> first starts and the reading on the plane <1> starts during a period of the reading. An example in which a read operation on the plane <2> starts while a read operation on the planes <0> and <1> is being executed will be described.

As illustrated in FIG. 36, the controller 20 first transmits the command "00 h", the address information ADD for designating the plane <0>, and the command "30 h" sequentially to the semiconductor memory device 10. When the command "30 h" is stored in the register 35A, the first sequencer 36A starts the read operation on the plane <0>.

Next, while the first sequencer 36A is executing the read operation, the controller 20 issues a first activation command "xxh" to transmit the first activation command "xxh" to the semiconductor memory device 10 sequentially to execute the read operation on other planes. Thus, the second sequencer 36B transitions from the idle state to the active state.

Next, the controller 20 transmits the command "00 h", the address information ADD for designating the plane <1>, and the command "30 h" sequentially to the semiconductor memory device 10. When the command "30 h" is stored in the register 35B, the second sequencer 36B starts the read operation on the plane <1>.

Next, while the first sequencer 36A and the second sequencer 36B are executing the read operation, the controller 20 issues a second activation command "zzh" to transmit the second activation command "zzh" to the semiconductor memory device 10 in order to execute a read operation on another plane. The command "zzh" is used for transitioning the third sequencer 36C in the idle state to the active state. Thus, the third sequencer 36C transitions from the idle state to the active state.

Next, the controller 20 transmits the command "00 h", the address information ADD for designating the plane <2>, the command "30 h" sequentially to the semiconductor memory device 10. The commands "00 h" and "30 h" are stored in the command register corresponding to the third sequencer 36C and the address information ADD is stored in the address register corresponding to the third sequencer 36C. When the command "30 h" is stored in the command register corresponding to the third sequencer 36C, the second sequencer 36B starts the read operation on the plane <2>.

Figure 37:
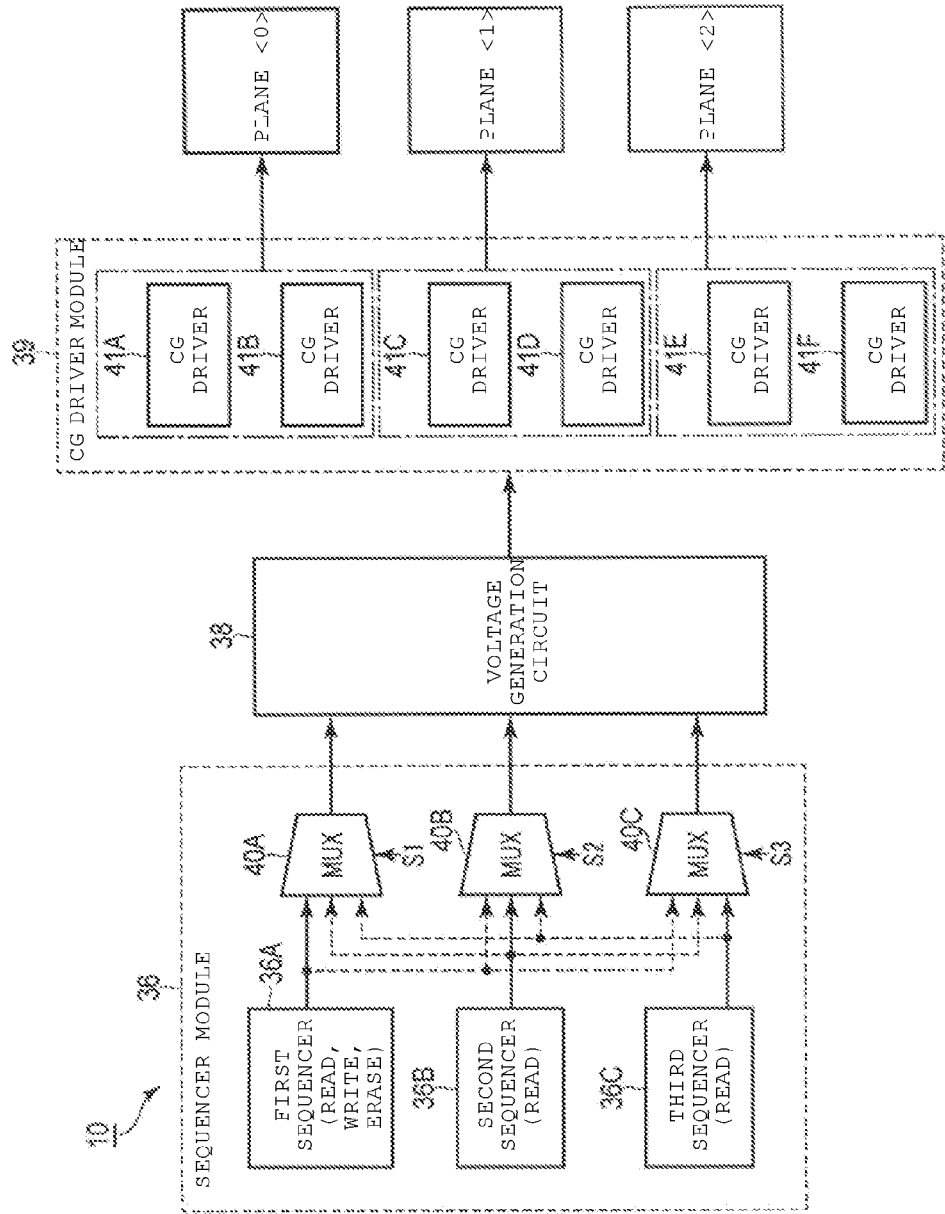
FIG. 37 is a diagram illustrating the read operation in the memory system according to the fifth embodiment.

An operation image of the sequencer module 36 and the CG driver module 39 when the read operation by the above-described sequencers 36A, 36B, and 36C is executed is illustrated in FIG. 37. As illustrated in FIG. 37, the sequencer module 36 causes the multiplexer 40A to output a control signal of the first sequencer 36A, causes the multiplexer 40B to output a control signal of the second sequencer 36B, and causes the multiplexer 40C to output a control signal of the third sequencer 36C by controlling the selection signals S1, S2, and S3.

Thus, the semiconductor memory device 10 can execute the read operation on the plane <0> by the first sequencer 36A, the read operation on the plane <1> by the second sequencer 36B, and the read operation on the plane <2> by the third sequencer 36C in parallel.

In this example, as illustrated, the CG drivers 41A and 41B supply a write voltage to the plane <0>, the CG drivers 41C and 41D supply a read voltage to the plane <1>, and the CG drivers 41E and 41F supply a read voltage to the plane <2>.

When the read operation ends in each sequencer, the semiconductor memory device 10 transmits the read data Dout to the controller 20 in order in which the executed read operation ends. In this example, the read data Dout is output in the order of the planes <0>, <1>, and <2>.

As described above, when the semiconductor memory device 10 includes three planes, the semiconductor memory device 10 can asynchronously execute three operations by using the first sequencer 36A, the second sequencer 36B, and the third sequencer 36C.

The above-described operations are merely examples, and the control signals output to the multiplexers 40 by the sequencer module 36 are changed based on the target planes on which the sequencers 36A, 36B, and 36C execute operations.

[5-3] Advantages of Fifth Embodiment

In the semiconductor memory device 10 according to the fifth embodiment, an operation speed can be improved in the semiconductor memory device 10 including three or more planes. Hereinafter, the details of the advantages will be described.

In the semiconductor memory device 10 according to the present embodiment, a third sequencer 36C is added to the semiconductor memory device 10 according to the fourth embodiment. The third sequencer 36C controls the planes <0>, <1>, and <2> via the multiplexers 40A, 40B, and 40C. Thus, the semiconductor memory device 10 according to the present embodiment can asynchronously execute the read operations on the three planes.

Specifically, when the first sequencer 36A is in the busy state, the semiconductor memory device 10 executes a read operation using the second sequencer 36B. Further, when the first sequencer 36A and the second sequencer 36B are in the busy state, the semiconductor memory device 10 executes a read operation using the third sequencer 36C.

In this way, the semiconductor memory device 10 according to the present embodiment can execute the asynchronous multi-plane operation on three planes by matching the number of planes included in the semiconductor memory device 10 with the number of sequencers. Thus, in the memory system 1 according to the present embodiment, an operation speed can be improved as in the first embodiment.

In the memory system 1 according to the present embodiment, in the semiconductor memory device 10, the third sequencer 36C transitions to the idle state while the first sequencer 36A and the second sequencer 36B are executing various operations. The third sequencer 36C in the idle state is activated when the asynchronous multi-plane read operation on three planes is necessary.

Specifically, when the semiconductor memory device 10 receives such an activation command from the controller 20, the third sequencer 36C transitions from the idle state to the active state. The activation command used here is different from the activation command for activating the second sequencer 36B. When the second sequencer 36B enters the active state, the semiconductor memory device 10 can execute the asynchronous multi-plane read operation on the three planes.

As described above, in the semiconductor memory device 10 according to the present embodiment, the third sequencer 36C enters the idle state while the first sequencer 36A and the second sequencer 36B are executing various operations, and the third sequencer 36C enters the active state when the asynchronous multi-plane read operation on the three planes is executed. Thus, in the memory system 1 according to the present embodiment, it is possible to suppress power consumption as in the first embodiment.

In the example described in the present embodiment, the number of planes included in the semiconductor memory device 10 is three, but an exemplary embodiment is not limited thereto. For example, the semiconductor memory device 10 may include four or more planes. In such a case, when the sequencer module 36 includes the number of sequencers corresponding to the number of planes, it is possible to execute the asynchronous multi-plane read operation on the plurality of planes.

In the example described in the present embodiment, the activation command to activate the third sequencer 36C is different from the activation command to activate the second sequencer 36B, but an exemplary embodiment is not limited thereto. For example, an activation command to activate the second sequencer 36B may be received and the sequencers 36B and 36C can be simultaneously activated.

[6] Sixth Embodiment

Next, a semiconductor memory device 10 and a memory system 1 according to a sixth embodiment will be described. In the sixth embodiment, one ready/busy signal output to the controller 20 by the semiconductor memory device 10 described in the foregoing first embodiment is set. Hereinafter, differences from the first to fifth embodiments will be described.

[6-1] Configuration of Semiconductor Memory Device 10

Figure 38:
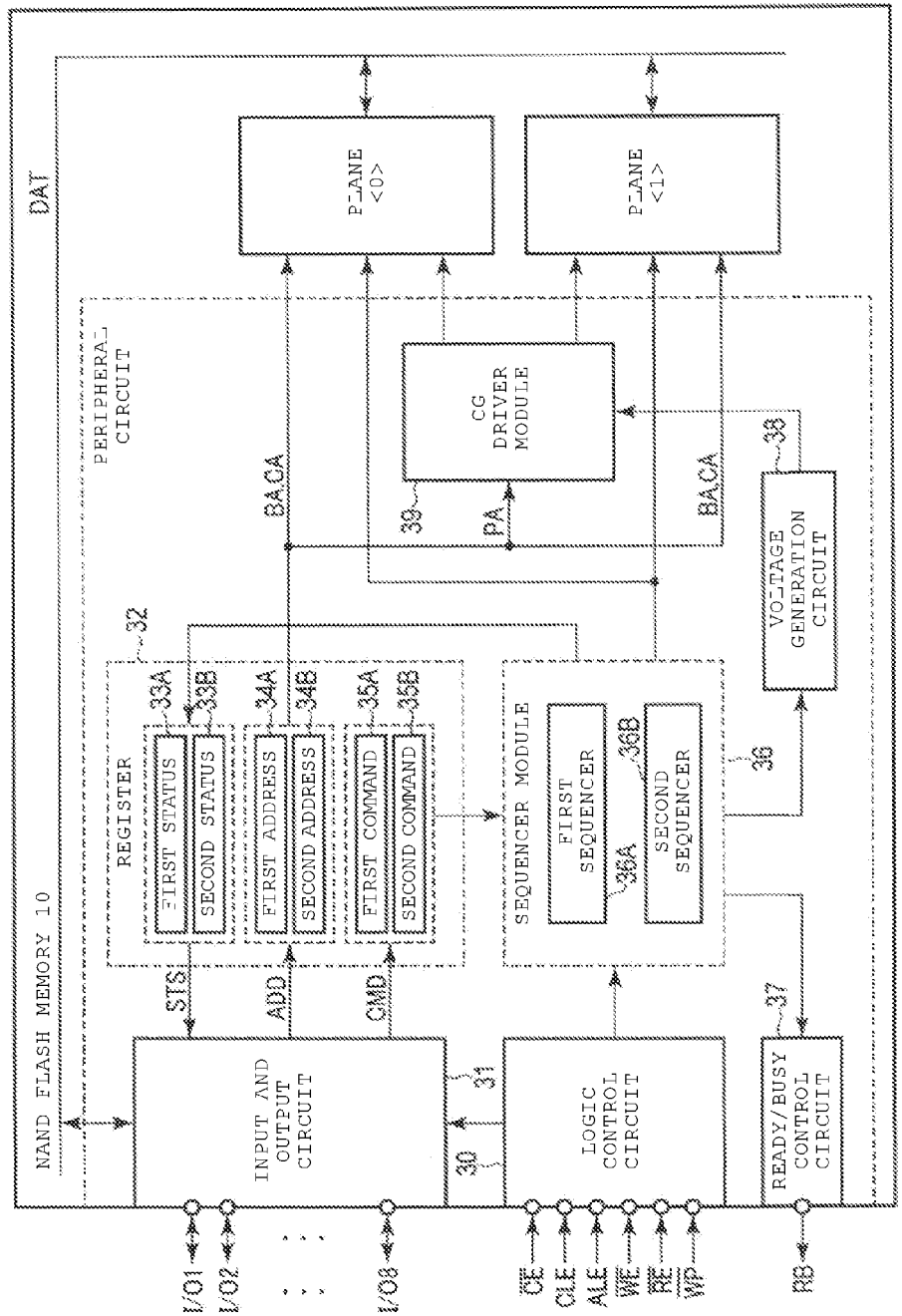
FIG. 38 is a block diagram illustrating a semiconductor memory device according to a sixth embodiment.

First, the configuration of the semiconductor memory device 10 will be described with reference to FIG. 38. FIG. 38 is a block diagram illustrating the semiconductor memory device 10 according to the present embodiment and is different from FIG. 2 described in the first embodiment in the configuration of the ready/busy control circuit. Specifically, as illustrated in FIG. 38, the ready/busy control circuit 37 outputs a ready/busy signal RB indicating an operation state of the entire semiconductor memory device 10.

The ready/busy control circuit 37 sets a ready/busy signal RB to an "H" level when at least one of the first sequencer 36A and the second sequencer 36B is in the ready state. Conversely, the ready/busy control circuit 37 sets the ready/busy signal RB to an "L" level when both of the first sequencer 36A and the second sequencer 36B are in the busy state. The other remaining configuration of the semiconductor memory device 10 is the same as that of the first embodiment, and thus the other remaining configuration will not be described.

In the following description, states in which the ready/busy signal RB indicating the operation state of the entire semiconductor memory device 10 is in the "H" level and the "L" level are referred to as a ready state and a busy state of the semiconductor memory device 10.

[6-2] Operation of Memory System 1

Figure 39:
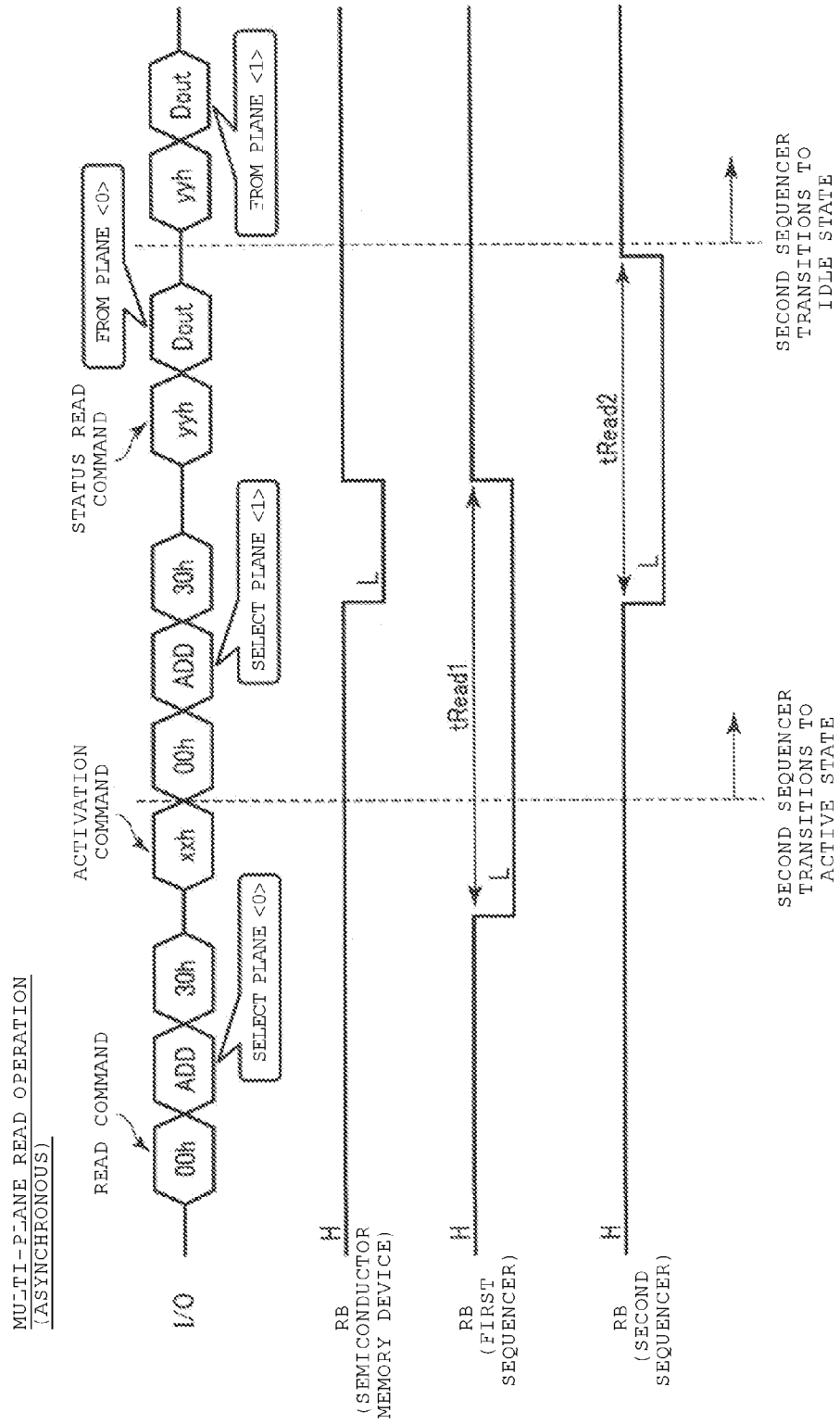
FIG. 39 is a diagram illustrating a command sequence of a read operation in the memory system according to the sixth embodiment.

Next, an asynchronous multi-plane read operation will be described as an example of an operation of the memory system 1 with reference to FIG. 39. FIG. 39 illustrates an example of a command sequence in which the sequencers 36A and 36B execute the asynchronous multi-plane read operation on the planes <0> and <1>, respectively. FIG. 39 illustrates an input and output signal I/O transmitted and received by the semiconductor memory device 10, a ready/busy signal RB indicating an operation state of the entire semiconductor memory device 10, and a ready/busy signal RB of the first sequencer 36A and the second sequencer 36B. The ready/busy signal RB of the illustrated first sequencer 36A and second sequencer 36B is an internal signal of the semiconductor memory device 10 and is not output to the controller 20.

As illustrated in FIG. 39, the controller 20 first transmits commands and address information for instructing a read operation on the plane <0>. Specifically, the controller 20 first transmits the command "00 h", the address information ADD for designating the plane <0>, and the command "30 h" sequentially to the semiconductor memory device 10.

When the command "30 h" is stored in the register 35A, the first sequencer 36A starts a read operation on the plane <0> and the first sequencer 36A enters the busy state from the ready state. At this time, the semiconductor memory device 10 maintains the ready state.

While the first sequencer 36A is executing the read operation on the plane <0>, the controller 20 issues the activation command "xxh" to transmit the activation command "xxh" to the semiconductor memory device 10. When the command "xxh" is stored in the register 35B, the second sequencer 36B in the idle state is activated to enter the active state.

Then, the controller 20 transmits commands and address information for instructing a read operation on the plane <1>. Specifically, the controller 20 transmits the command "00 h", the address information ADD for designating the plane <1>, and the command "30 h" sequentially to the semiconductor memory device 10. When the command "30 h" is stored in the register 35B, the second sequencer 36B starts the read operation on the plane <1> and the second sequencer 36B enters the busy state from the ready state. Here, the semiconductor memory device 10 transitions from the ready state to the busy state.

When the read operation on the plane <0> ends, the first sequencer 36A enters the ready state from the busy state and the semiconductor memory device 10 enters the ready state from the busy state in response to the state transition. Then, the controller 20 issues a status read command "yyh" to transmit the status read command "yyh" to the semiconductor memory device 10 in response to the state transition of the semiconductor memory device 10 to the ready state. The command "yyh" is used for comprehending an operation state of the sequencer included in the semiconductor memory device 10. When the command "yyh" is received, the semiconductor memory device 10 transmits, for example, the status information STS of the semiconductor memory device 10 illustrated in FIG. 40 to the controller 20. FIG. 40 illustrates examples of input and output signals I/O 0 to I/O 7 output in response to the command "yyh" by the semiconductor memory device 10.

As illustrated in FIG. 40, for example, an operation state of the first sequencer 36A is assigned to the input and output signal I/O 0 and an operation state of the second sequencer 36B is assigned to the input and output signal I/O 1. These input and output signals I/O are considered to be "0", for example, when the sequencer is executing any operation (in the busy state), and are considered to be "1" when the sequencer is in a standby state (the ready state). In this example, the remaining input and output signals I/O 2 to I/O 7 are considered to be unused, and thus information is not assigned.

In this way, by assigning the information regarding the operation states of the sequencers 36A and 36B to the input and output signals I/O, the controller 20 can comprehend on which plane an operation ends. In this example, the read operation ends on the plane <0> on which the first sequencer 36A executes the read operation. Therefore, the controller 20 can comprehend that the first sequencer 36A is in the ready state and the second sequencer 36B is in the busy state by status reading in accordance with the beginning command "yyh".

Then, the controller 20 issues a data transmission command and address information (not illustrated) regarding the plane <0> to transmit the data transmission command and the address information to the semiconductor memory device 10 based on the status information of the semiconductor memory device 10. Then, the semiconductor memory device 10 outputs the read data Dout retained in the plane <0> to the controller 20.

When the data transmission of the plane <0> ends, the controller 20 may not comprehend the operation state of the semiconductor memory device 10 from the ready/busy signal RB. Therefore, the controller 20 confirms the operation state of the semiconductor memory device 10 by issuing the statue read command "yyh" at given intervals.

Here, when the controller 20 may not confirm that the read operation of the plane <1> ends, the controller 20 issues the status read command "yyh" again to transmit the status read command "yyh" to the semiconductor memory device 10. Conversely, when the controller 20 can confirm that the read operation of the plane <0> ends, the controller 20 issues a data transmission command and address information (not illustrated) regarding the plane <1> to transmit the data transmission command and the address information to the semiconductor memory device 10. Then, the semiconductor memory device 10 outputs the read data Dout retained in the plane <1> to the controller 20.

In the example described above, the asynchronous multi-plane read operation is executed on the planes <0> and <1>, but an exemplary embodiment is not limited thereto. For example, even when the first sequencer 36A executes a write operation and the second sequencer 36B executes a read operation, the asynchronous multi-plane operation can be executed in accordance with the same method.

[6-3] Advantages of Sixth Embodiment

In the semiconductor memory device 10 according to the sixth embodiment, it is possible to suppress a chip area of the semiconductor memory device 10. Hereinafter, the details of the advantages will be described.

In the semiconductor memory device 10 according to the present embodiment, one ready/busy signal RB is output from the ready/busy control circuit 37 compared to the semiconductor memory device 10 according to the first embodiment, and thus the number of pins exchanging signals between the semiconductor memory device 10 and the controller 20 is reduced.

Specifically, the ready/busy control circuit 37 sets the semiconductor memory device 10 to the ready state when at least one of the first sequencer 36A and the second sequencer 36B is in the ready state, and sets the semiconductor memory device 10 to the busy state when both of the first sequencer 36A and the second sequencer 36B are in the busy state. When the controller 20 detects that an operation of one of the planes ends during the multi-plane operation, the controller 20 executes the status reading on the semiconductor memory device 10. Thus, since the controller 20 can comprehend the state of the semiconductor memory device 10, the controller 20 can output read data to an appropriate plane or give a subsequent instruction of an operation.

As described above, even when one ready/busy signal RB is set, the semiconductor memory device 10 according to the present embodiment can execute the asynchronous multi-plane read operation or the like. In this way, in the semiconductor memory device 10 according to the present embodiment, the number of pins can be reduced more than in the first embodiment. Therefore, it is possible to suppress a chip area.

[7] Seventh Embodiment

Next, a semiconductor memory device 10 and a memory system 1 according to a seventh embodiment will be described. In the seventh embodiment, a cache read operation is executed in the semiconductor memory device 10 described in the sixth embodiment. Hereinafter, differences from the sixth embodiment will be described.

[7-1] Operation of Memory System 1

Figure 41:
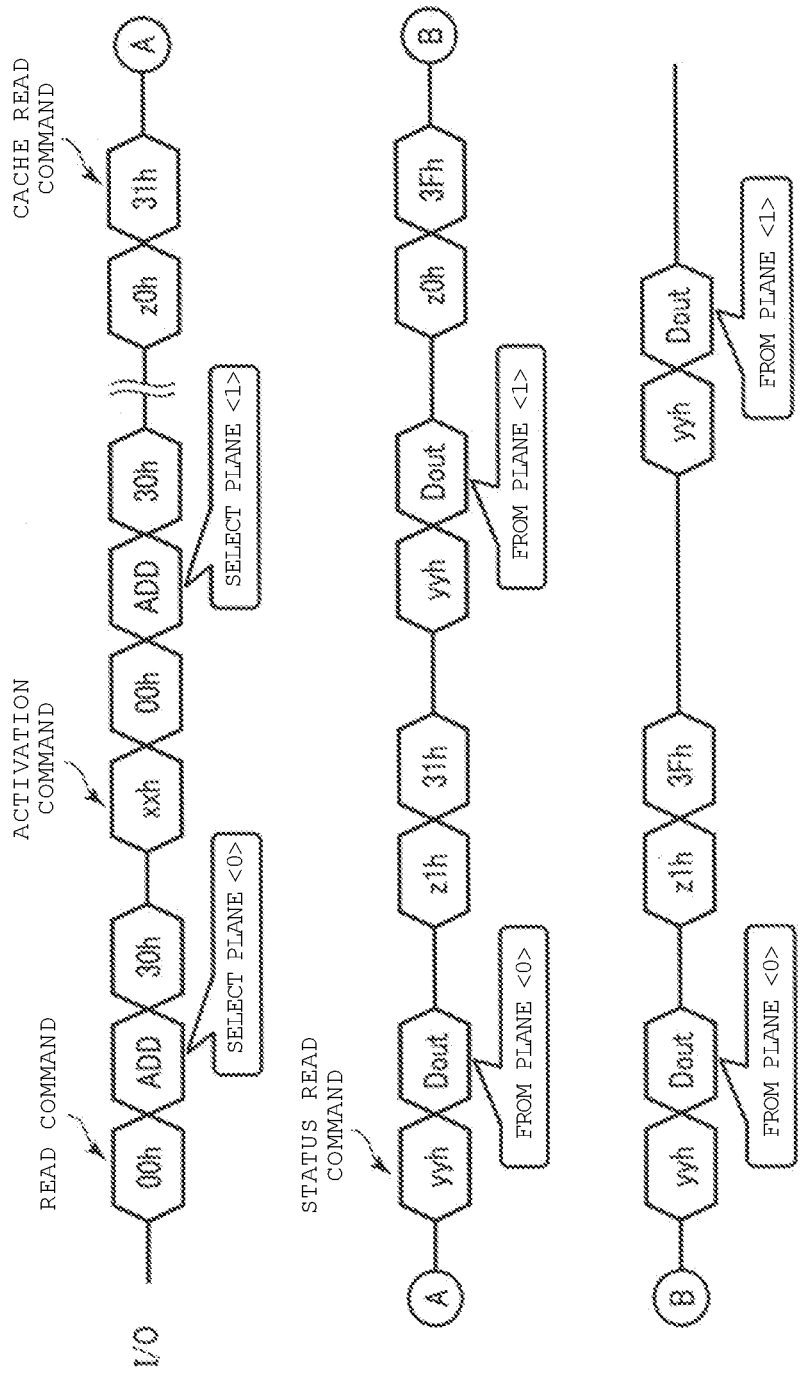
FIG. 41 is a diagram illustrating a command sequence of a read operation in the memory system according to a seventh embodiment.

First, a cache read operation of the semiconductor memory device 10 will be described. In the cache read operation, a read operation is executed on a contiguous page without inputting address information when a cache read command is received after execution of a read operation on a certain plane. FIG. 41 illustrates an example of a command sequence during using the cache read operation when the asynchronous multi-plane read operation is executed and illustrates an input and output signal I/O transmitted and received by the semiconductor memory device 10.

As illustrated in FIG. 41, the controller 20 first causes the semiconductor memory device 10 to execute the asynchronous multi-plane read operation in accordance with the same command sequence as the command sequence described with reference to FIG. 14 in the first embodiment. Then, the semiconductor memory device 10 outputs data read from the planes <0> and <1> through the multi-plane read operation to the controller 20 (which is not illustrated).

Subsequently, the controller 20 issues a command "z0 h" and a cache read command "31 h" to transmit the command "z0 h" and the cache read command "31 h" to the semiconductor memory device 10. The command "z0 h" is used for instructing to switch the plane and is used for designating the plane <0> in this example. The command "31 h" is used for instructing the cache read operation. The semiconductor memory device 10 receiving the command "31 h" executes a read operation on a contiguous page address on a page address on which the read operation is executed immediately before in the designated plane.

The semiconductor memory device 10 receiving these commands executes the read operation at a contiguous page address on the plane <0>. When the read operation ends, as described in the sixth embodiment, the status reading is executed and the end of the read operation is confirmed, and subsequently read data of the corresponding plane is output. In this example, after the status reading is executed by the command "yyh", the read data Dout of the plane <0> is transmitted to the controller 20.

Next, the controller 20 issues a command "z1 h" and the cache read command "31 h" to transmit the command "z1 h" and the cache read command "31 h" to the semiconductor memory device 10. The command "z1 h" is used for instructing to switch the plane and is used for designating the plane <1> in this example.

The semiconductor memory device 10 receiving these commands executes the read operation at a contiguous page address on the plane <1>. When the read operation ends, as described in the sixth embodiment, the status reading is executed and the end of the read operation is confirmed, and subsequently read data of the corresponding plane is output. In this example, after the status reading is executed by the command "yyh", the read data Dout of the plane <1> is transmitted to the controller 20.

The cache read operation is progressed in the above-described command sequence. In the example described above, the sequence in which the cache read operation is executed and the sequence in which the data read through the cache read operation is output are continued, but an exemplary embodiment is not limited thereto. For example, after the read data of one plane is output, the cache read command for this plane may be given. In this case, an instruction timing of the cache read operation on each plane and an output timing of the data of each plane are different from those in FIG. 41 in some cases.

When the cache read operation on each plane ends, a different command is used to give an instruction of the cache read operation on a finally designated page. Specifically, as illustrated in FIG. 41, a command "3Fh" is used instead of the command "31 h" at the end of the cache read operation. The command "3Fh" is shown at the end of the cache read operation. The semiconductor memory device 10 executes reading of contiguous page data as in the case of the command "31 h" based on the command "3Fh" and ends the read operation on this plane when the data is output.

As described above, the semiconductor memory device 10 according to the present embodiment can apply the cache read operation in the asynchronous multi-plane read operation by executing an operation while switching the selected plane every time using the commands "z0 h" and "z1 h".

[7-2] Advantages of Seventh Embodiment

In the seventh embodiment, the cache read operation is applied to the semiconductor memory device 10 according to the sixth embodiment. In this way, the semiconductor memory device 10 can execute the cache read operation even when the asynchronous multi-plane read operation is executed. Thus, in the memory system 1 according to the present embodiment, the command sequence can be simplified. Therefore, an operation speed can be improved more than in the sixth embodiment.

[8] Eighth Embodiment

Next, a semiconductor memory device 10 and a memory system 1 according to an eighth embodiment will be described. In the eighth embodiment, a logic control circuit, an input and output circuit, and a ready/busy control circuit corresponding to the second sequencer are provided in the memory system 1 described in the first embodiment. Hereinafter, differences from the first to seventh embodiments will be described.

[8-1] Configuration of Memory System 1

Figure 42:
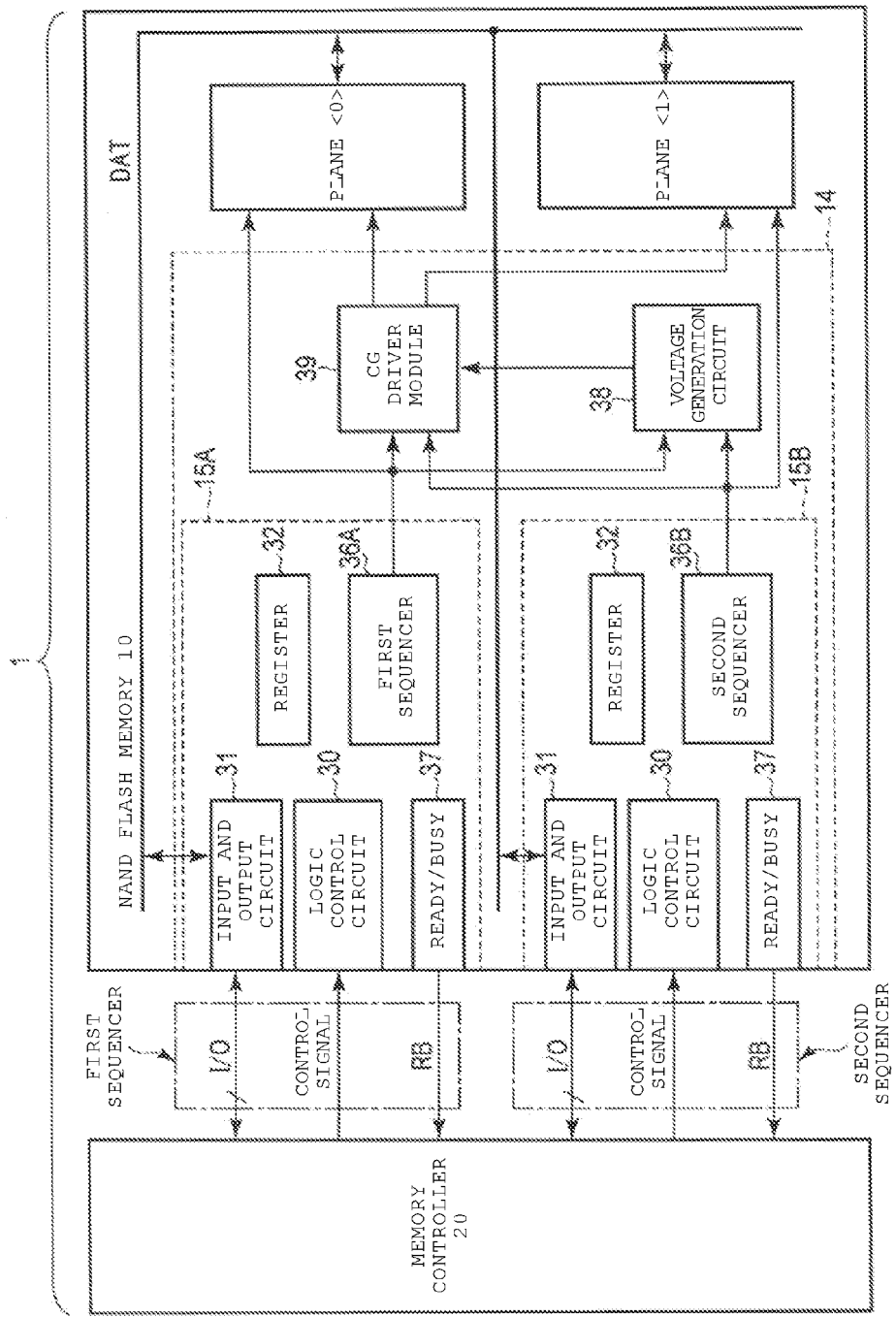
FIG. 42 is a block diagram illustrating a memory system according to an eighth embodiment.

First, the configuration of a memory system 1 will be described with reference to FIG. 42. FIG. 42 is a block diagram illustrating the memory system 1 according to the present embodiment. As illustrated in FIG. 42, the semiconductor memory device 10 includes a region 15A corresponding to a first sequencer 36A and a region 15B corresponding to a second sequencer 36B in a peripheral circuit 14.

In each of the regions 15A and 15B, a logic control circuit 30, an input and output circuit 31, a register 32, the sequencer 36, and the ready/busy control circuit 37 are provided. In the region 15A, the first sequencer 36A is provided. In the region 15B, the second sequencer 36B is provided. Connection relations of various circuits in the regions 15 are the same as those described in FIG. 2 in the first embodiment. Connection relations between the first sequencer 36A and the second sequencer 36B and a voltage generation circuit 38, a CG driver module 39, and each plane are the same as those described in FIG. 4 in the first embodiment.

As illustrated in FIG. 42, the controller 20 exchanges signals corresponding to the first sequencer 36A and signals corresponding to the second sequencer 36B with the semiconductor memory device 10. Specifically, signals corresponding to the first sequencer 36A and the second sequencer 36B each include an input and output signal I/O, various control signals, and ready/busy signals RB. The other remaining configuration is the same as that of the first embodiment, and thus the other remaining configuration will not be described.

[8-2] Operation of Memory System 1

Figure 43:
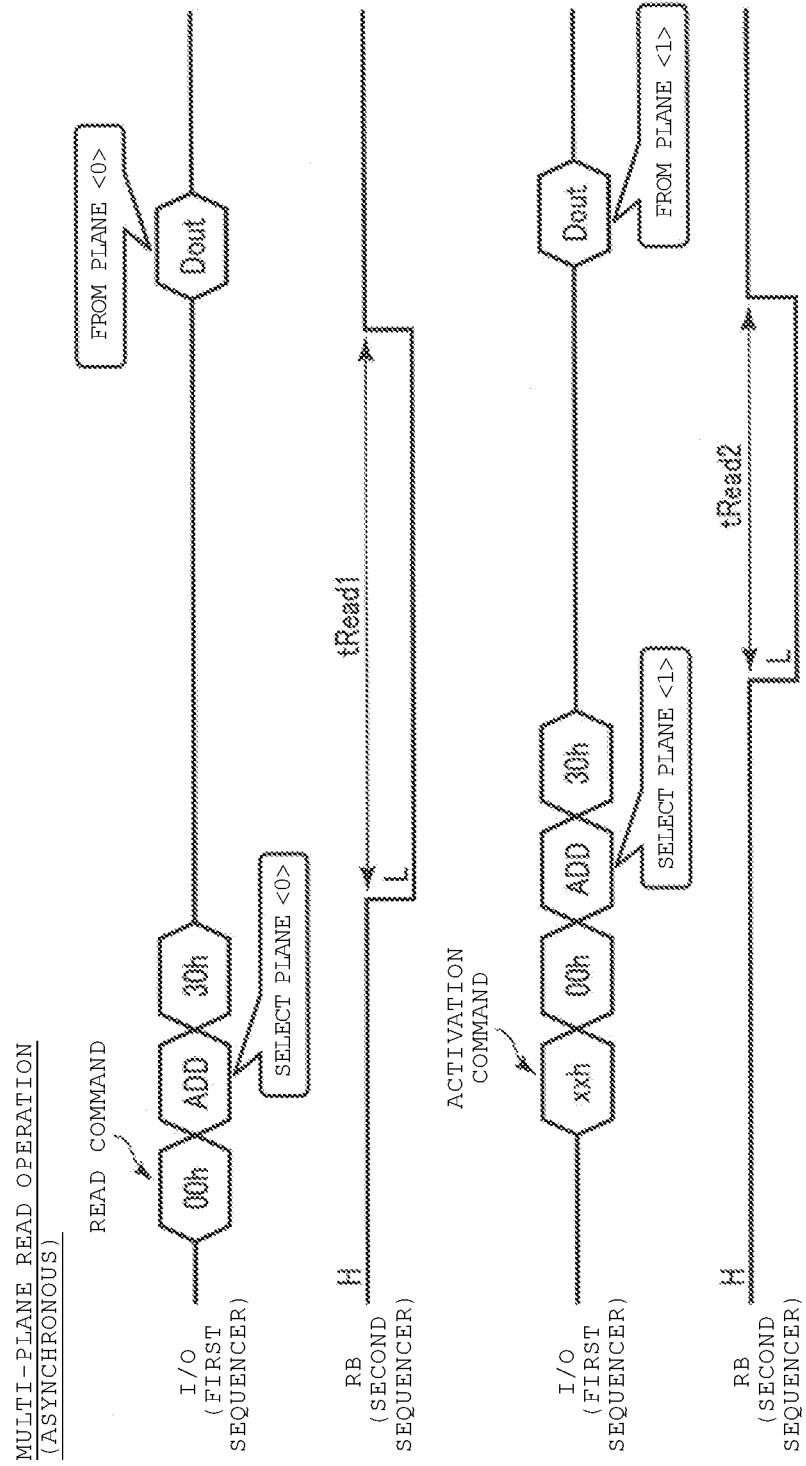
FIG. 43 is a diagram illustrating a command sequence of a read operation in the memory system according to the eighth embodiment.

Next, an asynchronous multi-plane read operation in the semiconductor memory device 10 will be described with reference to FIG. 43. FIG. 43 illustrates examples of command sequences in which the sequencers 36A and 36B execute an asynchronous read operation on the planes <0> and <1>, respectively. FIG. 43 illustrates an input and output signal I/O and the ready/busy signal RB corresponding to the first sequencer 36A and an input and output signal I/O and the ready/busy signal RB corresponding to the second sequencer 36B.

As illustrated in FIG. 43, the controller 20 first executes a read operation on the plane <0> using the input and output circuit 31 and the like corresponding to the first sequencer 36A. This command sequence is the same as the command sequence for instructing the read operation of the plane <0> in FIG. 10 described in the first embodiment.

While the controller 20 instructs the read operation using the first sequencer 36A, the controller 20 executes the read operation on the plane <1> using the input and output circuit 31 and the like corresponding to the second sequencer 36B. This command sequence is the same as the command sequence for instructing the read operation of the plane <1> in FIG. 10 described in the first embodiment. At the beginning of the command sequence, an activation command "xxh" is included. The second sequencer 36B is activated based on the activation command "xxh".

Then, data read under the control of the first sequencer 36A and the second sequencer 36B is output to the controller 20 via the input and output circuits 31 corresponding to the first sequencer 36A and the second sequencer 36B.

As described above, in the memory system 1 according to the present embodiment, the controller 20 can transmit the command sequence corresponding to the first sequencer 36A and the command sequence corresponding to the second sequencer 36B to the semiconductor memory device 10 in parallel when the asynchronous multi-plane read operation is executed. The semiconductor memory device 10 can output the data read through the asynchronous multi-plane read operation to the controller in parallel with the input and output circuits 31 corresponding to the first sequencer 36A and the second sequencer 36B.

[8-3] Advantages of Eighth Embodiment

In the memory system 1 according to the eighth embodiment, an operation speed can be accelerated. Hereinafter, the details of the advantages will be described.

The semiconductor memory device 10 according to the present embodiment is configured such that the controller 20 can control the first sequencer 36A and the second sequencer 36B in parallel, compared to the semiconductor memory device 10 according to the first embodiment. Specifically, the semiconductor memory device 10 includes circuits such as the logic control circuits 30 and the input and output circuits 31 corresponding to the first sequencer 36A and the second sequencer 36B.

Thus, the controller 20 can asynchronously execute various operations on the plurality of planes included in the semiconductor memory device 10. Further, since the semiconductor memory device 10 includes the input and output circuits 31 corresponding to the first sequencer 36A and the second sequencer 36B, the input and output signals I/O in various asynchronous operations can be exchanged in parallel.

As described above, in the memory system 1 according to the present embodiment, transmission and reception efficiency of the input and output signals I/O exchanged between the semiconductor memory device 10 and the controller 20 is improved. That is, in the memory system 1 according to the present embodiment, it is possible to improve the operation speed more than in the first embodiment.

In the semiconductor memory device 10 according to the present embodiment, the planes on which the sequencers 36A and 36B execute the read operations may be fixed as in the second embodiment. In this case, the input and output circuit 31 corresponding to the second sequencer 36B may be connected to the plane <1> corresponding to the second sequencer 36B.

[9] Ninth Embodiment

Next, a semiconductor memory device 10 and a memory system 1 according to a ninth embodiment will be described. The ninth embodiment is an example in which refresh operations effective to reduce a read error are asynchronously executed in a semiconductor memory device that has a structure in which memory cells are stacked. Hereinafter, differences from the first to eighth embodiments will be described.

[9-1] Configuration

First, the configuration of the memory system 1 will be described. The configuration of the memory system 1 according to the present embodiment is different from the configuration of the memory system 1 described with reference to FIGS. 1 to 4 in the first embodiment in the circuit configuration of the memory cell array 11. Hereinafter, examples of the circuit configuration of the memory cell array 11 according to the present embodiment and the cross-sectional structure of the memory cell array 11 achieving the circuit configuration will be described in order.

[9-1-1] Circuit Configuration of Memory Cell Array 11

Figure 44:
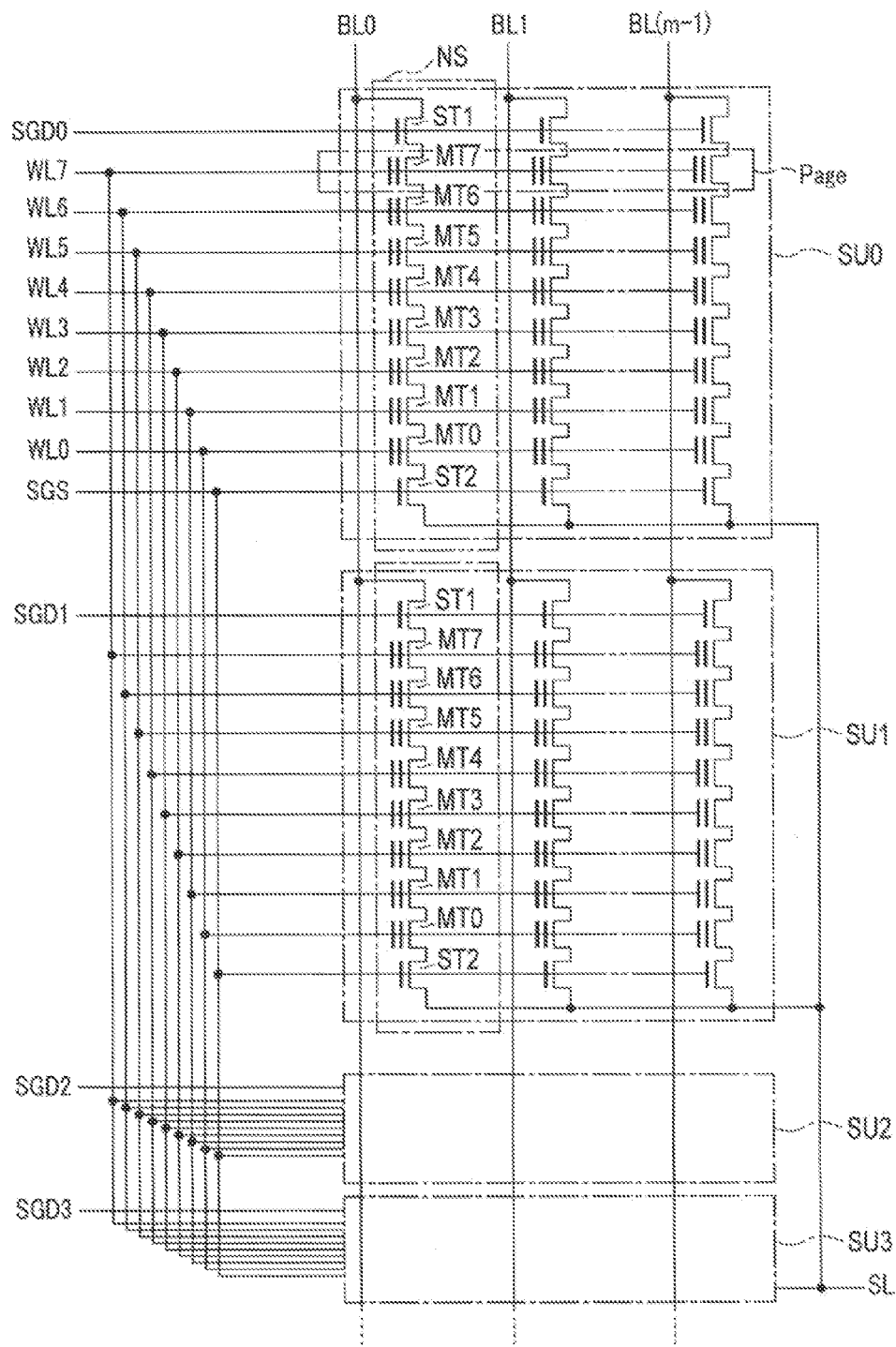
FIG. 44 is a circuit diagram illustrating a memory cell array in a semiconductor memory device according to a ninth embodiment.

First, the circuit configuration of the memory cell array 11 will be described with reference to FIG. 44. FIG. 44 illustrates a circuit diagram of the memory cell array 11 in the semiconductor memory device 10 that has a structure in which memory cells are stacked. The circuit configuration illustrated in FIG. 44 is different from that described in FIG. 3 in the first embodiment in the internal configuration of the block BLK.

The block BLK includes, for example, four string units SU. Each of the string units SU includes m NAND strings NS. The number of NAND strings NS corresponds to the number of bit lines BL.

The gates of the select transistors ST1 in the string units SU0 to SU3 are commonly connected to select gate lines SGD0 to SGD3, respectively. The gates of the select transistors ST2 in the same block are commonly connected to the select gate lines SGS. Similarly, control gates of the memory cell transistors MT0 to MT7 in the same block are commonly connected to word lines WL0 to WL7, respectively.

The drains of the select transistors ST1 of the NAND strings NS in the same column in the memory cell array 11 are commonly connected to the bit lines BL. That is, the bit lines BL are commonly connected to the NAND strings NS in the same column between the plurality of blocks BLK. Further, the sources of the plurality of select transistors ST2 are commonly connected to a source line SL. The other remaining circuit configuration is the same as that in FIG. 3 described in the first embodiment.

[9-1-2] Cross-Sectional Structure of Memory Cell Array 11

Figure 45:
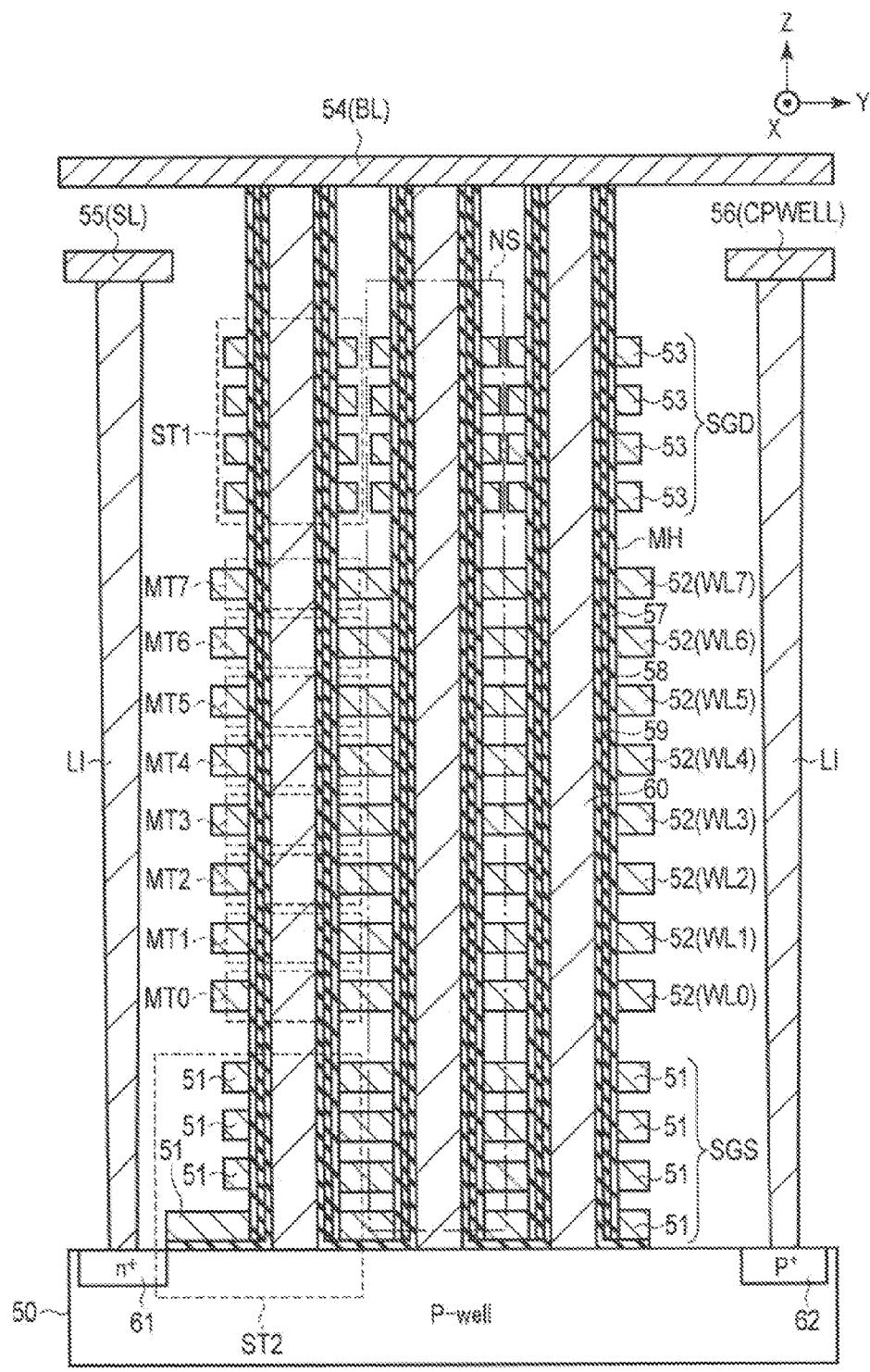
FIG. 45 is a sectional view illustrating the memory cell array in the semiconductor memory device according to the ninth embodiment.

Next, the cross-sectional structure of the memory cell array 11 will be described with reference to FIG. 45. In FIG. 45, the cross-section of the memory cell array 11 and X, Y, and Z axes perpendicular to each other are illustrated. In FIG. 45, inter-layer insulating films are not illustrated.

As illustrated in FIG. 45, the semiconductor memory device 10 includes a P-type well region 50, wiring layers 51 to 56, a plurality of semiconductor pillars MH, and a plurality of contact plugs LI.

The P-type well region 50 is formed on the surface of a semiconductor substrate. The wiring layers 51 to 53 are stacked sequentially above the P-type well region 50. The wiring layers 51 to 53 function as select gate lines SGS, word lines WL, and select gate lines SGD. That is, the number of wiring layers 51 to 53 corresponds to the number of select gate lines SGS, word lines WL, and select gate lines SGD.

The pluralities of wiring layers 51 and 53 respectively corresponding to the select gate lines SGS and SGD may be provided, as illustrated in FIG. 45. The wiring layers 51 to 53 are provided in a plate shape spread in the X and Y directions.

The plurality of semiconductor pillars MH are formed to reach the upper surface of the P-type well region 50 from the upper surface of the wiring layer 53. That is, the semiconductor pillars MH are provided to pass through the wiring layers 51 to 53 in the Z direction. A block insulating film 57, an insulating film (charge storage layer) 58, and a tunnel oxide film 59 are formed sequentially on side surfaces of the semiconductor pillars MH. In the semiconductor pillars MH, a semiconductor material 60 containing a conductive material is embedded in an inner side than the tunnel oxide film 59.

The writing layer 54 corresponding to the bit line BL is formed above the wiring layer 53 and the semiconductor pillars MH. The bit lines BL are connected to the corresponding semiconductor pillars MH. Contact plugs containing a conductive material may be formed between the bit lines BL and the corresponding semiconductor pillars MH.

The wiring layers 55 and 56 respectively corresponding to a source line SL and a well line CPWELL are formed between the wiring layers 53 and 54. The source line SL is connected to an n+ impurity diffusion area 61 formed in the surface of the well region 50 via the contact plug LI. The well line CPWELL is connected to a p+ impurity diffusion area 62 formed in the surface of the well region 50 via the contact plug LI. The contact plug LI is provided in a plate shape spread in the X and Z directions.

In the above-described configuration, one semiconductor pillar MH corresponds to one NAND string NS. Specifically, intersections between the select gate lines SGD and SGS and the semiconductor pillar MH correspond to the select transistors ST1 and ST2. Similarly, an intersection between the word line WL and the semiconductor pillar MH corresponds to the memory cell transistor MT.

The plurality of above-described configurations are arrayed in the X direction. For example, one string unit SU is formed by a set of the plurality of NAND strings NS arrayed in the X direction. When the plurality of string units SU are provided in the same block BLK, the wiring layer 53 corresponding to the select gate line SGD is separated between the string units SU.

The lowermost wiring layer 51 and the tunnel oxide film 59 are provided up to the vicinity of the n+ impurity diffusion area 61. Thus, when the select transistor ST2 is turned on, a current path is formed between the NAND string NS and the n+ impurity diffusion area 61.

[9-2] Operations

[9-2-1] Refresh Operation

Figure 46:
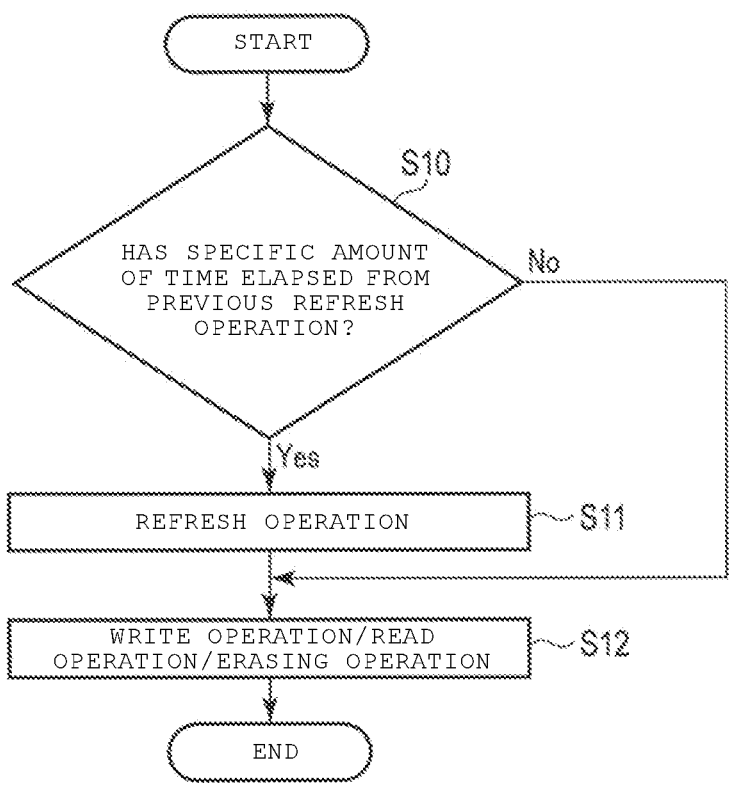
FIG. 46 is a flowchart illustrating a refresh operation in the memory system according to the ninth embodiment.

Next, the details of a refresh operation in the memory system 1 will be described with reference to FIG. 46. FIG. 46 is a flowchart illustrating the refresh operation inserted between various operations in the memory system 1.

As illustrated in FIG. 46, the controller 20 executes a confirmation operation of step S10 before a write operation, a read operation, or an erasing operation is executed. Specifically, in step S10, the controller 20 confirms whether a specific amount of time has elapsed from a previous refresh operation in the block BLK on which an operation is executed from the present time. The specific amount of time can be set as any numerical value and the controller 20 manages the specific amount of time, for example, separately per block BLK.

Figure 47:
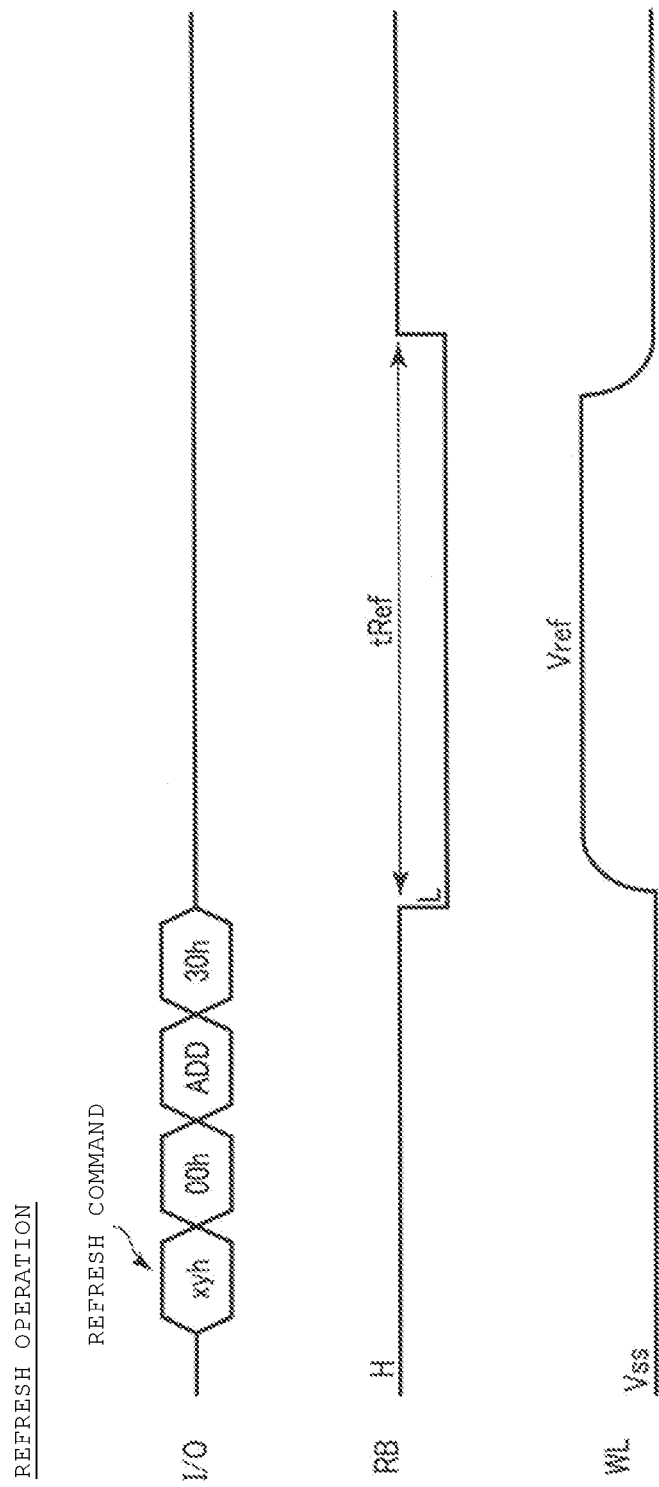
FIG. 47 is a diagram illustrating a command sequence of the refresh operation in the memory system according to the ninth embodiment.

When the specific amount of time has elapsed in regard to an operation execution target block in step S10 (Yes in step S10), the controller 20 instructs the semiconductor memory device 10 to execute a refresh operation (step S11). A command sequence and waveforms in the refresh operation are illustrated in FIG. 47. FIG. 47 illustrates an input and output signal I/O transmitted and received by the semiconductor memory device 10 and the waveforms of a ready/busy signal RB and a word line WL.

As illustrated in FIG. 47, the controller 20 first issues a refresh command "xyh" to transmit the refresh command "xyh" to the semiconductor memory device 10. The refresh command "xyh" is used for instructing the semiconductor memory device 10 to execute a refresh operation. Next, the controller 20 transmits the command "00 h", the address information ADD, and the command "30 h" sequentially to the semiconductor memory device 10. In this way, a command set in which a prefix command to instruct a refresh operation is added to the same command set as a read operation is used as a command set to instruct the refresh operation. When the command "30 h" is stored in the command register 35, the sequencer 36 starts the refresh operation and enters the busy state from the ready state.

A voltage of the word line WL before the refresh operation is Vss. The voltage Vss is a ground voltage of the semiconductor memory device 10. When the refresh operation starts, the row decoder 13 applies a voltage Vref to all the word lines WL in the selected block BLK. The voltage Vref is a refresh voltage used in the refresh operation and, for example, the same voltages as various read voltages in a read operation are used. The row decoder 13 decreases the voltage of the word lines WL to Vss after the voltage Vref is applied for a predetermined time. Then, the sequencer 36 ends the refresh operation and enters the ready state from the busy state.

As an application time of the refresh voltage in the refresh operation, at an arbitrary time may be set or a different time may be set for each block BLK. As the refresh voltage, a different voltage may be used for each block BLK. A stable time of the bit line BL, the word line WL, or the like may be set to be shorter than in a normal read operation or the like.

After the refresh operation in step S11 is executed or when the specific amount of time in the operation execution target block in step S10 has not elapsed (No in step S10), the sequencer 36 instructs the semiconductor memory device 10 to execute various operations (step S12). Then, the semiconductor memory device 10 executes a write operation, a read operation, or an erasing operation.

Figure 48:
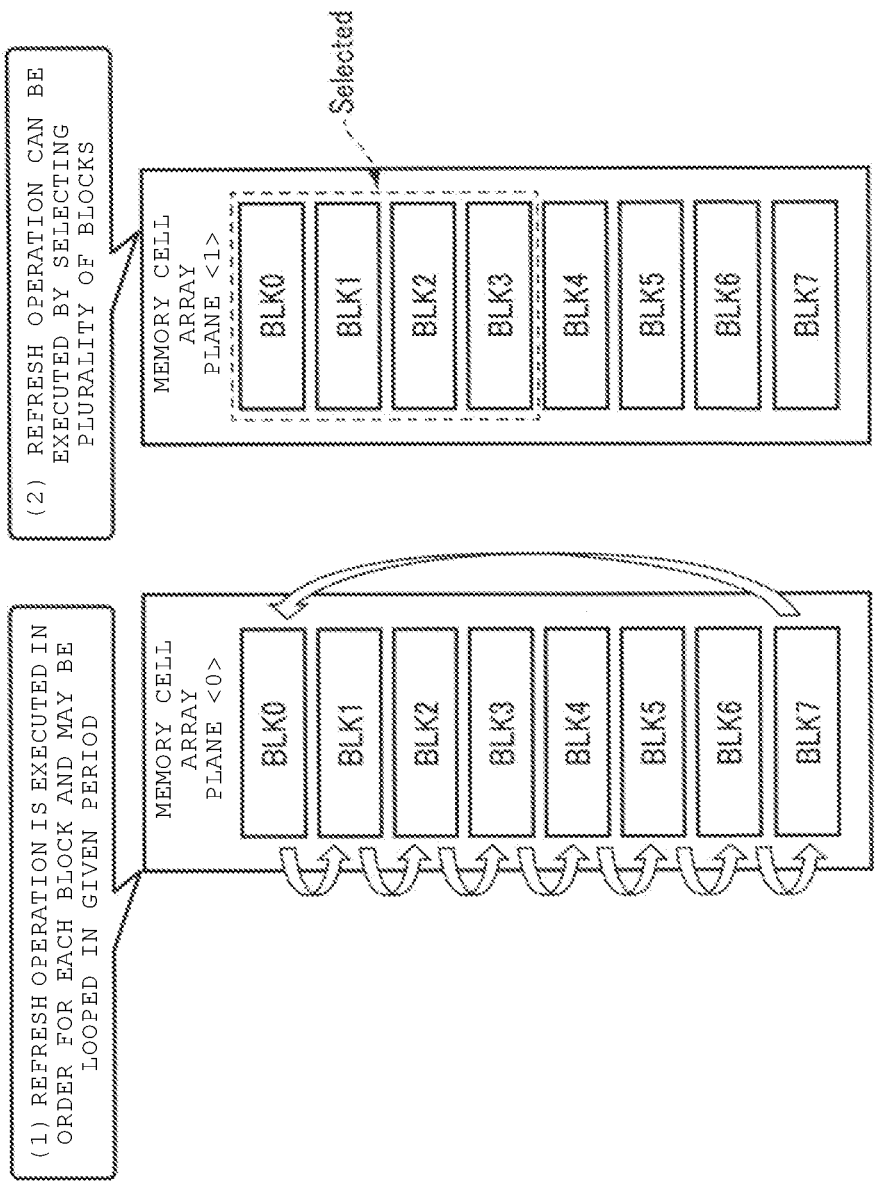
FIG. 48 is a diagram illustrating the refresh operation in the memory system according to the ninth embodiment.

The above-described refresh operation may be executed periodically between various operations. A method illustrated in FIG. 48 is considered as a method of executing the refresh operation. FIG. 48 illustrates the planes <0> and <1> each of which includes, for example, 8 blocks BLK (BLK0 to BLK7).

As illustrated in the plane <0> in FIG. 48, the refresh operation may be executed sequentially from the block BLK0 to the block BLK7. In this case, when the refresh operation of the block BLK7 is completed, the refresh operation is executed again from the block BLK0. In this way, a time in which the refresh operation on the blocks BLK is looped once is set to, for example, the same time as the specific time described in step S10 in FIG. 46.

As illustrated in the plane <1> in FIG. 48, the refresh operation can also be executed simultaneously on a plurality of blocks BLK. In this example, the blocks BLK0 to BLK3 are selected. However, the selected blocks BLK may not be continuous or any number of blocks BLK may be selected.

[9-2-2] Operation of Memory System 1

Figure 49:
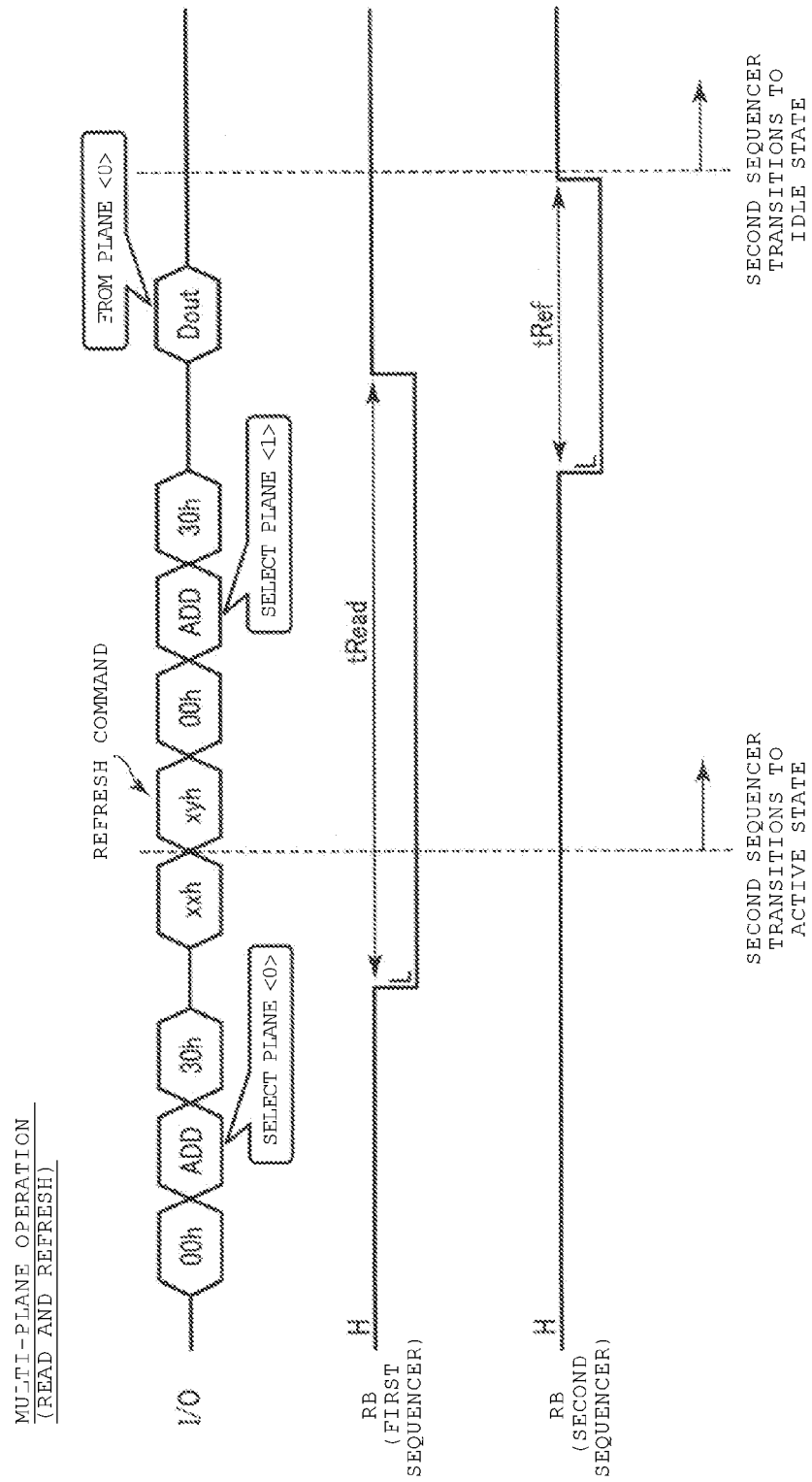
FIG. 49 is a diagram illustrating a command sequence of a read operation and a refresh operation in the memory system according to the ninth embodiment.

Next, asynchronous execution of a single plane read operation and a refresh operation will be described as an example of an operation of the memory system 1 with reference to FIG. 49. FIG. 49 illustrates an example in which the second sequencer 36B executes the refresh operation on the plane <1> while the first sequencer 36A is executing the single plane read operation on the plane <0>. FIG. 49 illustrates an input and output signal I/O transmitted and received by the semiconductor memory device 10 and ready/busy signals RB corresponding to the first sequencer 36A and the second sequencer 36B.

As illustrated in FIG. 49, the controller 20 first transmits the address information and the commands for instructing a read operation on the plane <0>. Specifically, the controller 20 transmits the command "00 h", the address information ADD for designating the plane <0>, and the command "30 h" sequentially to the semiconductor memory device 10.

When the command "30 h" is stored in the register 35A, the first sequencer 36A starts the read operation on the plane <0> and the first sequencer 36A enters the busy state from the ready state. As illustrated, tRead indicates a period in which the first sequencer 36A executes the read operation on the plane <0>. During this period, the first sequencer 36A maintains the busy state.

Then, while the first sequencer 36A is executing the read operation on the plane <0>, the controller 20 issues the activation command "xxh" to transmit the command "xxh" to the semiconductor memory device 10. The transmitted command "xxh" is stored in, for example, the second command register 35B via the input and output circuit 31.

When the command "xxh" is stored in the register 35B, the second sequencer 36B in the idle state is activated to enter the active state. Then, the controller 20 transmits the address information and the commands for instructing the refresh operation on the plane <1>. Specifically, the controller 20 transmits the command "xxh", the command "xyh", and the address information ADD for designating the plane <1>, and the command "30 h" sequentially to the semiconductor memory device 10. Here, the commands "xyh", "00 h", and "30 h" are stored in the second command register 35B via the input and output circuit 31, and the address information ADD is stored in the second address register 34B via the input and output circuit 31.

When the command "30 h" is stored in the register 35B, the second sequencer 36B starts the refresh operation on the plane <1> and the second sequencer 36B enters the busy state from the ready state. As illustrated, tRef indicates a period in which the second sequencer 36B executes the refresh operation on the plane <1>. During this period, the second sequencer 36B retains the busy state. As illustrated, in the semiconductor memory device 10 in this example, there is a period in which both of the first sequencer 36A and the second sequencer 36B are in the busy state. An operation image of the sequencer module 36 and the CG driver module 39 during this period is illustrated in FIG. 50.

Figure 50:
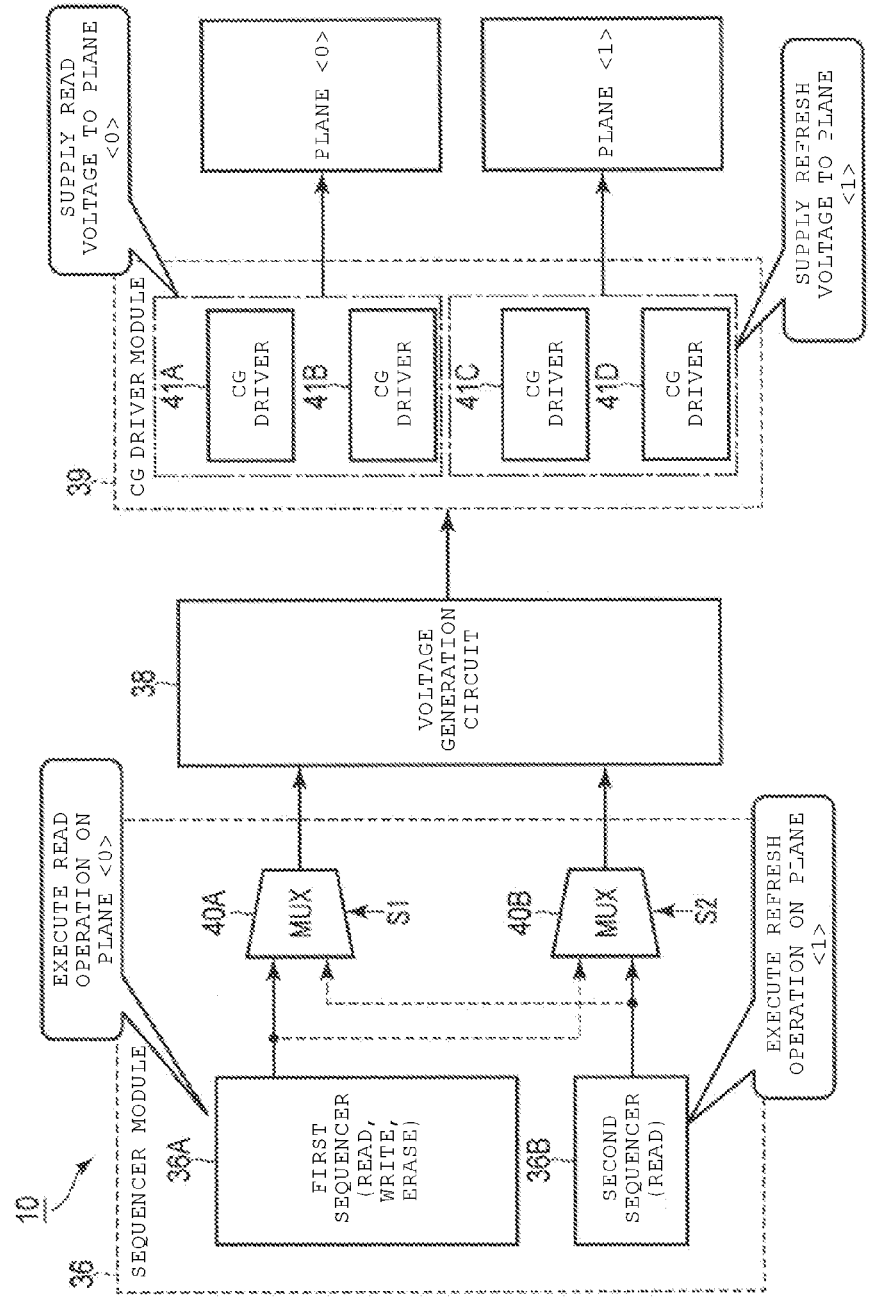
FIG. 50 is a diagram illustrating the read operation and the refresh operation in the memory system according to the ninth embodiment.

As illustrated in FIG. 50, the sequencer module 36 controls the selection signal S1 such that a control signal of the first sequencer 36A is output to the multiplexer 40A. The selection signal S2 is controlled to output a control signal of the second sequencer 36B to the multiplexer 40B. Thus, while the first sequencer 36A is executing the read operation on the plane <0>, the second sequencer 36B can start the refresh operation on the plane <1>.

In this example, as illustrated, the CG drivers 41A and 41B supply a read voltage to the plane <0>, and the CG drivers 41C and 41D supply a refresh voltage to the plane <1>. The other remaining operation is the same as the single plane read operation described in the section [1-2-1].

When the read operation on the plane <0> ends, the first sequencer 36A enters the ready state from the busy state. Then, the sense amplifier module 12A transmits the data Dout read from the plane <0> to the controller 20.

When the refresh operation on the plane <1> ends, the second sequencer 36B enters the ready state from the busy state and further transitions to the idle state. In this way, the semiconductor memory device 10 can execute the refresh operation in the asynchronous multi-plane operation by using the second sequencer 36B.

[9-3] Advantages of Ninth Embodiment

In the semiconductor memory device 10 according to the ninth embodiment, it is possible to improve reliability of the read data. Hereinafter, the details of the advantages will be described.

Figure 51:
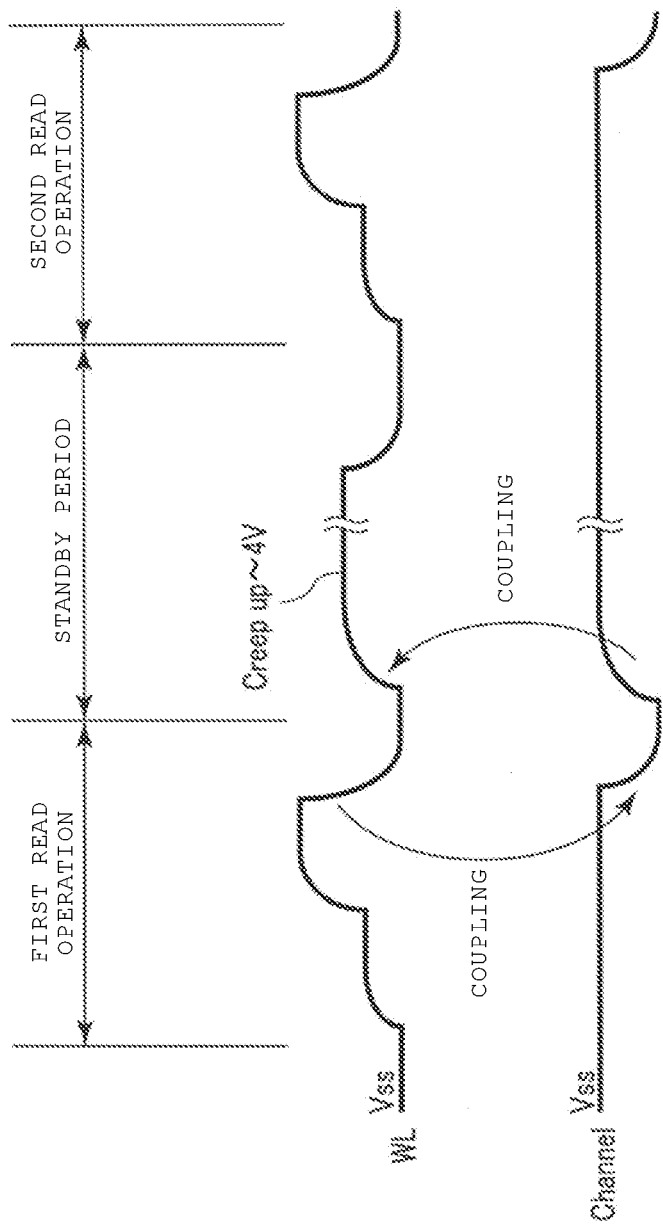
FIG. 51 is a diagram illustrating a creep-up phenomenon after various operations of a semiconductor memory device.

In the semiconductor memory device, the channels of the memory cell transistors MT included in the NAND strings NS share, the conductive semiconductor material 60, for example, as illustrated in FIG. 45. In the semiconductor memory device 10 having such a configuration, for example, a phenomenon illustrated in FIG. 51 occurs. FIG. 51 is a waveform diagram illustrating the word lines WL and the channels of the NAND strings NS in various operations. In an example illustrated in FIG. 51, there is a standby period of the semiconductor memory device 10 between a first-time read operation (first read operation) and a second-time read operation (second read operation). In the first and second read operations illustrated in FIG. 51, a waveform of a read voltage stepped up once is illustrated as an example.

As illustrated in FIG. 51, in the first read operation, the row decoder 13 first applies a read voltage to the select word line WL of the selected block BLK. Then, when the first read operation ends, the row decoder 13 decreases the voltage of the select word line WL. Since application of the voltage to the bit line BL and the source line SL stops during a non-operation, the channel of the NAND string NS enters a floating state.

When the voltage of the select word line WL is equal to or less than a threshold voltage of the memory cell transistor MT, the memory cell transistor MT enters an off-state. Thereafter, the row decoder 13 continuously decreases the voltage of the select word line WL so that the voltage of the select word line WL becomes Vss. At this time, the potential of the channel of the NAND string NS drops to a negative value due to coupling between the select word line WL and the channel of the NAND string NS. Thereafter, when the word line WL is considered to be unselected and enters a floating state, the potential of the channel of the NAND string NS returns to Vss. Then, the voltage of the word line WL in the block BLK increases due to the coupling between the word line WL and the channel of the NAND string NS. This phenomenon is indicated as "creep-up" in FIG. 51.

This creep-up may slightly vary the threshold voltage of the memory cell due to occurrence of a potential difference between the gate and the channel in the memory cell transistor MT of the block BLK in some cases. Specifically, in a memory cell with a low threshold voltage, electrons are trapped in a charge storage layer and the threshold voltage increases when the creep-up occurs. Conversely, in a memory cell with a high threshold voltage, electrons move from the charge storage layer to the side of the word line WL, and thus the threshold voltage decreases.

The voltage of the word line WL increased because of the creep-up returns to Vss due to leakage from an intersection of the word lines WL. When the potential difference between the gate and the channel of the memory cell transistor MT does not occur and a time elapses for a while, the increased threshold voltage of the memory cell returns to the original voltage. That is, the threshold voltage of the memory cell varies according to the time elapsed after the read operation is executed. Due to this influence, a read result differs in some cases between a read result during a period in which the threshold voltage of the memory cell varies and a read result when the threshold voltage of the memory cell returns to the original state.

Accordingly, in the memory system 1 according to the present embodiment, the refresh operation is executed. The refresh operation is inserted periodically while various operations are being executed. For example, substantially the same voltage as a voltage of the word line WL increased due to the creep-up is applied to all the word lines WL of the target block BLK for a predetermined period. The block BLK on which the refresh operation is executed enters the same state as the state when the creep-up occurs, and the same variation in the threshold voltage as the creep-up occurs in the memory cell in the block BLK. That is, by executing the refresh operation periodically, it is possible to stabilize the threshold voltage of the memory cell to a state in which a substantially constant value varies.

Thus, in the semiconductor memory device 10 according to the present embodiment, it is possible to maintain the state of the threshold voltage of the memory cell constantly when a read operation starts. Accordingly, in the semiconductor memory device 10 according to the present embodiment, it is possible to suppress the variation in the read result and it is possible to improve reliability of the read data.

In the memory system 1 according to the present embodiment, as in the first embodiment, it is possible to execute an asynchronous multi-plane operation. For example, while the first sequencer 36A is executing a read operation on one plane, the second sequencer 36B can start the refresh operation on the other plane. Similarly, while the first sequencer 36A is executing the refresh operation on one plane, the second sequencer 36B can execute various operations on the other plane. An asynchronous refresh operation can also be executed between the plurality of planes. That is, since the semiconductor memory device 10 according to the present embodiment can execute the refresh operation at an arbitrary timing, an operation can be accelerated.

In the example described above, in the above-described refresh operation, the predetermined voltage is applied to all the word lines WL of the block BLK on which the refresh operation is executed, but an exemplary embodiment is not limited thereto. For example, the word line WL to which the voltage is not applied in the refresh operation may be included.

The refresh operation described in the present embodiment can also be executed in the memory system 1 described in the second to eighth embodiments. The semiconductor memory device 10 according to the second to eighth embodiments may have a structure in which memory cells are stacked as in the present embodiment.

[10] Modification Examples

The semiconductor memory device according to the above-described embodiment <1, FIG. 1> includes the first and second planes each of which includes memory cell arrays and the first and second control circuits <36A and 36B, FIG. 4>. Each of the first and second control circuits is capable of executing read operations on the first and second planes. The first and second control circuits have the active state in which a read operation is executable and an idle state in which the read operation is prohibited from being executed. When the first control circuit is in the active state and the second control circuit is in the idle state, the first control circuit executes a first read operation on the first plane when the first command set <00 h-ADD-30 h, FIG. 10> is received. The first control circuit executes a second read operation on the second plane when a second command set <00 h-ADD-30 h, FIG. 10> is received. The second control circuit transitions from the idle state to the active state when the first command <xxh, FIG. 10> is received and the first and second command sets are received sequentially, and the second control circuit starts the second read operation while the first control circuit is executing the first read operation.

Thus, it is possible to provide the semiconductor memory device capable of accelerating an operation.

In the examples described in the above-described embodiments, the semiconductor memory device 10 outputs the read data to the controller 20 in response to the end of the read operation by the first sequencer 36A, but an exemplary embodiment is not limited thereto. For example, the controller 20 first detects the end of the read operation from the ready/busy signal of the semiconductor memory device 10. Then, when the controller 20 issues a data transmission command to transmit the data transmission command to the semiconductor memory device 10, the read data Dout may be transmitted from the semiconductor memory device 10 to the controller 20.

Specifically, the controller 20 first transmits a data output command "05 h" to the semiconductor memory device 10. The command "05 h" is a command by which the semiconductor memory device 10 instructs the controller 20 to output data retained in a cache included in the sense amplifier module of each plane. Next, the controller 20 transmits address information corresponding to the plane to which the data is transmitted, to the semiconductor memory device 10. Subsequently, the controller 20 issues a command "E0 h" to transmit the command "E0 h" to the semiconductor memory device 10. The command "E0 h" causes the semiconductor memory device 10 to start outputting data to the controller 20 based on the immediately previously transmitted address information. In accordance with such a command sequence, the semiconductor memory device 10 can instruct the controller 20 to transmit the data.

In the above-described embodiments, the operation state (the ready state or the busy state) of the sequencer module 36 is used as a standard, but an exemplary embodiment is not limited thereto. For example, the ready/busy signal RB output to the controller 20 by the semiconductor memory device 10 may not be based on the operation states of the sequencers 36A and 36B, but may be based on operation states of cache circuits included in the sense amplifier modules 12 of the planes <0> and <1>. In this case, the controller 20 can indirectly comprehend an operation state of the sequencer module 36 depending on whether the cache circuit included in the sense amplifier module 12 of each plane is in the ready state or the busy state.

In the fifth embodiment, the number of planes included in the semiconductor memory device 10 is configured to be the same as the number of sequencers included in the sequencer module 36, but an exemplary embodiment is not limited thereto. For example, when the semiconductor memory device 10 includes four or more planes, the number of sequencers smaller than the number of planes may be provided. Even in this case, an asynchronous operation can be executed by only the number of sequencers.

In the examples described in the sixth and seventh embodiments, the operation state of the semiconductor memory device 10 can be comprehended when the controller 20 executes the status reading, but an exemplary embodiment is not limited thereto. For example, when an asynchronous read operation on a plurality of planes is executed, the controller 20 ascertains a time of a read operation on each plane. Therefore, the controller 20 can predict an ending order of the read operations on the planes. Accordingly, the controller 20 may issue a command "z0 h" or "z1 h" for designating a plane instead of issuing the status read command "yyh". Thus, the controller 20 can give an instruction to output data read with a desired plane and an instruction of a cache read operation without executing the status reading.

In the examples described in the above-described embodiments, the second sequencer 36B is activated using the activation command "xxh", but an exemplary embodiment is not limited thereto. For example, the second sequencer 36B may transition to the active state or the idle state through a setting change operation referred to as set feature. A command sequence in which the controller 20 instructs the semiconductor memory device 10 to execute the set feature is illustrated in, for example, FIG. 52.

Figure 52:
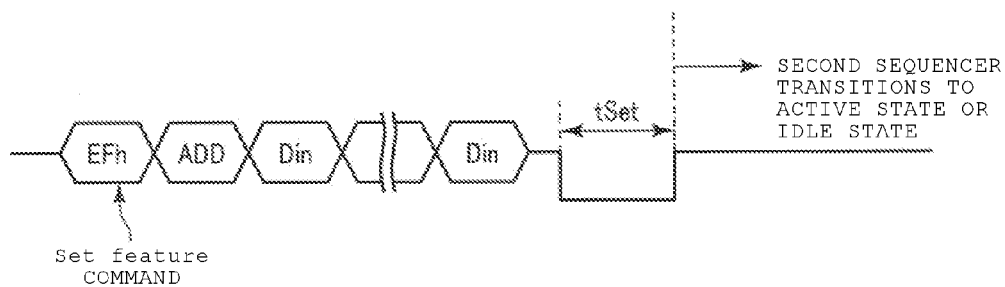
FIG. 52 is a diagram illustrating a command sequence of a setting change operation in a memory system according to a modification example of the first to ninth embodiments.

As illustrated in FIG. 52, the controller 20 first issues, for example, a set feature command "EFh" to transmit the set feature command "EFh" to the semiconductor memory device 10. The command "EFh" orders the semiconductor memory device 10 to change a parameter. Next, the controller 20 issues the address information ADD to transmit the address information ADD to the semiconductor memory device 10. The address information ADD is used to designate an address corresponding to a parameter desired to be changed. Next, the controller 20 outputs the set data Din to the semiconductor memory device 10 throughout a plurality of cycles. Here, the output data Din corresponds to the changed parameter. When such a command or the like is received, the semiconductor memory device 10 starts the set feature and an operation mode of the semiconductor memory device 10 is changed. In this example, through the set feature, the second sequencer 36B transitions from the idle state to the active state or transitions from the active state to the idle state. As illustrated, tSet indicates a period in which the set feature is executed. During this period, the semiconductor memory device 10 enters the busy state. That is, when the operation mode of the semiconductor memory device 10 is changed through the set feature or the like, the semiconductor memory device 10 temporarily enters the busy state.

When the second sequencer 36B is activated through the set feature and the second sequencer 36B ends the read operation, the second sequencer 36B may automatically transition to the idle state or may transition to the idle state again using the set feature.

In the examples described in the above-described embodiments, all of the memory cells to be read from each plane retain the data in accordance with the MLC scheme during the multi-plane read operation on the plurality of planes, but an exemplary embodiment is not limited thereto. For example, even when one plane is stored in accordance with the SLC scheme and the other plane is stored in accordance with the MLC scheme in the multi-plane read operation on two planes, the above-described embodiments can be applied.

In the above-described command sequence, the address information is information of one cycle, but an exemplary embodiment is not limited thereto. For example, the address information may be transmitted throughout 5 cycles and pieces of different address information (for example, plane information, block address BA, and page address PA) may be included.

In the above-described embodiments, when data stored in accordance with the MLC scheme or the SLC scheme is read, a command to designate a level of a page to be read may be added to the beginning of the command sequence including a read command corresponding to each plane. For example, when data written in accordance with the SLC scheme is read, an SLC command is added. When data written in accordance with the TLC scheme is read, a command to designate a level of a page to be read, such as the commands "01 h", "02 h", and "03 h", may be added.

The refresh operation described in the ninth embodiment may be automatically executed in the semiconductor memory device 10. In this case, a timer is provided in the semiconductor memory device 10 and the refresh operation is executed based on the timer. When a command is input from the outside during the refresh operation, the semiconductor memory device 10 may preferentially execute an operation based on the input command. In this case, the semiconductor memory device 10 may resume the refresh operation after an operation based on the command input from the outside ends.

In the ninth embodiment, when a timer is provided in the semiconductor memory device 10, a read operation may be executed on a certain block BLK and the timer may measure a time in which the read operation is executed on the certain block BLK. In this case, the semiconductor memory device 10 may correct a read voltage used in the read operation on the block BLK based on the time measured by the timer.

Further, in the ninth embodiment, a program sequence in which a program and program verification are repeated is interrupted due to insertion of an interruption command. In this case, when the program sequence is interrupted and a time elapses for a while and the program sequence is subsequently resumed, a threshold distribution written after the resuming is deviated from a threshold distribution written before the input of the interruption command. Data retention (short term data retention) immediately after such writing is said to be inferior in a memory cell with a metal-oxide-nitride-oxide-silicon (MONOS) structure to a floating gate memory cell.

Figure 53:
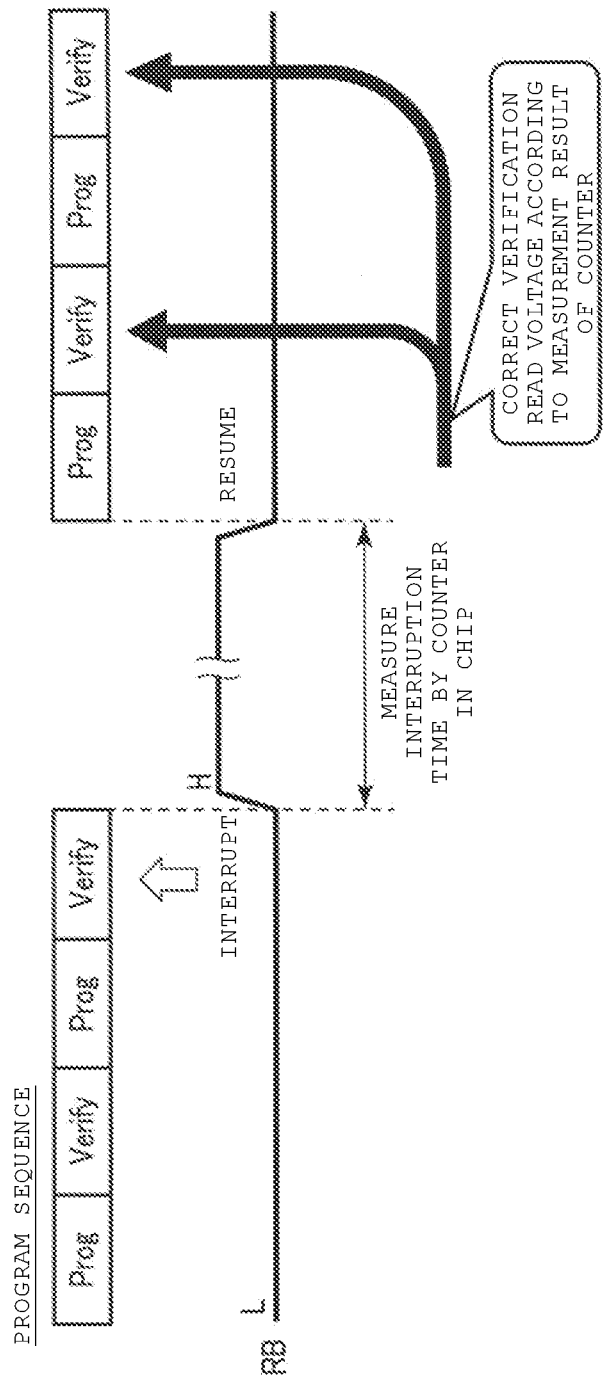
FIG. 53 is a diagram illustrating a program sequence in the memory system according to a modification example of the first to ninth embodiments.

In contrast, by using the method illustrated in FIG. 53, it is possible to suppress an influence of the short term data retention. FIG. 53 illustrates an example of an operation when the program sequence is interrupted. As illustrated in FIG. 53, the program sequence in this example is interrupted after a verification read operation when the interruption command is received. When the program sequence is interrupted, the ready/busy signal RB is changed from the "L" level to the "H" level and the semiconductor memory device 10 enters the ready state. The timer (counter) provided in the semiconductor memory device 10 measures a time in which the semiconductor memory device 10 enters the ready state. That is, the timer provided in a chip measures a time in which the program sequence is interrupted.

When the program sequence is resumed, the ready/busy signal RB is changed from the "H" level to the "L" level and the semiconductor memory device 10 enters the busy state.

Then, the sequencer 36 corrects the verification read voltage used in the verification read operation in the block BLK based on the time measured by the timer. Thus, since the semiconductor memory device 10 can use an appropriate verification read operation in the temporarily interrupted program sequence, it is possible to suppress a deviation in the finally formed threshold distribution.

In the above description, the "connection" indicates an electric connection and includes not only a direct connection but also a connection formed via any element.

The configuration in which the memory cells are stacked 3-dimensionally above a semiconductor substrate is not limited to the above-described configuration. Such a configuration is described in, for example, U.S. patent application Ser. No. 12/407,403 entitled "Three-dimensional stacked nonvolatile semiconductor memory," filed on Mar. 19, 2009. Further, such a configuration is described in, for example, U.S. patent application Ser. No. 12/406,524 entitled "Three dimensional Stacked nonvolatile semiconductor memory," filed on Mar. 18, 2009, U.S. patent application Ser. No. 12/679,991 entitled "Non-volatile semiconductor storage device and method of manufacturing the same," filed on Mar. 25, 2010, and U.S. patent application Ser. No. 12/532,030 entitled "Semiconductor memory and method for manufacturing same," filed on Mar. 23, 2009. The entire contents of the foregoing applications are incorporated herein by reference.

In the above-described embodiments, the block BLK may not be set as an erasure unit of data. For example, other erasing operations are described in U.S. patent application Ser. No. 13/235,389 entitled "Nonvolatile semiconductor memory device," filed on Sep. 18, 2011 and U.S. patent application Ser. No. 12/694,690 entitled "Non-volatile semiconductor storage device," filed on Jan. 27, 2010. The entire contents of the foregoing applications are incorporated herein by reference.

(1) In a read operation, a voltage applied to a word line selected in a read operation of an "A" level is in the range of from, for example, 0 to 0.55 V in the above-described embodiments. An exemplary embodiment is not limited thereto, but the voltage may be set in one of the range of from 0.1 to 0.24 V, the range of from 0.21 to 0.31 V, the range of from 0.31 to 0.4 V, the range of from 0.4 to 0.5 V, and the range of from 0.5 to 0.55 V.

A voltage applied to a word line selected in a read operation of a "B" level is in the range of, for example, from 1.5 to 2.3 V. An exemplary embodiment is not limited thereto, but the voltage may be in one of the range of from 1.65 to 1.8 V, the range of from 1.8 to 1.95 V, the range of from 1.95 to 2.1 V, and the range of from 2.1 to 2.3 V.

A voltage applied to a word line selected in a read operation of a "C" level is in the range of, for example, from 3.0 to 4.0 V. An exemplary embodiment is not limited thereto, but the voltage may be in one of the range of from 3.0 to 3.2 V, the range of from 3.2 to 3.4 V, the range of from 3.4 to 3.5 V, the range of from 3.5 to 3.6 V, and the range of from 3.6 to 4.0 V.

The time (tRead) of the read operation may be set between, for example, 25 to 38 µs, 38 to 70 µs, or 70 to 80 µs.

(2) The write operation includes the program operation and the verification operation, as described above. In the write operation, a voltage first applied to a word line selected during the program operation is set between, for example, 13.7 to 14.3 V. An exemplary embodiment is not limited thereto, but the voltage may be set between, for example, 13.7 to 14.0 V or 14.0 to 14.6 V.

A voltage first applied to a selected word line upon writing an odd word line and a voltage first applied to a selected word line upon writing an even word line may be changed.

When the program operation is executed in accordance with an incremental step pulse program (ISPP) scheme, for example, about 0.5 V is exemplified as a step-up voltage.

A voltage applied to an unselected word line may be set between, for example, 6.0 to 7.3 V. An exemplary embodiment is not limited to this case. The voltage may be set between, for example, 7.3 to 8.4 V or may be set to be equal to or lower than 6.0 V.

A pass voltage to be applied may be changed depending on whether an unselected word line is an odd word line or an even word line.

The time (tProg) of the write operation may be set between, for example, 1,700 to 1,800 µs, 1,800 to 1,900 µs, or 1,900 to 2,000 µs.

(3) In an erasing operation, a voltage first applied to a well formed above a semiconductor substrate and arranged above the memory cell is set between, for example, 12.0 to 13.6 V. An exemplary embodiment is not limited to this case. For example, the voltage may be between 13.6 to 14.8 V, 14.8 to 19.0 V, 19.0 to 19.8 V, or 19.8 to 21.0 V.

A time (tErase) of an erasing operation may be set between, for example, 3,000 to 4,000 µs, 4,000 to 5,000 µs, or 4,000 to 9,000 µs.

(4) The structure of the memory cell includes a charge storage layer arranged on a semiconductor substrate (silicon substrate) with a tunnel insulating film with a film thickness of from 4 to 10 nm interposed therebetween. The charge storage layer can have a stack structure of an insulating film such as SiN or SiON with a film thickness of from 2 to 3 nm and a polysilicon with a film thickness of from 3 to 8 nm. A metal such as Ru may be added to the polysilicon. An insulating film is formed on the charge storage layer. The insulating film includes a silicon oxide film with a film thickness of from 4 to 10 nm which is interposed between a lower High-k film with a film thickness of from 3 to 10 nm and an upper High-k film with a film thickness of from 3 to 10 nm. HfO or the like can be exemplified as the High-k film. The film thickness of the silicon oxide film can be set to be thicker than the film thickness of the High-k film. A control electrode with a film thickness of from 30 to 70 nm is formed on the insulating film with a material with a film thickness of from 3 to 10 nm interposed therebetween. Here, the material is a metal oxide film such as TaO or a metal nitride film such as TaN. W or the like can be used as the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first and second memory cell arrays; and
   first and second control circuits configured to execute an operation on the first and second memory cell arrays, wherein the first control circuit executes an operation on the first memory cell array responsive to a first command set that is received by the semiconductor memory device, and the second control circuit executes an operation on the second memory cell array responsive to second and third command sets that are received by the semiconductor memory device while the first control circuit is executing the operation on the first memory cell array, and wherein the second control circuit is in an idle state at the time the second command set is received and the second control circuit transitions from the idle state to an active state responsive to the second command set.

2. The device according to claim 1, wherein the first command set includes a read command and an address designating the first memory cell array, and the third command set includes a read command and an address designating the second memory cell array.

3. The device according to claim 2, wherein the first control circuit further executes an operation on the first memory cell array responsive to a fourth command set that is received by the semiconductor memory device while the second control circuit is executing the operation on the second memory cell array, the fourth command set including a cache read command to perform a read at an address that is contiguous to the address included in the first command set.

4. The device according to claim 1, further comprising:
a first multiplexer configured to select a first control signal from the first control circuit for executing an operation on the first or second memory cell array, or a second control signal from the second control circuit for executing an operation on the first or second memory cell array, in accordance with a first selection signal; and
a second multiplexer configured to select the first control signal from the first control circuit or the second control signal from the second control circuit, in accordance with a second selection signal.

5. The device according to claim 4, further comprising:
a voltage generation circuit configured to generate voltages for executing the operation on the first or second memory cell array in response to the first or second control signal received from the first and second multiplexers.

6. The device according to claim 5, wherein the voltage generation circuit includes a first booster configured to generate voltages for executing the operation on the first memory cell array and a second booster configured to generate voltages for executing the operation on the second memory cell array.

7. The device according to claim 1, further comprising:
a third memory cell array;
a first multiplexer configured to select a first control signal from the first control circuit for executing an operation on the first, second, or third memory cell array, or a second control signal from the second control circuit for executing an operation on the first, second, or third memory cell array, in accordance with a first selection signal;
a second multiplexer configured to select the first control signal from the first control circuit or the second control signal from the second control circuit, in accordance with a second selection signal; and
a third multiplexer configured to select the first control signal from the first control circuit or the second control signal from the second control circuit, in accordance with a third selection signal.

8. The device according to claim 1, further comprising:
a third memory cell array;
a third control circuit configured to execute an operation on the third memory cell arrays;
a first multiplexer configured to select a first control signal from the first control circuit for executing an operation on the first, second, or third memory cell array, a second control signal from the second control circuit for executing an operation on the first, second, or third memory cell array, or a third control signal from the third control circuit for executing an operation on the first, second, or third memory cell array, in accordance with a first selection signal;
a second multiplexer configured to select the first control signal from the first control circuit, the second control signal from the second control circuit, or the third control signal from the third control circuit, in accordance with a second selection signal; and
a third multiplexer configured to select the first control signal from the first control circuit, the second control signal from the second control circuit, or the third control signal from the third control circuit, in accordance with a third selection signal.

9. The device according to claim 1, further comprising:
a ready/busy control circuit configured to output a busy signal when both the first and second control circuits are in an active state and to output a ready signal when at least one of the first and second control circuits is not in the active state.

10. The device according to claim 9, further comprising:
an input/output circuit configured to output a plurality of output input/output signals including a first input/output signal indicating whether or not the first control circuit is in the active state and a second input/output signal indicating whether or not the second control circuit is in the active state.

11. The device according to claim 1, wherein the operation executed on the first memory cell array is one of a read operation, a write operation, and an erase operation.

12. The device according to claim 11, wherein the operation executed on the second memory cell array is a read operation.

13. The device according to claim 11, wherein the operation executed on the second memory cell array is a refresh operation.

14. A method of performing a multi-plane operation in a semiconductor memory device including first and second memory cell arrays, said method comprising:
receiving a first command set;
executing an operation on the first memory cell array in accordance with the first command set; and
receiving a second command set and executing an operation on the second memory cell array in accordance with the second command set, while the operation on the first memory cell array is being executed, wherein
the first command set includes a read command and an address designating the first memory cell array, and the second command set includes a read command and an address designating the second memory cell array.

15. The method according to claim 14, further comprising:
receiving a third command set while the operation on the second memory cell array is being executed, wherein the third command set includes a cache read command to perform a read at an address that is contiguous to the address included in the first command set.

16. The method according to claim 14, wherein the semiconductor memory device further includes a third memory cell array, said method further comprising:

receiving a third command set and executing an operation on the third memory cell array in accordance with the third command set, while the operation on the first memory cell array and the operation on the second memory cell array are being executed.

17. The method according to claim 14, further comprising:

outputting a busy signal when the operation on the first memory cell array and the operation on the second memory cell array are both being executed; and outputting a ready signal when either the operation on the first memory cell array or the operation on the second memory cell array, is not being executed.

18. The method according to claim 17, further comprising:

outputting a status of the operation on the first memory cell array through a first input/output signal and a status of the operation on the second memory cell array through a second input/output signal.

* * * * *